(12) United States Patent
Yamazaki et al.

(10) Patent No.: US 10,367,014 B2
(45) Date of Patent: Jul. 30, 2019

(54) DISPLAY DEVICE, MANUFACTURING METHOD OF DISPLAY DEVICE, AND ELECTRONIC DEVICE

(71) Applicant: Semiconductor Energy Laboratory Co., Ltd., Atsugi-shi, Kanagawa-ken (JP)

(72) Inventors: Shunpei Yamazaki, Tokyo (JP); Yoshiharu Hirakata, Kanagawa (JP); Takashi Hamada, Kanagawa (JP); Kohei Yokoyama, Kanagawa (JP); Yasuhiro Jinbo, Kanagawa (JP); Tetsuji Ishitani, Kanagawa (JP); Daisuke Kubota, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 280 days.

(21) Appl. No.: 14/922,658

(22) Filed: Oct. 26, 2015

(65) Prior Publication Data

US 2016/0118416 A1    Apr. 28, 2016

(30) Foreign Application Priority Data

Oct. 28, 2014 (JP) .................. 2014-219635

(51) Int. Cl.
*G02F 1/1333* (2006.01)
*H01L 27/12* (2006.01)
(Continued)

(52) U.S. Cl.
CPC ........ *H01L 27/1262* (2013.01); *G02F 1/1339* (2013.01); *G02F 1/1368* (2013.01);
(Continued)

(58) Field of Classification Search
None
See application file for complete search history.

(56) References Cited

U.S. PATENT DOCUMENTS

| 4,357,557 A | 11/1982 | Inohara et al. |
| 4,640,583 A | 2/1987 | Hoshikawa et al. |
(Continued)

FOREIGN PATENT DOCUMENTS

| CN | 001578546 A | 2/2005 |
| CN | 101257015 A | 9/2008 |
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Edward J Glick
*Assistant Examiner* — David Y Chung
(74) *Attorney, Agent, or Firm* — Fish & Richardson P.C.

(57) ABSTRACT

A display device in which a peripheral circuit portion has high operation stability is provided. The display device includes a first substrate and a second substrate. A first insulating layer is provided over a first surface of the first substrate. A second insulating layer is provided over a first surface of the second substrate. The first surface of the first substrate and the first surface of the second substrate face each other. An adhesive layer is provided between the first insulating layer and the second insulating layer. A protective film in contact with the first substrate, the first insulating layer, the adhesive layer, the second insulating layer, and the second substrate is formed in the vicinity of a peripheral portion of the first substrate and the second substrate.

10 Claims, 39 Drawing Sheets

(51) Int. Cl.
*H01L 51/52* (2006.01)
*G02F 1/1368* (2006.01)
*G02F 1/1362* (2006.01)
*G02F 1/1335* (2006.01)
*G02F 1/1339* (2006.01)
*H01L 29/786* (2006.01)
*H01L 27/32* (2006.01)
*H01L 51/00* (2006.01)

(52) U.S. Cl.
CPC .. *G02F 1/133345* (2013.01); *G02F 1/133512* (2013.01); *G02F 1/136213* (2013.01); *H01L 27/1218* (2013.01); *H01L 27/1225* (2013.01); *H01L 27/1255* (2013.01); *H01L 29/78648* (2013.01); *H01L 51/525* (2013.01); *H01L 51/5246* (2013.01); *H01L 27/322* (2013.01); *H01L 27/323* (2013.01); *H01L 51/0024* (2013.01); *H01L 51/5253* (2013.01); *H01L 2251/303* (2013.01)

(56) References Cited

U.S. PATENT DOCUMENTS

| | | | |
|---|---|---|---|
| 5,610,742 A * | 3/1997 | Hinata | G02F 1/1333 349/122 |
| 5,731,856 A | 3/1998 | Kim et al. | |
| 5,744,864 A | 4/1998 | Cillessen et al. | |
| 5,966,652 A * | 10/1999 | Coad | H04M 1/27455 455/412.1 |
| 6,219,127 B1 | 4/2001 | Hirakata et al. | |
| 6,294,274 B1 | 9/2001 | Kawazoe et al. | |
| 6,563,174 B2 | 5/2003 | Kawasaki et al. | |
| 6,580,094 B1 | 6/2003 | Yamazaki et al. | |
| 6,605,826 B2 | 8/2003 | Yamazaki et al. | |
| 6,727,522 B1 | 4/2004 | Kawasaki et al. | |
| 6,864,943 B2 | 3/2005 | Hirakata et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,199,855 B2 | 4/2007 | Yoshimi et al. | |
| 7,211,825 B2 | 5/2007 | Shih et al. | |
| 7,230,669 B1 | 6/2007 | Tashiro et al. | |
| 7,282,782 B2 | 10/2007 | Hoffman et al. | |
| 7,283,185 B2 | 10/2007 | Hirakata et al. | |
| 7,297,977 B2 | 11/2007 | Hoffman et al. | |
| 7,323,356 B2 | 1/2008 | Hosono et al. | |
| 7,369,212 B2 | 5/2008 | Tashiro et al. | |
| 7,372,535 B2 | 5/2008 | Tashiro et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,486,368 B2 | 2/2009 | Sakakura et al. | |
| 7,501,293 B2 | 3/2009 | Ito et al. | |
| 7,579,203 B2 | 8/2009 | Yamazaki et al. | |
| 7,674,650 B2 | 3/2010 | Akimoto et al. | |
| 7,732,819 B2 | 6/2010 | Akimoto et al. | |
| 7,733,457 B2 | 6/2010 | Tashiro et al. | |
| 7,738,073 B2 | 6/2010 | Inoue et al. | |
| 7,746,440 B2 | 6/2010 | Liu et al. | |
| 7,897,003 B2 | 3/2011 | Tashiro | |
| 8,289,481 B2 | 10/2012 | Tashiro et al. | |
| 8,382,545 B2 | 2/2013 | Sakakura et al. | |
| 8,648,345 B2 | 2/2014 | Yamazaki et al. | |
| 8,846,459 B2 | 9/2014 | Tochibayashi et al. | |
| 8,901,806 B2 | 12/2014 | Sakakura et al. | |
| 9,025,096 B2 | 5/2015 | Tae et al. | |
| 9,147,773 B2 | 9/2015 | Tochibayashi et al. | |
| 9,257,670 B2 | 2/2016 | Sakakura et al. | |
| 9,508,953 B2 | 11/2016 | Sakakura et al. | |
| 9,780,329 B2 | 10/2017 | Sakakura et al. | |
| 2001/0046027 A1 | 11/2001 | Tai et al. | |
| 2002/0024096 A1 | 2/2002 | Yamazaki et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0275989 A1 * | 12/2006 | Ting | G02F 1/133351 438/283 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0030436 A1 * | 2/2007 | Sasabayashi | G02F 1/1339 349/153 |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0170839 A1 | 7/2007 | Choi et al. | |
| 2007/0170860 A1 | 7/2007 | Choi et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0123042 A1 | 5/2008 | Tashiro et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203904 A1 | 8/2008 | Kim et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0004772 A1 | 1/2009 | Jinbo et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |

(56) References Cited

U.S. PATENT DOCUMENTS

| | | | |
|---|---|---|---|
| 2009/0147205 A1* | 6/2009 | Mizuno | G02F 1/1339 349/153 |
| 2009/0152506 A1 | 6/2009 | Umeda et al. | |
| 2009/0152541 A1 | 6/2009 | Maekawa et al. | |
| 2009/0194572 A1* | 8/2009 | Miyashita | G02F 1/133351 225/2 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0134746 A1 | 6/2010 | Tashiro et al. | |
| 2010/0252599 A1* | 10/2010 | Nakano | B26F 3/002 225/2 |
| 2011/0012112 A1 | 1/2011 | Yamazaki et al. | |
| 2011/0122330 A1* | 5/2011 | Tae | G02F 1/136213 349/39 |
| 2012/0061718 A1 | 3/2012 | Yamazaki et al. | |
| 2012/0126234 A1 | 5/2012 | Yamazaki et al. | |
| 2012/0161603 A1 | 6/2012 | Van Montfort et al. | |
| 2012/0241802 A1 | 9/2012 | Philippens et al. | |
| 2012/0300151 A1 | 11/2012 | Yamazaki et al. | |
| 2013/0001582 A1 | 1/2013 | Kadono et al. | |
| 2013/0048967 A1 | 2/2013 | Nishido et al. | |
| 2014/0063424 A1* | 3/2014 | Sung | G02F 1/1339 349/122 |
| 2014/0063432 A1 | 3/2014 | Yamazaki et al. | |
| 2014/0065430 A1 | 3/2014 | Yamazaki et al. | |
| 2015/0177558 A1* | 6/2015 | Sugihara | G02F 1/133351 174/261 |
| 2015/0194451 A1 | 7/2015 | Tae et al. | |
| 2015/0207100 A1 | 7/2015 | Saito et al. | |
| 2016/0120054 A1 | 4/2016 | Yamazaki et al. | |
| 2016/0147109 A1 | 5/2016 | Yamazaki et al. | |
| 2018/0090710 A1 | 3/2018 | Sakakura et al. | |

FOREIGN PATENT DOCUMENTS

| | | |
|---|---|---|
| CN | 103065969 A | 4/2013 |
| CN | 104471736 A | 3/2015 |
| EP | 0526232 A | 2/1993 |
| EP | 1492390 A | 12/2004 |
| EP | 1737044 A | 12/2006 |
| EP | 2226847 A | 9/2010 |
| EP | 2345928 A | 7/2011 |
| EP | 2880700 | 6/2015 |
| JP | 60-198861 A | 10/1985 |
| JP | 62-091623 | 6/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-005890 A | 1/1993 |
| JP | 05-251705 A | 9/1993 |
| JP | 06-075209 A | 3/1994 |
| JP | 08-264794 A | 10/1996 |
| JP | 10-172757 | 6/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-151253 A | 5/2002 |
| JP | 2002-289859 A | 10/2002 |
| JP | 2003-086000 A | 3/2003 |
| JP | 2003-086808 A | 3/2003 |
| JP | 2004-103337 A | 4/2004 |
| JP | 2004-103957 A | 4/2004 |
| JP | 2004-273614 A | 9/2004 |
| JP | 2004-273732 A | 9/2004 |
| JP | 2007-123861 | 5/2007 |
| JP | 2007-165861 | 6/2007 |
| JP | 2008-210770 A | 9/2008 |
| JP | 2011-018479 | 1/2011 |
| JP | 2011-044699 | 3/2011 |
| JP | 2014-044793 A | 3/2014 |
| KR | 2008-0078956 A | 8/2008 |
| KR | 2015-0040270 A | 4/2015 |
| TW | 200923486 | 6/2009 |
| TW | 201230428 | 7/2012 |
| TW | 201405804 | 2/2014 |
| WO | WO-2004/114391 | 12/2004 |
| WO | WO-2012/039310 | 3/2012 |
| WO | WO-2014/020899 | 2/2014 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

(56) References Cited

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the IN2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 692-693.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2015/057902) dated Feb. 9, 2016.

Written Opinion (Application No. PCT/IB2015/057902) dated Feb. 9, 2016.

* cited by examiner

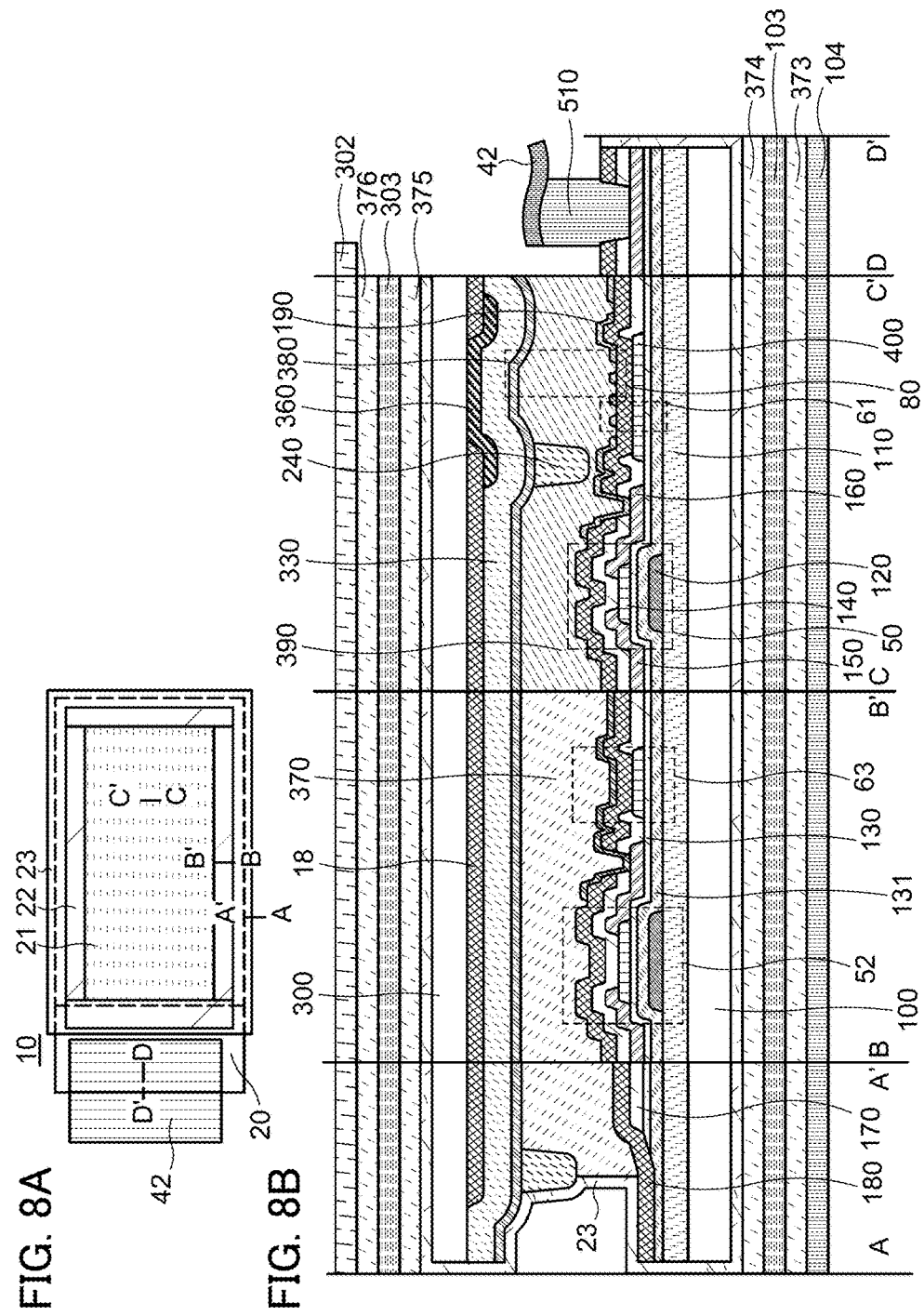

writing period sensing period

FIG. 31A
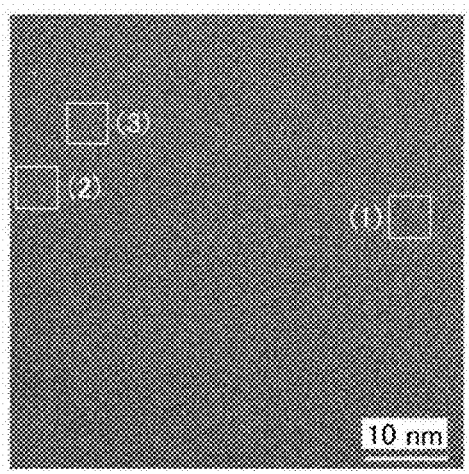
FIG. 31B  FIG. 31C  FIG. 31D
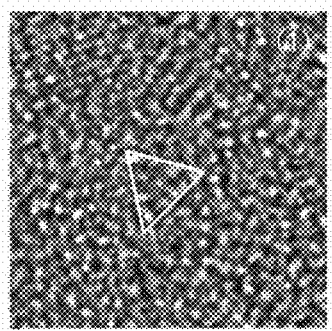 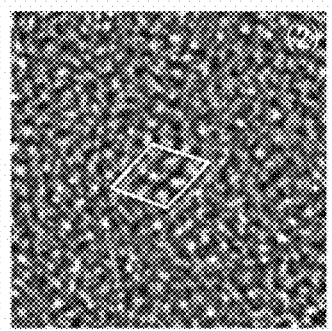 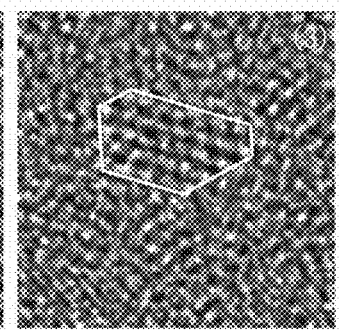

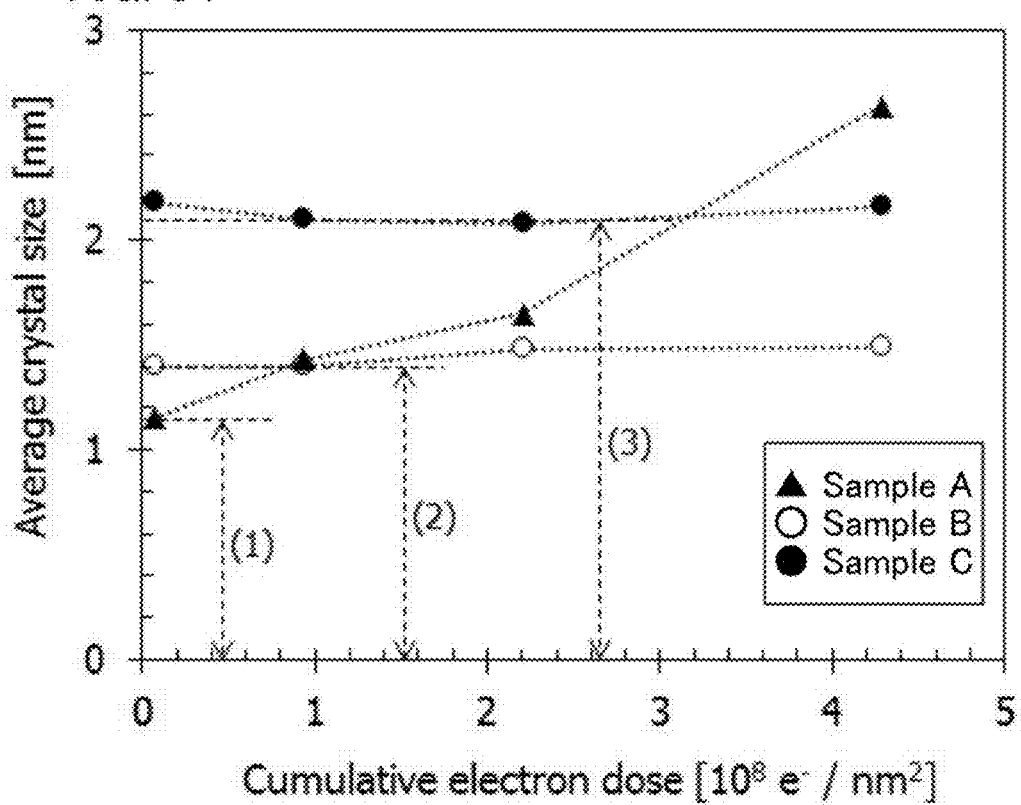

DISPLAY DEVICE, MANUFACTURING METHOD OF DISPLAY DEVICE, AND ELECTRONIC DEVICE

TECHNICAL FIELD

One embodiment of the present invention relates to a display device and a manufacturing method of the display device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, an input device, an input/output device, a method for driving any of them, and a method for manufacturing any of them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

Displays including thin film transistors have been widely spread and indispensable to our life. In addition, these displays are very important for portable displays and have been necessary for portable terminals.

Furthermore, display devices in which a display region (a pixel portion) and a peripheral circuit (a driver portion) are provided in the same substrate have been widely used. For example, Patent Document 1 discloses a technique of using oxide semiconductor transistors in the display region and the peripheral circuit. When the display region and the peripheral circuit are formed simultaneously, the manufacturing cost can be reduced.

REFERENCE

Patent Document

[Patent Document 1] Japanese Published Patent Application No. 2007-123861

DISCLOSURE OF INVENTION

A display device is required to have as large a display region as possible on a side viewed by a viewer (a display surface side).

In addition, on the display surface side, a frame portion is highly required to be narrow.

However, in the case where a display region becomes large and a frame portion becomes narrow, a driver circuit provided outside the display region is positioned further outside the display region, so that the reliability of transistor characteristics of a peripheral circuit may decrease and the circuit operation may become unstable.

An object of one embodiment of the present invention is to provide a display device in which a peripheral circuit portion has high operation stability.

Another object of one embodiment of the present invention is to provide a display device with a narrow frame.

Another object of one embodiment of the present invention is to provide a lightweight display device.

Another object of one embodiment of the present invention is to provide a high-definition display device.

Another object of one embodiment of the present invention is to provide a highly reliable display device.

Another object of one embodiment of the present invention is to provide a large-area display device.

Another object of one embodiment of the present invention is to provide a low-power display device.

Another object of one embodiment of the present invention is to provide a novel display device or the like.

Another object of one embodiment of the present invention is to provide a method for manufacturing the display device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a display device including a first substrate and a second substrate. A first insulating layer is provided over a first surface of the first substrate. A second insulating layer is provided over a first surface of the second substrate. The first surface of the first substrate and the first surface of the second substrate face each other. An adhesive layer is provided between the first insulating layer and the second insulating layer. A protective film in contact with the first substrate, the first insulating layer, the adhesive layer, the second insulating layer, and the second substrate is formed in the vicinity of a peripheral portion of the first substrate and the second substrate.

Furthermore, a transistor, a capacitor, a display element, a light-blocking layer, a coloring layer, and a spacer can be provided between the first surface of the first substrate and the first surface of the second substrate.

Furthermore, the protective film can contain an oxide, a nitride, or a metal.

Furthermore, for the protective film, aluminum oxide, hafnium oxide, zirconium oxide, titanium oxide, zinc oxide, indium oxide, tin oxide, indium tin oxide, tantalum oxide, silicon oxide, manganese oxide, nickel oxide, erbium oxide, cobalt oxide, tellurium oxide, barium titanate, titanium nitride, tantalum nitride, aluminum nitride, tungsten nitride, cobalt nitride, manganese nitride, hafnium nitride, ruthenium, platinum, nickel, cobalt, manganese, or copper can be used.

In the display device, a liquid crystal element can be included.

In the display device, an organic EL element can be included.

Furthermore, a structure where a display device, a microphone, and a speaker are included can be employed.

One embodiment of the present invention is a method for manufacturing a display device including the steps of forming a transistor, a capacitor, a pixel electrode, and a first insulating layer over a first surface of a first substrate, forming a light-blocking layer, a coloring layer, an insulating layer, a spacer, and a second insulating layer over a first surface of a second substrate, bonding the first substrate and the second substrate with an adhesive layer to seal the transistor, the capacitor, and liquid crystal, and providing a protective film in contact with the first substrate, the first insulating layer, the adhesive layer, the second insulating layer, and the second substrate in the vicinity of a peripheral portion of the first substrate and the second substrate.

One embodiment of the present invention is a method for manufacturing a display device including the steps of forming a transistor, a capacitor, a pixel electrode, and a first insulating layer over a first surface of a first substrate, forming a light-blocking layer, a coloring layer, an insulating layer, a spacer, and a second insulating layer over a first surface of a second substrate, bonding the first substrate and the second substrate with an adhesive layer to seal the transistor, the capacitor, and a display element, forming a groove portion by performing a first cutting treatment on the second substrate, forming a protective film in contact with the first substrate, the first insulating layer, the adhesive layer, the second insulating layer, and the second substrate in the vicinity of a peripheral portion of the groove portion, the first substrate, and the second substrate, and fabricating a plurality of display devices by performing a second cutting treatment on the first substrate.

The protective film can be formed by an ALD method.

Furthermore, with an ALD method, the protective film can be formed using aluminum oxide, hafnium oxide, zirconium oxide, titanium oxide, zinc oxide, indium oxide, tin oxide, indium tin oxide, tantalum oxide, silicon oxide, manganese oxide, nickel oxide, erbium oxide, cobalt oxide, tellurium oxide, barium titanate, titanium nitride, tantalum nitride, aluminum nitride, tungsten nitride, cobalt nitride, manganese nitride, hafnium nitride, ruthenium, platinum, nickel, cobalt, manganese, or copper.

Note that other embodiments of the present invention are shown below in the description of Embodiments and the drawings.

One embodiment of the present invention can provide a display device in which a peripheral circuit portion has high operation stability.

Another embodiment of the present invention can provide a display device with a narrow frame.

Another embodiment of the present invention can provide a lightweight display device.

Another embodiment of the present invention can provide a high-definition display device.

Another embodiment of the present invention can provide a highly reliable display device.

Another embodiment of the present invention can provide a large-area display device.

Another embodiment of the present invention can provide a low-power display device.

Another embodiment of the present invention can provide a novel display device or the like.

Alternatively, a method for manufacturing the display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 8A and 8B are a top view and a cross-sectional view illustrating a display device of one embodiment of the present invention;

FIGS. 31A to 31D are Cs-corrected high-resolution TEM images of a plane of a CAAC-OS;

FIG. 34 shows a change in crystal part of an In—Ga—Zn oxide induced by electron irradiation;

BEST MODE FOR CARRYING OUT THE INVENTION

Figure 1A:
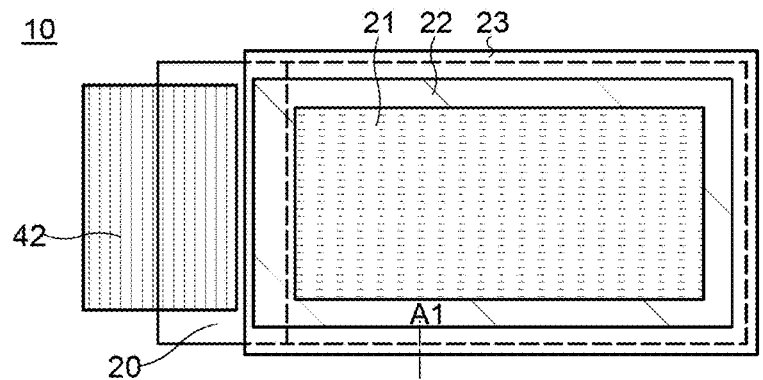
FIGS. 1A to 1C are a top view and cross-sectional views illustrating a display device of one embodiment of the present invention.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

<Notes on the Description for Drawings>

In this specification, terms for describing arrangement, such as "over" and "under", are used for convenience to describe a positional relationship between components with reference to drawings. Furthermore, the positional relationship between components is changed as appropriate in accordance with a direction in which each component is described. Thus, there is no limitation on terms used in this specification, and description can be made appropriately depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings.

In drawings such as plan views (also referred to as layout views) and perspective views, some of components might not be illustrated for clarity of the drawings.

<Notes on Expressions that can be Rephrased>

In this specification and the like, in describing connections of a transistor, one of a source and a drain is referred to as "one of a source and a drain" (or a first electrode or a first terminal), and the other of the source and the drain is referred to as "the other of the source and the drain" (or a second electrode or a second terminal). This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Since the source and the drain of the transistor change depending on the structure, operating conditions, and the like of the transistor, it is difficult to define which is a source or a drain. Thus, a portion that functions as a source or a portion is not referred to as a source or a drain in some cases. In that case, one of the source and the drain might be referred to as a first electrode, and the other of the source and the drain might be referred to as a second electrode.

In this specification, ordinal numbers such as first, second, and third are used to avoid confusion among components, and thus do not limit the number of the components.

In this specification and the like, a structure in which a flexible printed circuit (FPC), a tape carrier package (TCP), or the like is attached to a substrate of a display panel, or a structure in which an integrated circuit (IC) is directly mounted on a substrate by a chip on glass (COG) method is referred to as a display device in some cases.

Note that the terms "film" and "layer" can be interchanged with each other depending on the case or circumstances. For example, the term "conductive layer" can be changed into the term "conductive film" in some cases. In addition, the term "insulating film" can be changed into the term "insulating layer" in some cases.

<Notes on Definitions of Terms>

The following are definitions of the terms that are not mentioned in the above embodiments.

<<Connection>>

In this specification, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Embodiment 1

In this embodiment, structure examples of a display panel are described.

<<Protection of Substrate Surface Portion and Side Surface Portion by Protective Film>>

FIG. 1A is a top view of a display device. In FIG. 1A, a display device 10 can be formed using a display region 21, a display panel 20 provided with a peripheral circuit 22, and an FPC 42. In one embodiment of the present invention, a protective film 23 can be uniformly formed on the display panel 20. The protective film 23 is preferably formed by an atomic layer deposition (ALD) method, for example. Note that a protective film such as the protective film 23 has a function of protecting a display element and a transistor, for example. The protective film such as the protective film 23 may have another function, for example. Thus, the protective film such as the protective film 23 may be simply referred to as a film. For example, the protective film such as the protective film 23 may be referred to as a first film, a second film, or the like.

Figure 1B:
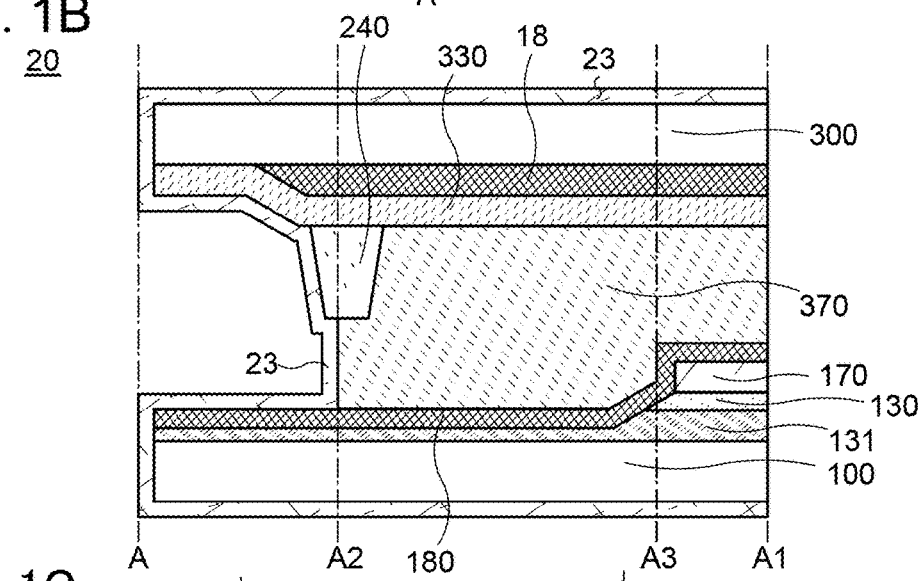

FIG. 1B is a cross-sectional view of an edge portion of the display panel 20. The display panel 20 is provided with a transistor, a capacitor, a display element, and the like, includes a substrate 100, a substrate 300, an insulating layer 130, an insulating layer 131, an insulating layer 170, an insulating layer 180, a light-blocking layer 18, an insulating layer 330, and a spacer 240 in the edge portion, and is covered with the protective film 23.

<<Deposition Method of Protective Film on Display Panel by ALD Method>>

Figure 3A:
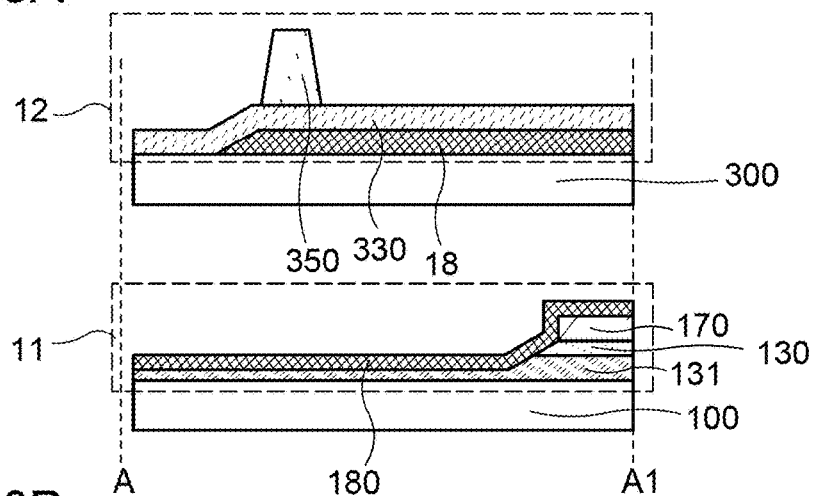
FIGS. 3A to 3C are cross-sectional views illustrating a method for manufacturing a display device of one embodiment of the present invention.
Figure 3B:
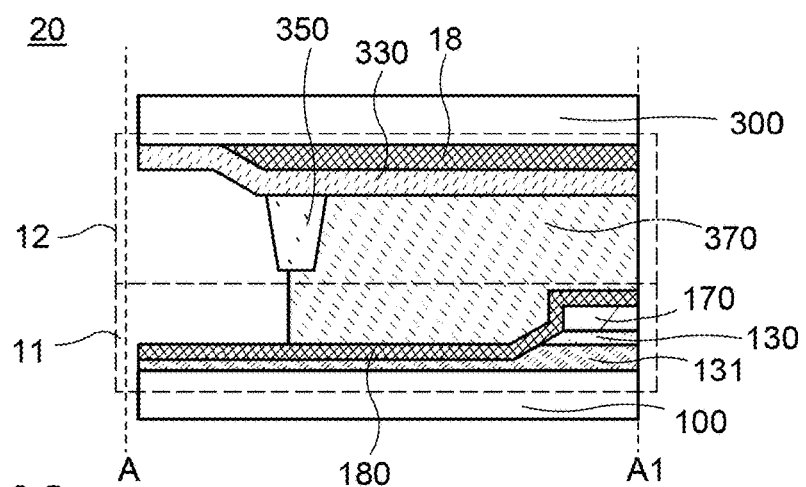
Figure 3C:
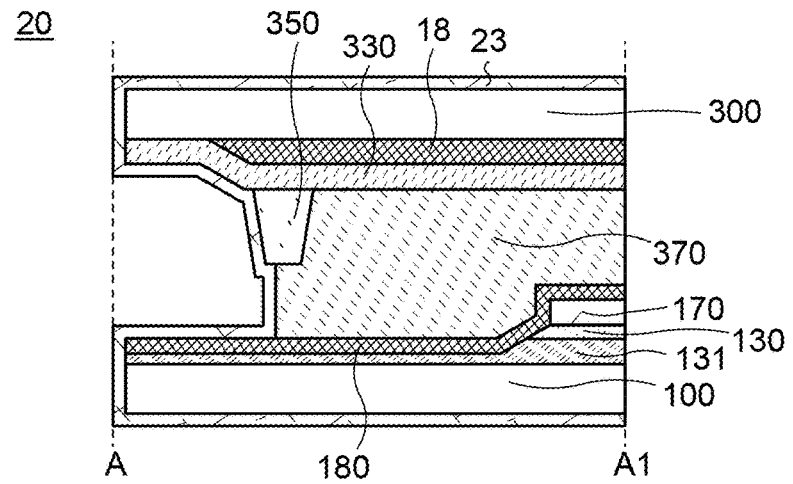

FIGS. 3A to 3C illustrate a deposition method of a protective film on the display panel 20 by an ALD method.

Part of the transistor, the capacitor, and the display element and the like are formed over the substrate 100, so that a region 11 is formed. In addition, the light-blocking layer 18, the insulating layer 330, part of a coloring layer and a display element, and the like are formed over the substrate 300, so that a region 12 is formed (see FIG. 3A).

Next, the region 11 of the substrate 100 and the region 12 of the substrate 300 are made to face each other, and the substrate 100 and the substrate 300 are bonded to each other with an adhesive layer 370, so that the display panel 20 can be fabricated (see FIG. 3B).

Then, the protective film 23 can be deposited on the display panel 20 by an ALD method (see FIG. 3C). Note that a portion to which the FPC 42 is connected is masked to prevent the protective film 23 from being deposited on the portion.

By an ALD method, the protective film can be deposited extremely uniformly on a surface on which the protective film is deposited. By using an ALD method, for example, aluminum oxide, hafnium oxide, zirconium oxide, titanium oxide, zinc oxide, indium oxide, tin oxide, indium tin oxide (ITO), tantalum oxide, silicon oxide, manganese oxide, nickel oxide, erbium oxide, cobalt oxide, tellurium oxide, barium titanate, titanium nitride, tantalum nitride, aluminum nitride, tungsten nitride, cobalt nitride, manganese nitride, hafnium nitride, and the like can be deposited as the protective film. Furthermore, the protective film is not limited to an insulating film, and a conductive film may also be deposited. For example, ruthenium, platinum, nickel, cobalt, manganese, copper, and the like can be deposited.

Furthermore, a portion electrically connected to the FPC 42 or the like is preferably masked so that the protective film is not deposited on the portion. For the masking, an organic film, an inorganic film, a metal, or the like can be used. For example, an oxide insulating film such as silicon oxide, silicon oxynitride, gallium oxide, gallium oxynitride, yttrium oxide, yttrium oxynitride, hafnium oxide, or hafnium oxynitride, a nitride insulating film such as silicon nitride or aluminum nitride, or an organic material such as a photoresist, a polyimide resin, an acrylic resin, a polyimide amide resin, a benzocyclobutene resin, a polyamide resin, or an epoxy resin can be used. In the case where any of these films is used as a mask, the mask is preferably removed after the protective film is deposited.

Furthermore, a region on which the protective film is deposited can be masked with a metal mask by an ALD method. The metal mask can be formed using a metal element selected from iron, chromium, nickel, cobalt, tungsten, molybdenum, aluminum, copper, tantalum, and titanium, an alloy including any of the metal elements, an alloy including any of the metal elements in combination, or the like. The metal mask can be positioned in the proximity of or in contact with the display panel.

A film formed by an ALD method is extremely uniform and dense. When the protective film 23 is deposited on the side surface portion of the display panel by an ALD method, entry of external components such as moisture can be inhibited. As a result, a change in transistor characteristics can be inhibited and the operation of the peripheral circuit can be stable. Moreover, the frame size can be reduced, the pixel region can be enlarged, and the definition of the display device can be increased.

Figure 1C:
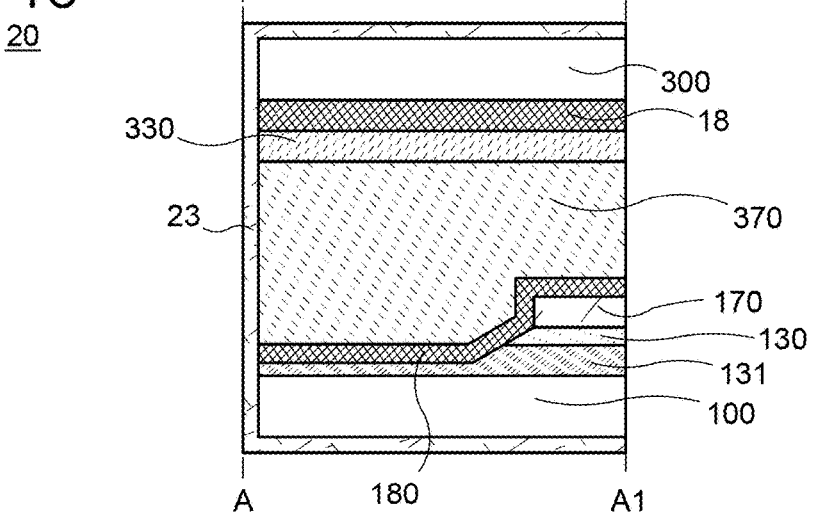

With the protective film 23, even if a distance A-A3 between an edge portion of the peripheral circuit 22 and the edge portion of the display panel 20 is narrowed, the stable transistor characteristics are obtained, that is, the peripheral circuit operates stably because of a high barrier property of the protective film 23; thus, the frame of the display panel can be narrowed. For example, the distance between the peripheral circuit 22 and the edge portion of the display panel 20 (a cut portion when the panel is processed) can be 300 μm or shorter, preferably 200 μm or shorter. Alternatively, the edge portion of the display panel 20 may have a structure without unevenness as illustrated in FIG. 1C.

<<Another Structure Example of Formation of Protective Film>>

Figure 2A:
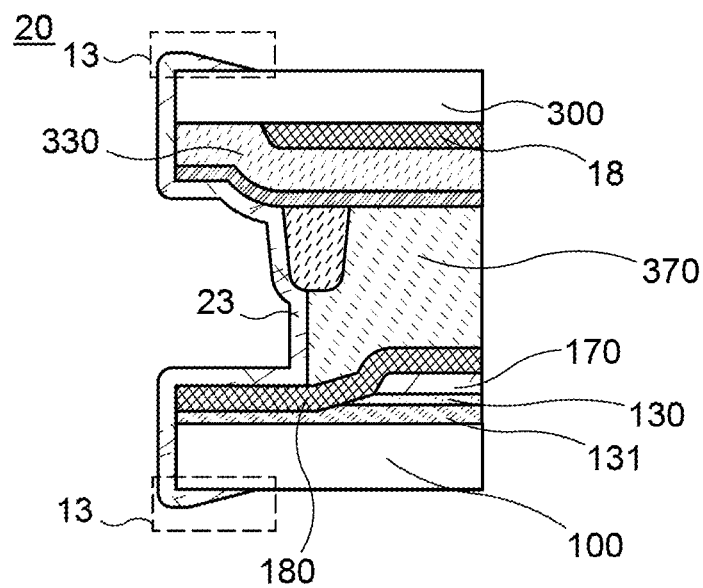
FIGS. 2A and 2B are cross-sectional views each illustrating the display device of one embodiment of the present invention.
Figure 2B:
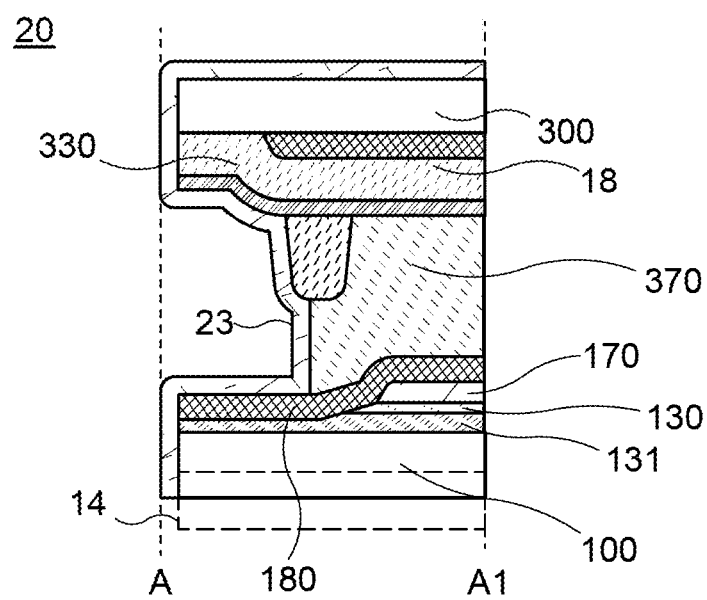

FIGS. 2A and 2B show other examples of FIG. 1B. A region on which the protective film 23 is to be deposited can be controlled by masking. In this case, the protective film 23 can be slightly deposited on rear surface sides (regions 13) as illustrated in FIG. 2A, or the deposition of the protective film 23 on a rear surface side (a region 14) can be prevented as illustrated in FIG. 2B.

Note that the structures, methods, and the like described in this embodiment can be used as appropriate in combination with any of the structures, methods, and the like described in the other embodiments.

Embodiment 2

In this embodiment, a method for manufacturing the plurality of display panels described in Embodiment 1 is described.

FIGS. 4A to 4D illustrate a manufacturing method of the display panel 20. In FIGS. 4A to 4D, a liquid crystal element 80 and the adhesive layer 370 are illustrated as a display element, and a display panel can be formed by bonding an element substrate where a pixel, a transistor, a capacitor, and the like are provided for the substrate 100 and a counter substrate where a light-blocking layer, a coloring layer, and the like are provided for the substrate 300 to seal liquid crystal. Note that portions similar to those of the manufacturing method in FIGS. 3A to 3C are omitted.

Figure 4A:
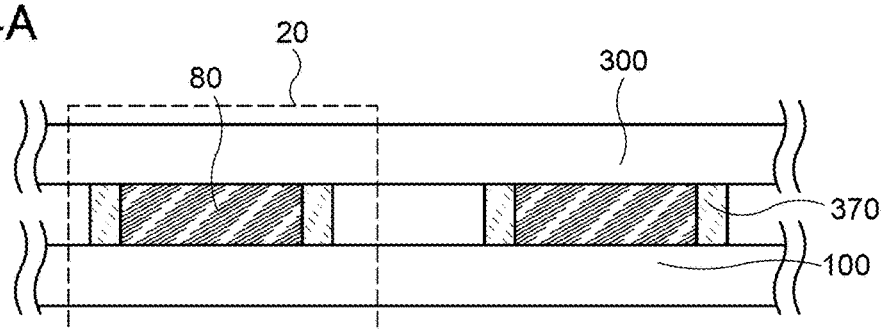
FIGS. 4A to 4D are cross-sectional views illustrating a method for manufacturing a display device of one embodiment of the present invention.
Figure 4B:
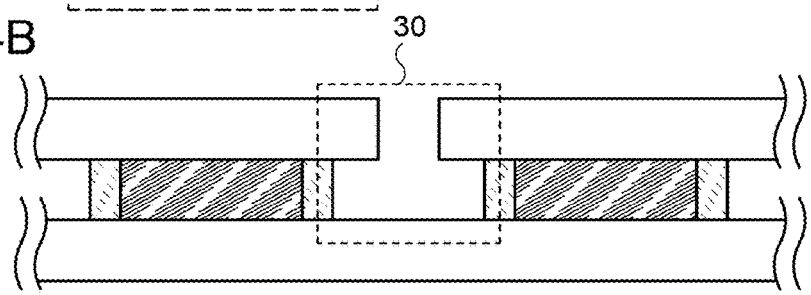
Figure 4C:
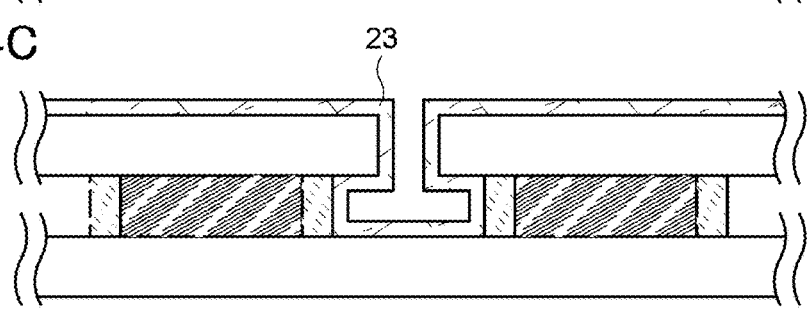
Figure 4D:
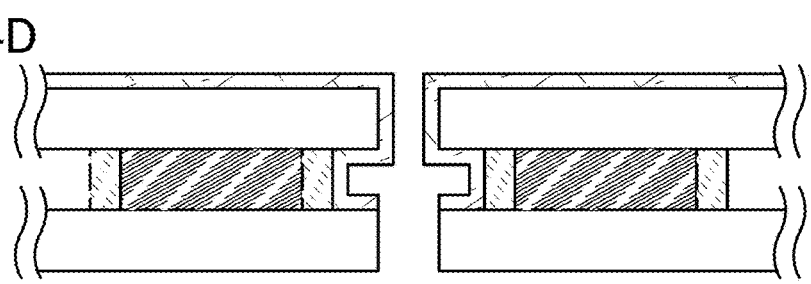
Figure 5A:
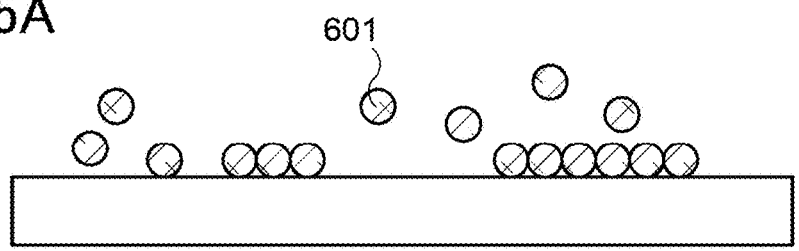
FIGS. 5A to 5D are schematic cross-sectional views illustrating a film formation principle.
Figure 5B:
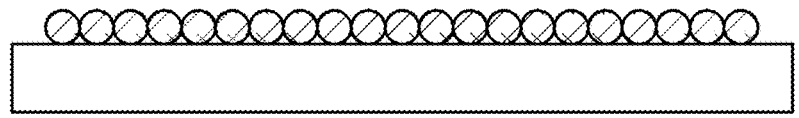
Figure 5C:
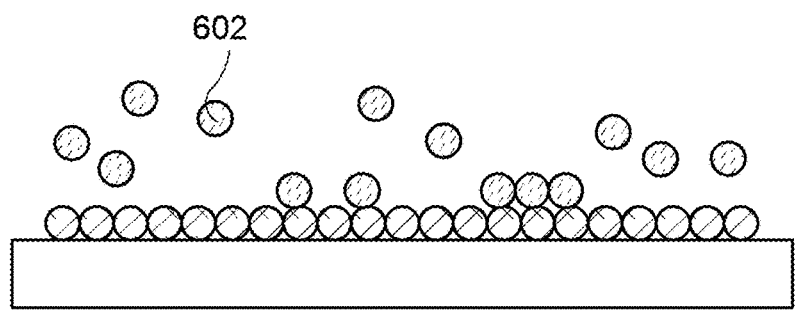
Figure 5D:
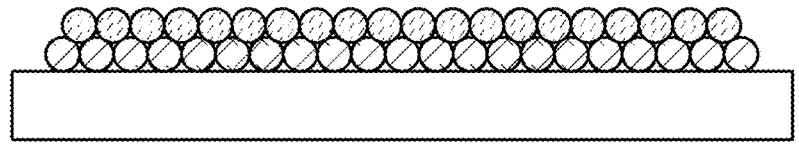

In a structure including the plurality of display panels 20 (FIG. 4A), the substrate 300 (an upper side) is cut to form a groove portion 30 (FIG. 4B). After the formation of the groove portion 30, the protective film 23 is formed from the upper side by an ALD method (FIG. 4C), and the substrate 100 is cut, whereby the plurality of display panels can be finally manufactured (FIG. 4D). Note that in this case, the formation of the protective film 23 on a rear surface of the substrate 100 (a surface on which the liquid crystal element 80 is not provided) can be inhibited.

Note that the structures, methods, and the like described in this embodiment can be used as appropriate in combination with any of the structures, methods, and the like described in the other embodiments.

Embodiment 3

Deposition Method

A deposition apparatus which can be used for forming a semiconductor layer, an insulating layer, a conductive layer, and the like, which can be used in one embodiment of the present invention, is described below.

<<CVD and ALD>>

In a conventional deposition apparatus utilizing a CVD method, source gases (precursors) for reaction are supplied to a chamber at the same time at the time of deposition. In a deposition apparatus utilizing an ALD method, precursors for reaction are sequentially introduced into a chamber, and then the sequence of the gas introduction is repeated. For example, two or more kinds of precursors are sequentially supplied to the chamber by switching respective switching valves (also referred to as high-speed valves). For example, a first precursor is introduced, an inert gas (e.g., argon or nitrogen) or the like is introduced after the introduction of the first precursor so that the plural kinds of precursors are not mixed, and then a second precursor is introduced. Alternatively, the first precursor may be exhausted by vacuum evacuation instead of the introduction of the inert gas, and then the second precursor may be introduced. FIGS. 5A to 5D illustrate a deposition process of an ALD method. A first precursor 601 is adsorbed to the surface of the substrate (see FIG. 5A), a first single layer is deposited (see FIG. 5B), the first single layer reacts with a second precursor 602 to be introduced later (see FIG. 5C), and a second single layer is stacked over the first single layer to form a thin film (see FIG. 5D). The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness.

An ALD method includes an ALD method using heating (thermal ALD method) and an ALD method using plasma (plasma ALD method). In the thermal ALD method, precursors react with each other using thermal energy, and in the plasma ALD method, precursors react with each other in a state of a radical.

With an ALD method, an extremely thin film can be formed with high accuracy. In addition, the coverage of an uneven surface with the film and the film density of the film are high.

Furthermore, plasma damage is not caused when the thermal ALD method is employed.

<<Plasma ALD>>

Alternatively, when the plasma ALD method is employed, the film can be formed at a lower temperature than when the thermal ALD method is employed. With the plasma ALD method, for example, the film can be formed without decreasing the deposition rate even at 100° C. or lower. Moreover, in the plasma ALD method, nitrogen radicals can be formed by plasma; thus, a nitride film as well as an oxide film can be formed.

Furthermore, in the case where a light-emitting element (such as an organic EL element) is used as a display element, when a process temperature is high, the deterioration of the light-emitting element may be accelerated. Here, with the plasma ALD method, the process temperature can be lowered; thus, the deterioration of the light-emitting element can be inhibited.

In addition, in the case of using the plasma ALD, inductively coupled plasma (ICP) is used to generate radical species. Accordingly, plasma can be generated at a place apart from the substrate, so that plasma damage can be inhibited.

As described above, with the plasma ALD method, the process temperature can be lowered and the coverage of the surface can be increased as compared with other deposition methods, and the protective film can be deposited on the side surface portion of the substrate after the display panel is fabricated. Thus, entry of water from the outside can be inhibited. Therefore, the reliability of driver operation of a peripheral circuit at an edge portion of a panel is improved (the transistor characteristics are improved), so that a stable operation can be achieved even in the case of employing a narrow frame.

<<ALD Apparatus>>

Figure 6A:
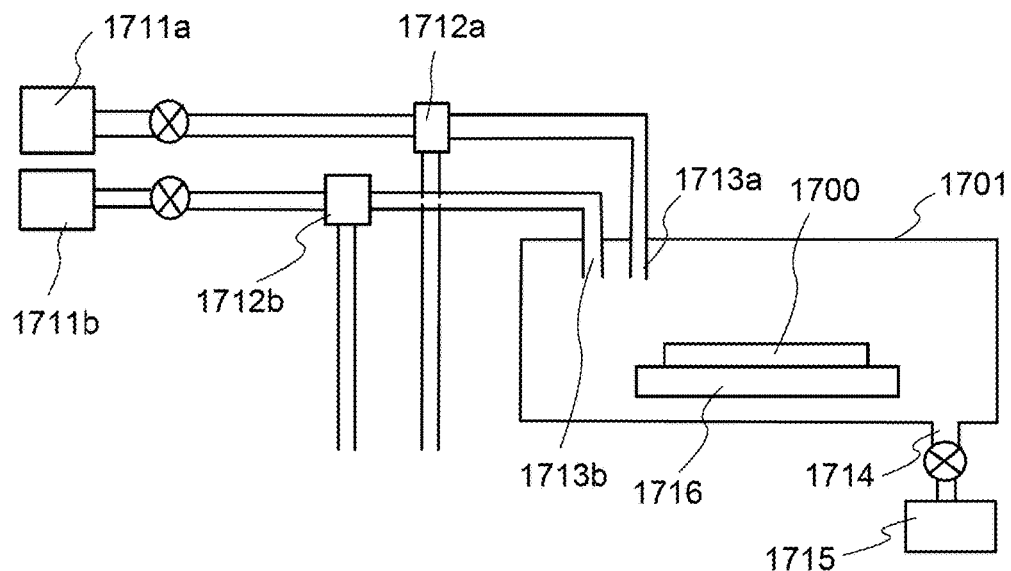
FIGS. 6A and 6B are a schematic cross-sectional view of a deposition apparatus and a schematic top view of a manufacturing apparatus including one chamber corresponding to the deposition apparatus.

FIG. 6A illustrates an example of a deposition apparatus utilizing an ALD method. The deposition apparatus utilizing an ALD method includes a deposition chamber (chamber 1701), source material supply portions 1711a and 1711b, high-speed valves 1712a and 1712b which are flow rate controllers, source material introduction ports 1713a and 1713b, a source material exhaust port 1714, and an evacuation unit 1715. The source material introduction ports 1713a and 1713b provided in the chamber 1701 are connected to the source material supply portions 1711a and 1711b, respectively, through supply tubes and valves. The source material exhaust port 1714 is connected to the evacuation unit 1715 through an exhaust tube, a valve, and a pressure controller.

A substrate holder 1716 with a heater is provided in the chamber, and a substrate 1700 over which a film is formed is provided over the substrate holder.

In the source material supply portions 1711a and 1711b, a precursor is formed from a solid source material or a liquid source material by using a vaporizer, a heating unit, or the like. Alternatively, the source material supply portions 1711a and 1711b may supply a precursor.

Although two source material supply portions 1711a and 1711b are provided as an example, without limitation thereto, three or more source material supply portions may be provided. The high-speed valves 1712a and 1712b can be accurately controlled by time, and a precursor and an inert gas are supplied by the high-speed valves 1712a and 1712b. The high-speed valves 1712a and 1712b are flow rate controllers for a precursor, and can also be referred to as flow rate controllers for an inert gas.

In the deposition apparatus illustrated in FIG. 6A, a thin film is formed over a surface of the substrate 1700 in the following manner the substrate 1700 is transferred to put on the substrate holder 1716, the chamber 1701 is sealed, the substrate 1700 is heated to a desired temperature (e.g., higher than or equal to 100° C. or higher than or equal to 150° C.) by heating the substrate holder 1716 with a heater; and supply of a precursor, evacuation with the evacuation unit 1715, supply of an inert gas, and evacuation with the evacuation unit 1715 are repeated.

In the deposition apparatus illustrated in FIG. 6A, an insulating layer formed using an oxide (including a composite oxide) containing one or more elements selected from hafnium, aluminum, tantalum, zirconium, and the like can be formed by selecting a source material (e.g., a volatile organometallic compound) used for the source material supply portions 1711a and 1711b appropriately. Specifically, it is possible to use an insulating layer formed using hafnium oxide, an insulating layer formed using aluminum oxide, an insulating layer formed using hafnium silicate, or an insulating layer formed using aluminum silicate. Alternatively, a thin film, e.g., a metal layer such as a tungsten layer or a titanium layer, or a nitride layer such as a titanium nitride layer can be formed by selecting a source material (e.g., a volatile organometallic compound) used for the source material supply portions 1711a and 1711b appropriately.

For example, in the case where a hafnium oxide layer is formed by a deposition apparatus using an ALD method, two kinds of gases, i.e., ozone ($O_3$) as an oxidizer and a precursor which is obtained by vaporizing liquid containing a solvent and a hafnium precursor compound (hafnium alkoxide or hafnium amide such as tetrakis(dimethylamide)hafnium (TDMAH)) are used. In this case, the first precursor supplied from the source material supply portion 1711a is TDMAH, and the second precursor supplied from the source material supply portion 1711b is ozone. Note that the chemical formula of tetrakis(dimethylamide)hafnium is $Hf[N(CH_3)_2]_4$. Examples of another material include tetrakis(ethylmethylamide)hafnium. Note that nitrogen has a function of eliminating charge trap states. Therefore, when the precursor contains nitrogen, a hafnium oxide film having low density of charge trap states can be formed.

For example, in the case where an aluminum oxide layer is formed by a deposition apparatus utilizing an ALD method, two kinds of gases, e.g., $H_2O$ as an oxidizer and a precursor which is obtained by vaporizing liquid containing a solvent and an aluminum precursor compound (e.g., trimethylaluminum (TMA)) are used. In this case, the first precursor supplied from the source material supply portion 1711a is TMA, and the second precursor supplied from the source material supply portion 1711b is $H_2O$. Note that the chemical formula of trimethylaluminum is $Al(CH_3)_3$. Examples of another material liquid include tris(dimethylamide)aluminum, triisobutylaluminum, and aluminum tris (2,2,6,6-tetramethyl-3,5-heptanedionate).

<<Multi-Chamber Manufacturing Apparatus>>

Figure 6B:
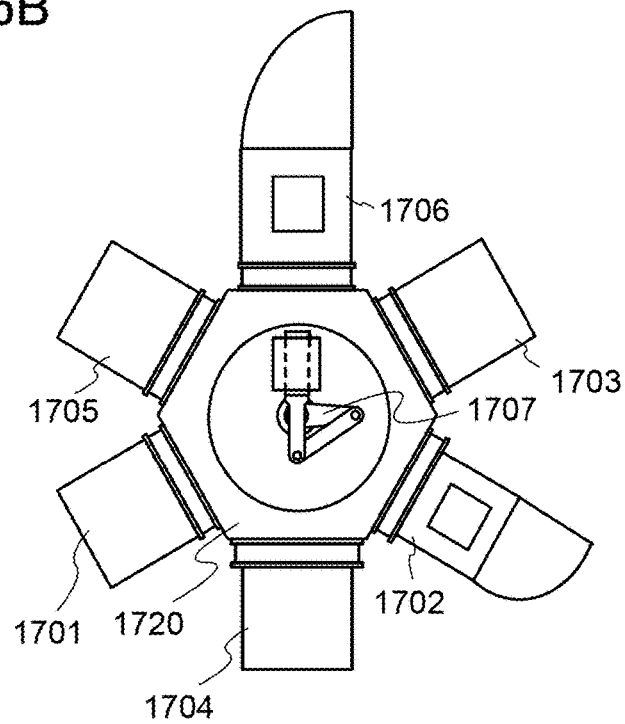

FIG. 6B illustrates an example of a multi-chamber manufacturing apparatus including at least one deposition apparatus illustrated in FIG. 6A.

In the manufacturing apparatus illustrated in FIG. 6B, a stack of films can be successively formed without exposure to the air, and entry of impurities is prevented and throughput is improved.

The manufacturing apparatus illustrated in FIG. 6B includes at least a load chamber 1702, a transfer chamber 1720, a pretreatment chamber 1703, a chamber 1701 which is a deposition chamber, and an unload chamber 1706. Note that in order to prevent attachment of moisture, the chambers of the manufacturing apparatus (including the load chamber, the treatment chamber, the transfer chamber, the deposition chamber, the unload chamber, and the like) are preferably filled with an inert gas (such as a nitrogen gas) whose dew point is controlled, more preferably maintain reduced pressure.

The chambers 1704 and 1705 may be deposition apparatuses utilizing an ALD method like the chamber 1701, deposition apparatuses utilizing a plasma CVD method, deposition apparatuses utilizing a sputtering method, or deposition apparatuses utilizing a metal organic chemical vapor deposition (MOCVD) method.

For example, an example in which a stack of films is formed under a condition that the chamber 1704 is a deposition apparatus utilizing a plasma CVD method and the chamber 1705 is a deposition apparatus utilizing an MOCVD method is shown below.

Although FIG. 6B shows an example in which a top view of the transfer chamber 1720 is a hexagon, a manufacturing apparatus in which the top surface shape is set to a polygon having more than six corners and more chambers are connected depending on the number of layers of a stack may be used. The top surface shape of the substrate is rectangular in FIG. 6B; however, there is no particular limitation on the top surface shape of the substrate. Although FIG. 6B shows an example of the single wafer type, a batch-type deposition apparatus in which a plurality of substrates are formed at a time may be used.

<<Large Area ALD Apparatus>>

Figure 7A:
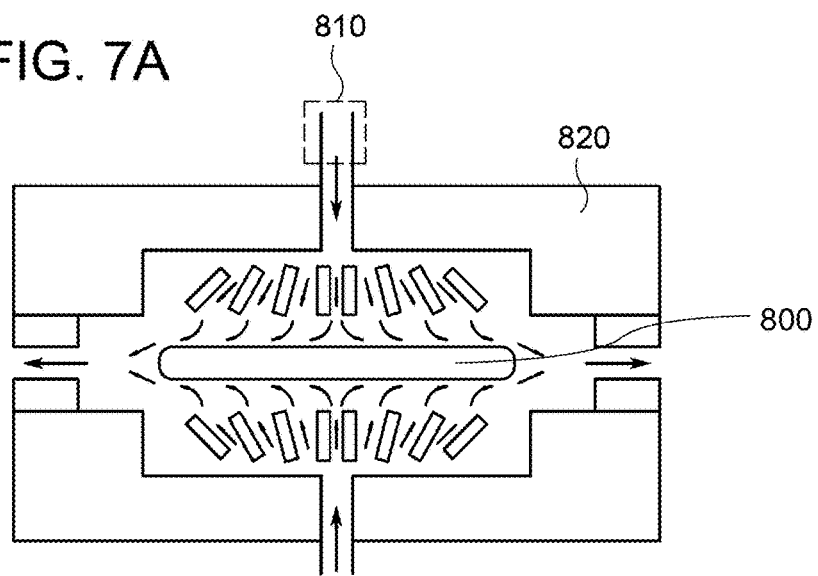
FIGS. 7A and 7B are schematic cross-sectional views of deposition apparatuses.
Figure 7B:
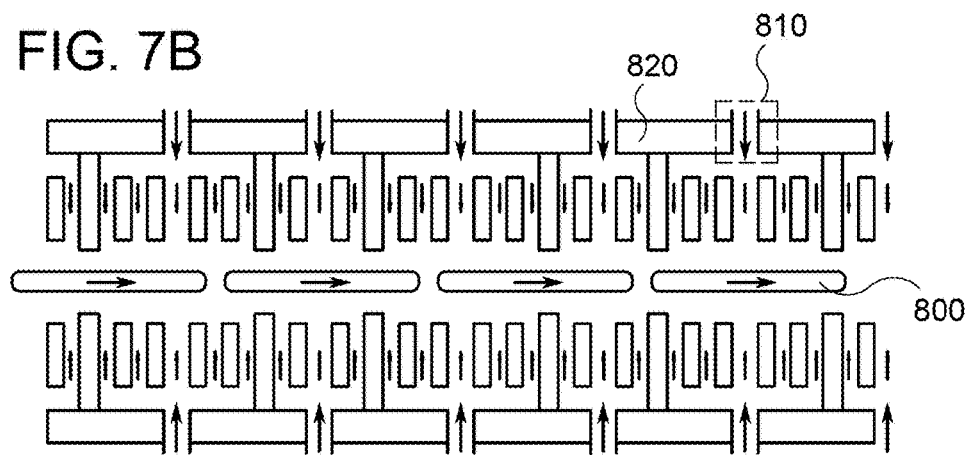

Moreover, with the plasma ALD method, a film can be deposited on a large substrate. FIGS. 7A and 7B are schematic views of other examples of the ALD apparatus. A gas which is made into plasma (precursor) is introduced from an introduction port 810 into a chamber 820, and a film can be deposited on a substrate 800 from above and below by an ALD method. As for the deposition method, the film can be deposited with the substrate fixed in the chamber as illustrated in FIG. 7A, or the film can be deposited while the substrate is carried by an in-line method as illustrated in FIG. 7B. By using the plasma ALD method, the film can be deposited with high throughput and in a large area.

Embodiment 4

In this embodiment, the details of the display device described in Embodiments 1 and 2 are described with reference to drawings.

FIGS. 8A and 8B are examples of a top view and a cross-sectional view of the display device. Note that FIG. 8A illustrates a typical structure including the display panel 20, the display region 21, the peripheral circuit 22, and the FPC 42.

FIG. 8B is a cross-sectional view taken along dashed-dotted lines A-A', B-B', C-C', and D-D' in FIG. 8A.

<<Liquid Crystal Panel>>

As illustrated in FIG. 8B, a liquid crystal panel can be used as a display panel included in the display device. A display device illustrated in FIG. 8B includes a liquid crystal element 80 as a display element. The display device also includes a polarizing plate 103, a polarizing plate 303, and a backlight 104, which are bonded with adhesive layers 373, 374, and 375. Furthermore, a protective substrate 302 is provided on the side closer to a viewer than the polarizing plate 303 is, and is bonded with an adhesive layer 376.

<<Substrate 100>>

There is no particular limitation on a material and the like of a substrate 100 as long as the material has heat resistance high enough to withstand at least heat treatment performed later. The material desirably has a high light-transmitting property.

For the substrate 100, an organic material, an inorganic material, a composite material of an organic material and an inorganic material, or the like can be used. For example, an inorganic material such as glass, a ceramic, or a metal can be used for the substrate 100.

Specifically, non-alkali glass, soda-lime glass, potash glass, crystal glass, or the like can be used for the substrate 100. Specifically, an inorganic oxide film, an inorganic nitride film, an inorganic oxynitride film, or the like can also be used for the substrate 100. Silicon oxide, silicon nitride, silicon oxynitride, alumina, stainless steel, aluminum, or the like can be used for the substrate 100.

A single-layer material or a stacked-layer material in which a plurality of layers are stacked can be used for the substrate 100. For example, a stacked-layer material in which a base, an insulating film that prevents diffusion of impurities contained in the base, and the like are stacked can be used for the substrate 100. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used for the substrate 100. Alternatively, a stacked-layer material in which a resin and a film for preventing diffusion of impurities that penetrate the resin, such as a silicon oxide film, a silicon nitride film, and a silicon oxynitride film are stacked can be used for the substrate 100.

The above-described substrate that can be used as the substrate 100 can be used as the substrate 300 as well.

<<Transistors 50, 52>>

The transistor 50 can be formed using a conductive layer 120, insulating layers 130 and 131, a semiconductor layer 140, a conductive layer 150, a conductive layer 160, an insulating layer 170, and an insulating layer 180. A transistor 52 can include similar components.

<<Insulating Layer 110>>

The insulating layer 110 that functions as a base film is formed using silicon oxide, silicon oxynitride, silicon nitride, silicon nitride oxide, gallium oxide, hafnium oxide, yttrium oxide, aluminum oxide, aluminum oxynitride, or the like. Note that when silicon nitride, gallium oxide, hafnium oxide, yttrium oxide, aluminum oxide, or the like is used as a material for the insulating layer 110, it is possible to suppress diffusion of impurities such as alkali metal, water, and hydrogen into the semiconductor layer 140 from the substrate 100. The insulating layer 110 is formed over the substrate 100. The insulating layer 110 is not necessarily provided.

<<Conductive Layer 120>>

The conductive layer 120 that functions as a gate electrode is formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Furthermore, one or more metal elements selected from manganese and zirconium may be used. The conductive layer 120 may have a single-layer structure or a layered structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used.

<<Insulating Layer 130>>

The insulating layer 130 functions as a gate insulating film. The insulating layer 130 can be formed using, for example, an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 130 may be a stack of any of the above materials. The insulating layer 130 may contain lanthanum (La), nitrogen, or zirconium (Zr) as an impurity.

<<Insulating Layer 131>>

Furthermore, the gate insulating film can be a stack of the insulating layer 130 and the insulating layer 131. The insulating layer 131 can be formed using, for example, an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 131 may be a stack of any of the above materials. The insulating layer 131 may contain lanthanum (La), nitrogen, zirconium (Zr), or the like as an impurity. With the insulating layer 131, it is possible to prevent entry of hydrogen, water, or the like into the semiconductor layer 140 from the outside.

<<Semiconductor Layer 140>>

The semiconductor layer 140 is formed using a metal oxide containing at least In or Zn. The area of a top surface of the semiconductor layer 140 is preferably the same as or smaller than the area of a top surface of the conductive layer 120.

<<Oxide Semiconductor>>

As an oxide semiconductor used for the aforementioned semiconductor layer 140, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, and an In—Ga-based oxide.

Note that here, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

When the semiconductor layer 140 is formed using an In-M-Zn oxide, the atomic ratio of In to M when the summation of In and M is assumed to be 100 atomic % is preferably as follows: the proportion of In is higher than 25 atomic % and the proportion of M is lower than 75 atomic %; further preferably, the proportion of In is higher than 34 atomic % and the proportion of M is lower than 66 atomic %.

The energy gap of the semiconductor layer 140 is 2 eV or more, preferably 2.5 eV or more, and further preferably 3 eV or more. With the use of an oxide semiconductor having such a wide energy gap, the off-state current of the transistor 50 can be reduced.

The thickness of the semiconductor layer 140 desirably ranges from 3 nm to 200 nm, preferably from 3 nm to 100 nm, and further preferably from 3 nm to 50 nm.

In the case where the semiconductor layer 140 is formed using an In-M-Zn oxide (M is Al, Ga, Y, Zr, La, Ce, or Nd), it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=3:1:2, and In:M:Zn=4:2:4.1 are preferable. Note that the atomic ratio of metal elements in the formed semiconductor layer 140 varies from the above atomic ratio of metal elements of the sputtering target within a range of ±40% as an error. Note that a c-axis aligned crystalline oxide semiconductor (CAAC-OS) film and a microcrystalline oxide semiconductor film that are described later can be formed using a target including an In—Ga—Zn oxide, preferably a polycrystalline target including an In—Ga—Zn oxide.

Hydrogen contained in the semiconductor layer 140 reacts with oxygen bonded to a metal atom to be water, and also causes oxygen vacancies in a lattice from which oxygen is released (or a portion from which oxygen is released). Due to entry of hydrogen into the oxygen vacancies, an electron serving as a carrier is generated. Further, in some cases, bonding of part of hydrogen to oxygen bonded to a metal atom causes generation of an electron serving as a carrier. Thus, a transistor including an oxide semiconductor which contains hydrogen is likely to be normally on.

Accordingly, it is preferable that hydrogen as well as the oxygen vacancies in the semiconductor layer 140 be reduced as much as possible. Specifically, in the semiconductor layer 140, the concentration of hydrogen which is measured by secondary ion mass spectrometry (SIMS) is set to lower than or equal to $5\times10^{19}$ atoms/cm$^3$, preferably lower than or equal to $1\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$, and still more preferably lower than or equal to $1\times10^{16}$ atoms/cm$^3$. As a result, the transistor 50 has a positive threshold voltage (also referred to as normally-off characteristics).

When silicon or carbon which is one of the elements belonging to Group 14 is contained in the semiconductor layer 140, oxygen vacancies are increased in the semiconductor layer 140, and the semiconductor layer 140 has n-type conductivity. Thus, the concentration of silicon or carbon (the concentration is measured by SIMS) in the semiconductor layer 140 is lower than or equal to $2\times10^{18}$ atoms/cm$^3$, preferably lower than or equal to $2\times10^{17}$ atoms/cm$^3$. As a result, the transistor 50 has a positive threshold voltage (also referred to as normally-off characteristics).

Furthermore, the concentration of alkali metal or alkaline earth metal in the semiconductor layer 140, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the semiconductor layer 140. As a result, the transistor 50 has a positive threshold voltage (also referred to as normally-off characteristics).

Furthermore, when nitrogen is contained in the semiconductor layer 140, electrons serving as carriers are generated to increase the carrier density, so that the semiconductor layer 140 easily has n-type conductivity. Thus, the transistor tends to have normally-on characteristics. For this reason, nitrogen in the semiconductor layer 140 is preferably reduced as much as possible; for example, the concentration of nitrogen which is measured by SIMS is preferably set to lower than or equal to $5\times10^{18}$ atoms/cm$^3$.

When impurities in the semiconductor layer 140 are reduced, the carrier density of the semiconductor layer 140 can be lowered. The carrier density of the semiconductor layer 140 is $1\times10^{15}$/cm$^3$ or less, preferably $1\times10^{13}$/cm$^3$ or less, further preferably $8\times10^{11}$/cm$^3$ or less, further preferably less than $1\times10^{11}/cm^3$, further preferably less than $1\times10^{10}/cm^3$, and $1\times10^{-9}/cm^3$ or more.

When an oxide semiconductor having a low impurity concentration and a low density of defect states is used for the semiconductor layer 140, the transistor can have more excellent electrical characteristics. Here, the state in which impurity concentration is low and the density of defect states is low (the amount of oxygen vacancies is small) is referred to as "highly purified intrinsic" or "substantially highly purified intrinsic." A highly purified intrinsic or substantially highly purified intrinsic oxide semiconductor has few carrier generation sources, and thus has a low carrier density in some cases. Thus, the transistor whose channel region is formed in the semiconductor layer 140 including the oxide semiconductor is likely to have a positive threshold voltage (also referred to as normally-off characteristics). A highly purified intrinsic or substantially highly purified intrinsic oxide semiconductor has a low density of defect states and accordingly has a low density of trap states in some cases. The transistor including the semiconductor layer 140 containing the highly purified intrinsic or substantially highly purified intrinsic oxide semiconductor has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. In addition, variation in characteristics can be prevented.

In the case where the voltage between a source and a drain is set to about 0.1 V, 5 V, or 10 V, for example, the off-state current standardized on the channel width of the transistor 50 in which the semiconductor layer 140 is used for the semiconductor layer can be as low as several yoctoamperes per micrometer to several zeptoamperes per micrometer.

When a transistor with an extremely low off-state leakage current is used as the transistor 50 connected to a display element (e.g., a liquid crystal element 80), the time for holding image signals can be extended. For example, images can be held even when the frequency of writing image signals is higher than or equal to 11.6 μHz (once a day) and less than 0.1 Hz (0.1 times a second), preferably higher than or equal to 0.28 mHz (once an hour) and less than 1 Hz (once a second). As a result, the frequency of writing image signals can be reduced, leading to a reduction in the power consumption of the display panel 20. Needless to say, the frequency of writing image signals can be higher than or equal to 1 Hz, preferably higher than or equal to 30 Hz (30 times a second), further preferably higher than or equal to 60 Hz (60 times a second) and less than 960 Hz (960 times a second).

From the above reason, the use of a transistor containing an oxide semiconductor allows fabrication of a highly reliable display panel with low power consumption.

In the transistor containing an oxide semiconductor, the semiconductor layer 140 can be formed by a sputtering method, an MOCVD method, a pulsed laser deposition (PLD) method, or the like. When a sputtering method is used, the transistor can be used in a large-area display device.

Note that instead of the semiconductor layer 140, a semiconductor layer including silicon or silicon germanium may be used. The semiconductor layer including silicon or silicon germanium can have an amorphous structure, a polycrystalline structure, or a single crystal structure, as appropriate.

<<Insulating Layer 170>>

The insulating layer 170 has a function of protecting the channel region of the transistor. The insulating layer 170 is formed using an oxide insulating film such as silicon oxide, silicon oxynitride, aluminum oxide, aluminum oxynitride, gallium oxide, gallium oxynitride, yttrium oxide, yttrium oxynitride, hafnium oxide, or hafnium oxynitride, or a nitride insulating film such as silicon nitride or aluminum nitride. The insulating layer 170 can have a single-layer structure or a stacked-layer structure.

The insulating layer 170 is preferably formed using an oxide insulating film containing more oxygen than that in the stoichiometric composition. Part of oxygen is released by heating from the oxide insulating film containing more oxygen than that in the stoichiometric composition. The oxide insulating film containing more oxygen than that in the stoichiometric composition is an oxide insulating film of which the amount of released oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis in which heat treatment is performed such that a temperature of a film surface is higher than or equal to 100° C. and lower than or equal to 700° C. or higher than or equal to 100° C. and lower than or equal to 500° C. By the heat treatment, oxygen contained in the insulating layer 170 can be transferred to the semiconductor layer 140, so that the amount of oxygen vacancies in the semiconductor layer 140 can be reduced.

<<Insulating Layer 180>>

When an insulating film having a blocking effect against oxygen, hydrogen, water, and the like is provided as the insulating layer 180, it is possible to prevent outward diffusion of oxygen from the semiconductor layer 140 and entry of hydrogen, water, or the like into the semiconductor layer 140 from the outside. The insulating layer 180 can be formed using, for example, an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials. The insulating layer 180 may contain lanthanum (La), nitrogen, or zirconium (Zr) as an impurity.

<<Capacitor 61, 63>>

A capacitor 61 includes the conductive layer 400, the insulating layer 180, and the conductive layer 190. The conductive layer 400 functions as one electrode of the capacitor 61. The conductive layer 190 functions as the other electrode of the capacitor 61. The insulating layer 180 is provided between the conductive layer 400 and the conductive layer 190. A capacitor 63 can have a structure similar to that of the capacitor 61.

<<Conductive Layer 400>>

When the transistor 50 includes an oxide semiconductor in the semiconductor layer 140, the conductive layer 400 can be formed of the same material as the semiconductor layer 140 over the insulating layer 130. In that case, the conductive layer 400 is formed by processing a film formed at the same time as the semiconductor layer 140, and therefore contains elements similar to those in the semiconductor layer 140. The conductive layer 400 has a crystal structure similar to or different from that of the semiconductor layer 140. When the film formed at the same time as the semiconductor layer 140 includes impurities or oxygen vacancies, the film can have conductivity to be the conductive layer 400. Typical examples of the impurities contained in the conductive layer 400 are a rare gas, hydrogen, boron, nitrogen, fluorine, aluminum, and phosphorus. Typical examples of the rare gas include helium, neon, argon, krypton, and xenon. Note that the conductive layer 400 has conductivity as an example; however, one embodiment of the present invention is not limited to this example and the conductive layer 400 does not need to have conductivity depending on the case or circumstances. In other words, the conductive layer 400 may have properties similar to those of the semiconductor layer 140.

Although the semiconductor layer 140 and the conductive layer 400 are formed over the insulating layer 130 as described above, they have different impurity concentrations. Specifically, the impurity concentration of the conductive layer 400 is higher than that of the semiconductor layer 140. For example, in the semiconductor layer 140, the hydrogen concentration measured by secondary ion mass spectrometry is lower than or equal to $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$, and yet still further preferably lower than or equal to $1 \times 10^{16}$ atoms/cm$^3$. In contrast, the hydrogen concentration in the conductive layer 400 measured by secondary ion mass spectrometry is higher than or equal to $8 \times 10^{19}$ atoms/cm$^3$, preferably higher than or equal to $1 \times 10^{20}$ atoms/cm$^3$, and further preferably higher than or equal to $5 \times 10^{20}$ atoms/cm$^3$. In addition, the hydrogen concentration in the conductive layer 400 is greater than or equal to 2 times or greater than or equal to 10 times that in the semiconductor layer 140.

When the hydrogen concentration in the semiconductor layer 140 is set in the aforementioned range, generation of electrons serving as carriers in the semiconductor layer 140 can be suppressed.

When an oxide semiconductor film formed at the same time as the semiconductor layer 140 is exposed to plasma, the oxide semiconductor film is damaged and oxygen vacancies can be generated. For example, when a film is formed over the oxide semiconductor film by a plasma CVD method or a sputtering method, the oxide semiconductor film is exposed to plasma and oxygen vacancies are generated. Alternatively, when the oxide semiconductor film is exposed to plasma in etching treatment for formation of an opening in the insulating layer 170, oxygen vacancies are generated. Alternatively, when the oxide semiconductor film is exposed to plasma of a mixed gas of oxygen and hydrogen, hydrogen, a rare gas, ammonia, and the like, oxygen vacancies are generated. Alternatively, when impurities are added to the oxide semiconductor film, oxygen vacancies can be formed while the impurities are added to the oxide semiconductor film. The impurities can be added by an ion doping method, an ion implantation method, a plasma treatment method, and the like. In the plasma treatment method, plasma is generated in a gas atmosphere containing the impurities to be added, and ions of the impurities accelerated by plasma treatment are made to collide with the oxide semiconductor film, whereby oxygen vacancies can be formed in the oxide semiconductor film.

When an impurity, e.g., hydrogen is contained in the oxide semiconductor film in which oxygen vacancies are generated by addition of impurity elements, hydrogen enters an oxygen vacant site and forms a donor level in the vicinity of the conduction band. As a result, the oxide semiconductor film has increased conductivity to be a conductor. An oxide semiconductor film that has become a conductor can be referred to as an oxide conductor film. That is, it can be said that the semiconductor layer 140 is formed of an oxide semiconductor and the conductive layer 400 is formed of an oxide conductor film. It can also be said that the conductive layer 400 is formed of an oxide semiconductor film having high conductivity or a metal oxide film having high conductivity.

Note that the insulating layer 180 preferably contains hydrogen. Since the conductive layer 400 is in contact with the insulating layer 180, hydrogen contained in the insulating layer 180 can be diffused into the oxide semiconductor film formed at the same time as the semiconductor layer 140. As a result, impurities can be added to the oxide semiconductor film formed at the same time as the semiconductor layer 140.

Furthermore, the insulating layer 170 is preferably formed using an oxide insulating film containing more oxygen than that in the stoichiometric composition, and the insulating layer 180 is preferably formed using an insulating film containing hydrogen. When oxygen contained in the insulating layer 170 is transferred to the semiconductor layer 140 of the transistor 50, the amount of oxygen vacancies in the semiconductor layer 140 can be reduced and a change in the electrical characteristics of the transistor 50 can be reduced. In addition, hydrogen contained in the insulating layer 180 is transferred to the conductive layer 400 to increase the conductivity of the conductive layer 400.

In the above manner, the conductive layer 400 can be formed at the same time as the semiconductor layer 140, and conductivity is given to the conductive layer 400 after the formation. Such a structure results in a reduction in manufacturing costs.

Oxide semiconductor films generally have a visible light transmitting property because of their large energy gap. In contrast, an oxide conductor film is an oxide semiconductor film having a donor level in the vicinity of the conduction band. Thus, the influence of light absorption due to the donor level is small, so that an oxide conductor film has a visible light transmitting property comparable to that of an oxide semiconductor film.

<<Conductive Layer 190>>

The conductive layer 190 is formed using a conductive film that transmits visible light. For example, a material including one of indium (In), zinc (Zn), and tin (Sn) can be used for the conductive film that transmits visible light. Typical examples of the conductive film that transmits visible light include conductive oxides such as indium tin oxide, indium oxide containing tungsten oxide, indium zinc oxide containing tungsten oxide, indium oxide containing titanium oxide, indium tin oxide containing titanium oxide, indium zinc oxide, and indium tin oxide containing silicon oxide.

From the above, the conductive layer 190 and the conductive layer 400 have light-transmitting properties; as a result, the capacitor 61 can have a light-transmitting property as a whole.

<<Conductive Layer 380>>

The conductive layer 380 is formed using a conductive film that transmits visible light. For example, a material including one of indium (In), zinc (Zn), and tin (Sn) can be used for the conductive film that transmits visible light. Typical examples of the conductive film that transmits visible light include conductive oxides such as indium tin oxide, indium oxide containing tungsten oxide, indium zinc oxide containing tungsten oxide, indium oxide containing titanium oxide, indium tin oxide containing titanium oxide, indium zinc oxide, and indium tin oxide containing silicon oxide.

<<Liquid Crystal Element 80>>

The liquid crystal element 80 can be driven in a fringe field switching (FFS) mode, for example. The alignment of liquid crystal molecules included in the liquid crystal layer 390 can be controlled by an electric field from the conductive layer 190; thus, the liquid crystal layer 390 functions as the liquid crystal element 80.

Although not illustrated in FIGS. 8A and 8B, an alignment film may be provided on a side of the conductive layer 190 in contact with the liquid crystal layer 390 and on a side of the conductive layer 380 in contact with the liquid crystal layer 390.

Furthermore, the liquid crystal layer 390 is provided between the conductive layers 190 and 380, and the alignment of liquid crystal molecules can be controlled by an electric field generated therebetween. Examples of a driving method of the display device including a liquid crystal element include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an in plane switching (IPS) mode, and a transverse bend alignment (TBA) mode. Other examples of the driving method of the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited to the above, and various liquid crystal elements and driving methods can be employed.

The liquid crystal element 80 may be formed using a liquid crystal composition including a liquid crystal exhibiting a nematic phase and a chiral material. In that case, a cholesteric phase or a blue phase is exhibited. The liquid crystal exhibiting a blue phase has a short response time of 1 msec or less. Since the liquid crystal exhibiting a blue phase is optically isotropic, alignment treatment is not necessary and viewing angle dependence is small.

<<Light-Blocking Layer 18>>

A light-blocking material can be used for the light-blocking layer 18. A resin in which a pigment is dispersed, a resin containing a dye, or an inorganic film such as a black chromium film can be used for the light-blocking layer 18. Carbon black, an inorganic oxide, a composite oxide containing a solid solution of a plurality of inorganic oxides, or the like can be used for the light-blocking layer 18.

<<Coloring Layer 360>>

A coloring layer 360 transmits light in a specific wavelength range. For example, a color filter that transmits light in a specific wavelength range, such as red, green, blue, or yellow light, can be used. Each coloring layer is formed in a desired position with any of various materials by a printing method, an inkjet method, an etching method using a photolithography method, or the like. In a white pixel, a resin such as a transparent resin or a white resin may overlap with the light-emitting element.

<<Spacer 240>>

An insulating material can be used for a spacer 240. For example, an inorganic material, an organic material, or a stacked-layer material of an inorganic material and an organic material can be used. Specifically, a film containing silicon oxide, silicon nitride, or the like, acrylic, polyimide, a photosensitive resin, or the like can be used.

<<Adhesive Layer 370>>

An inorganic material, an organic material, a composite material of an inorganic material and an organic material, or the like can be used for the adhesive layer 370.

For example, an organic material such as a light curable adhesive, a reactive curable adhesive, a thermosetting adhesive, and/or an anaerobic adhesive can be used for the adhesive layer 370. Note that each of the adhesives can be used alone or in combination.

The light curable adhesive refers to, for example, an adhesive that is cured by ultraviolet rays, an electron beam, visible light, infrared light, or the like.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, silica, or the like can be used for the adhesive layer 370.

The material is cured rapidly particularly when a light curable adhesive is used, leading to shortening of the process time. In addition, influence of the film formation step can be inhibited because curing starts with light irradiation. In addition, involuntary curing of the adhesive due to environment can be prevented because curing starts with light irradiation. Furthermore, curing can be performed at low temperatures to facilitate the control of process environment. From the above reasons, the use of a light curable adhesive shortens the process time and reduces processing costs.

<<Insulating Layer 330>>

The insulating layer 330 has a function of making a flat surface. An inorganic material or an organic material can be used for the insulating layer 330. For example, an oxide insulating film of silicon oxide, silicon oxynitride, aluminum oxide, aluminum oxynitride, gallium oxide, gallium oxynitride, yttrium oxide, yttrium oxynitride, hafnium oxide, hafnium oxynitride, or the like; a nitride insulating film of silicon nitride, aluminum nitride, or the like; or a heat-resistant organic material such as a polyimide resin, an acrylic resin, a polyimide amide resin, a benzocyclobutene resin, a polyamide resin, or an epoxy resin can be used.

<<FPC 42>>

The FPC 42 is electrically connected to the conductive layer 160 through an anisotropic conductive film 510. The conductive layer 160 can be formed in a step of forming electrode layers of the transistor 50 and the like. An image signal and the like can be supplied from the FPC 42 to the driver circuit including the transistor 50, the capacitor 61, and the like.

<<Another Structure of Edge Shape of Substrate of Display Device>>

Figure 9:
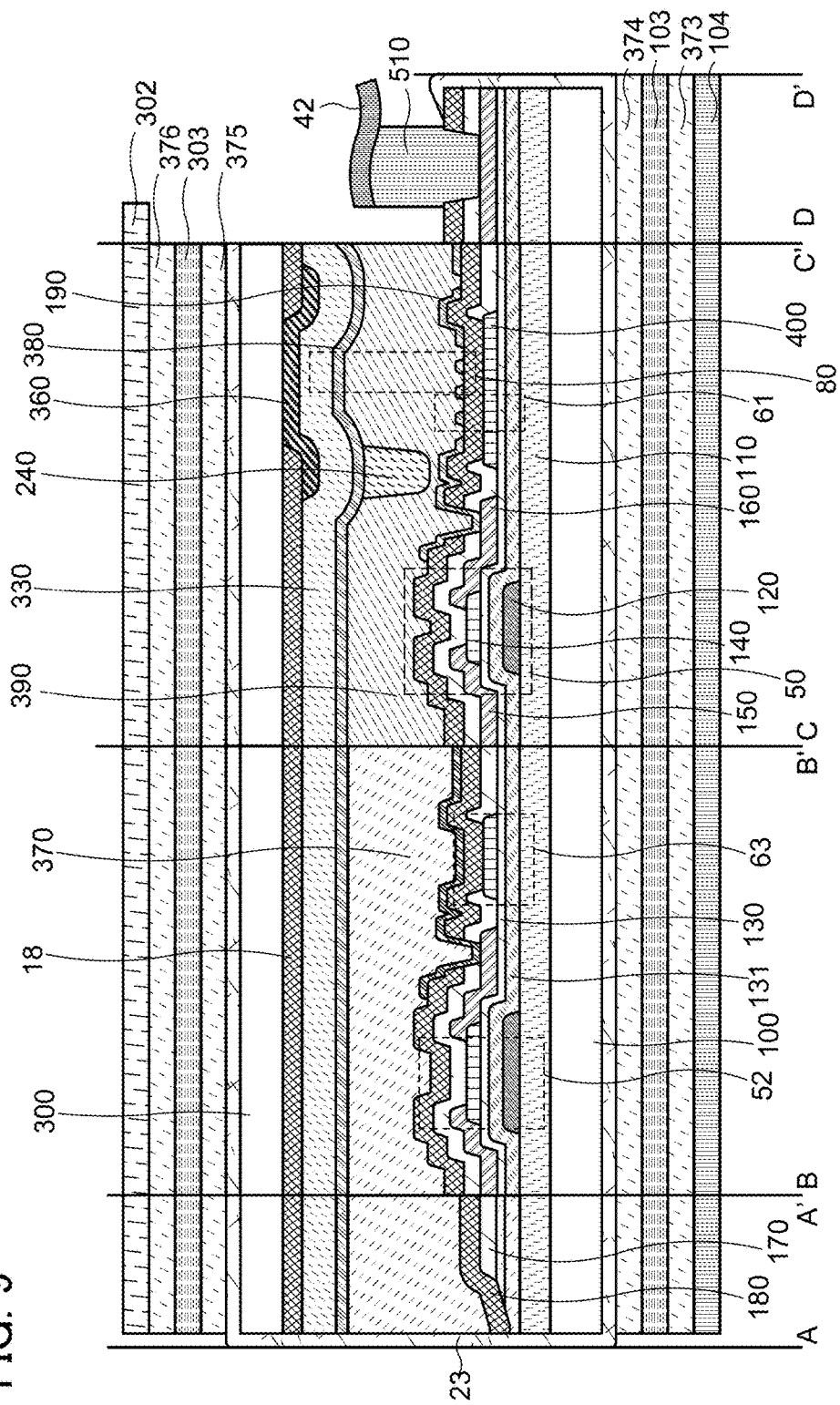
FIG. 9 is a cross-sectional view illustrating a display device of one embodiment of the present invention.

In addition, FIG. 9 shows a cross-sectional view of another structure of the display device in FIGS. 8A and 8B. The edge of the substrate has no unevenness as illustrated in FIG. 1C, and a protective film can be deposited by an ALD method.

<<Other Structures of Protective Film 23 Formed in Display Device 10>>

Figure 10:
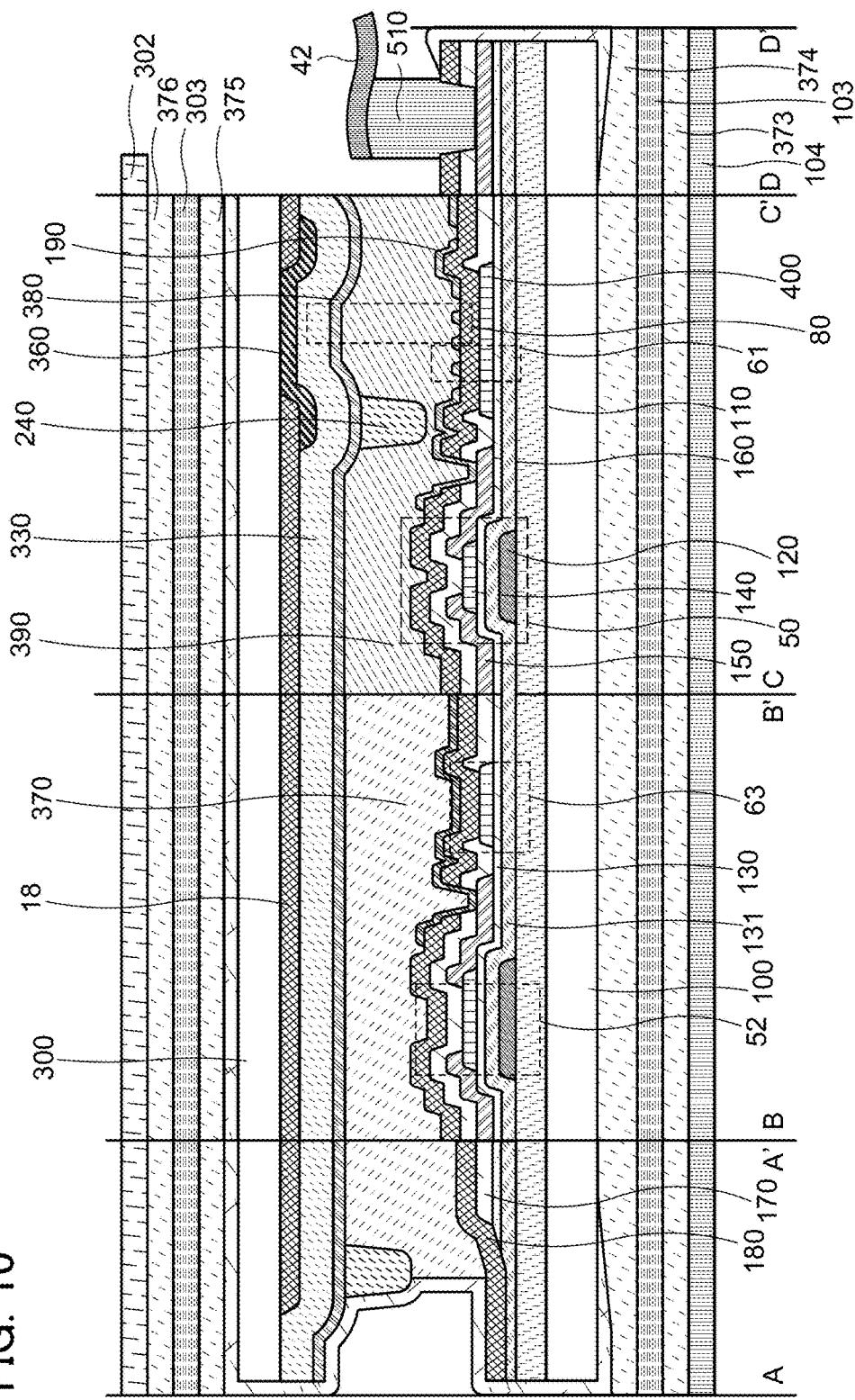
FIG. 10 is a cross-sectional view illustrating a display device of one embodiment of the present invention.
Figure 11:
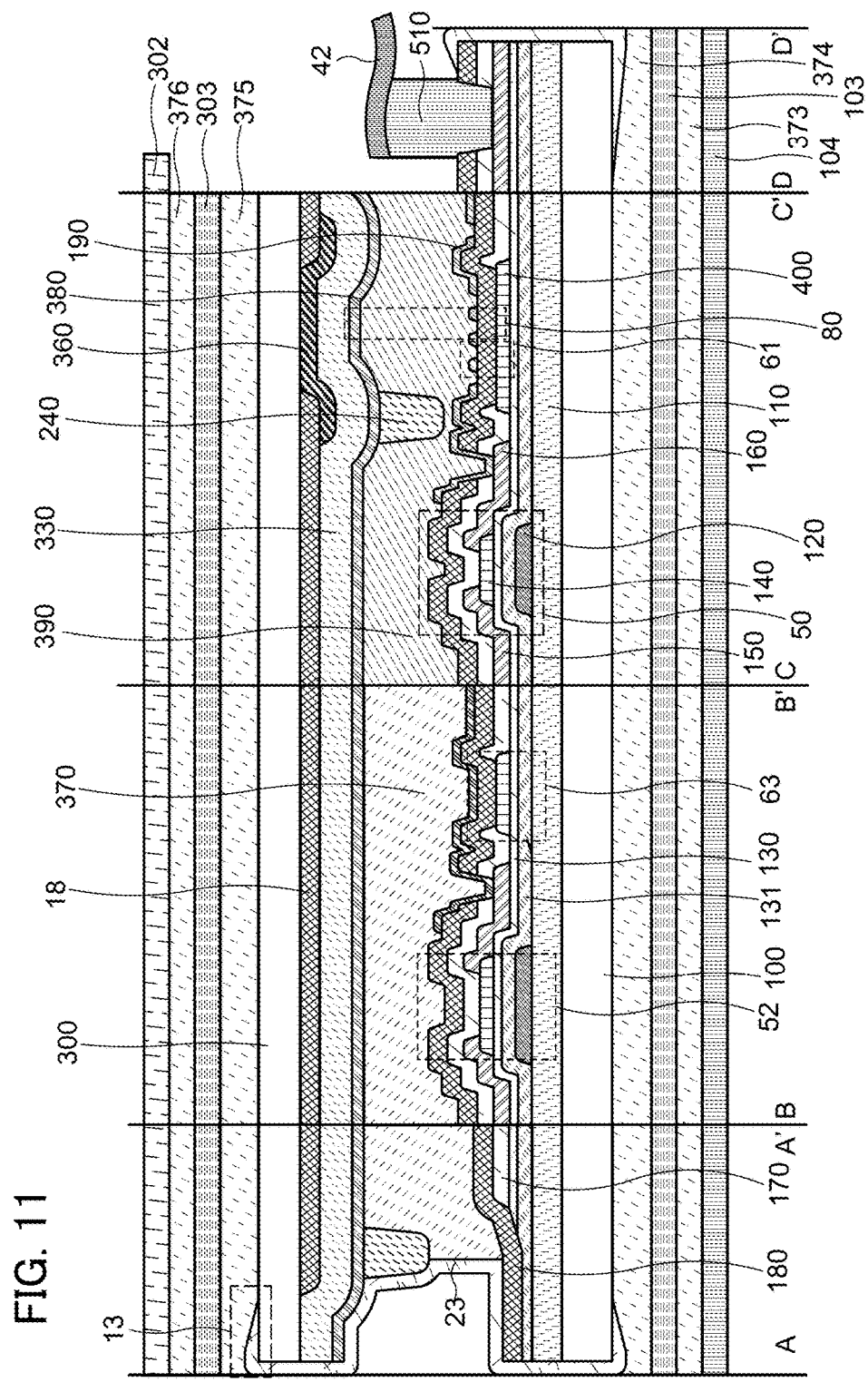
FIG. 11 is a cross-sectional view illustrating a display device of one embodiment of the present invention.
Figure 12:
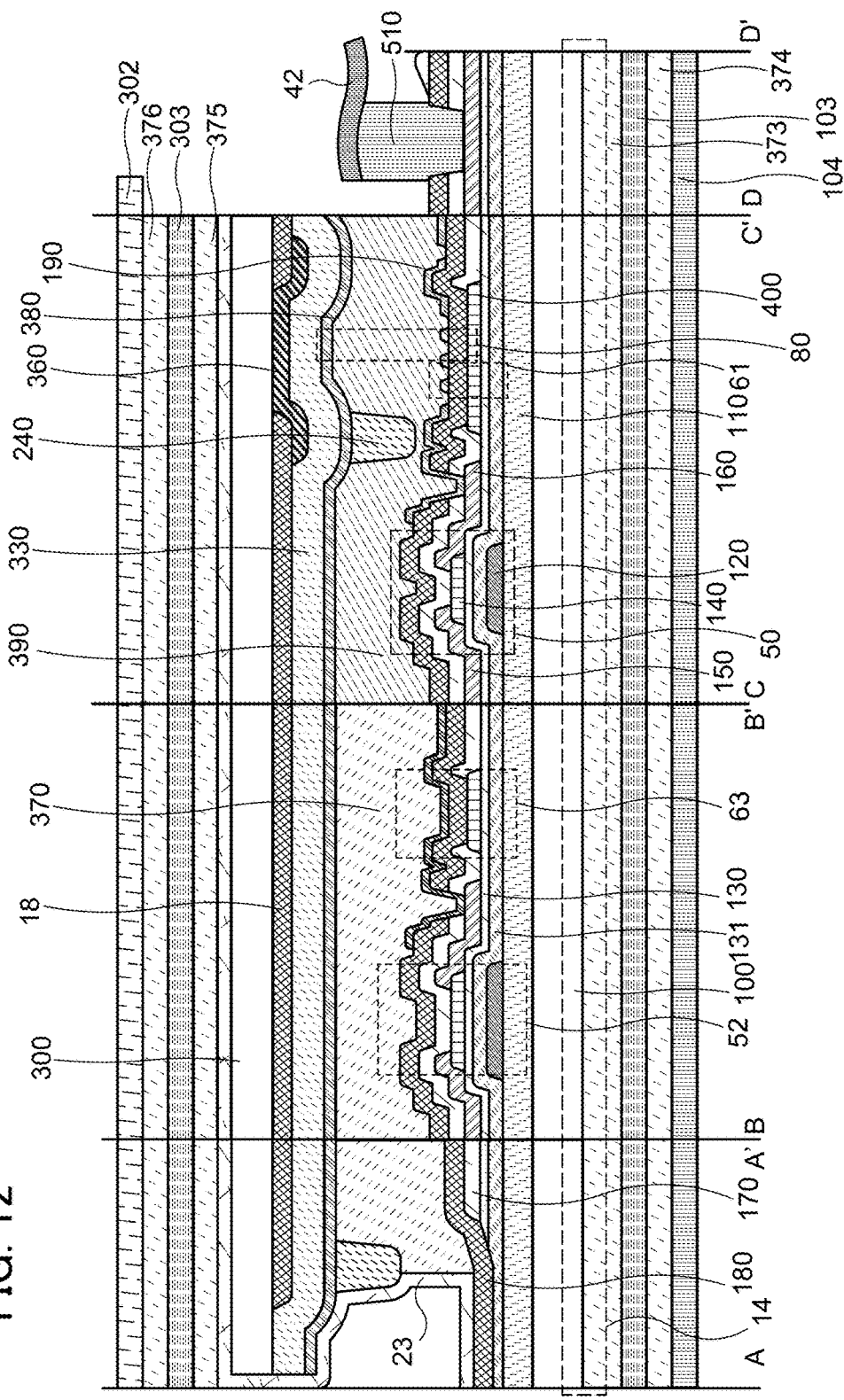
FIG. 12 is a cross-sectional view illustrating a display device of one embodiment of the present invention.

When a protective film is formed in the display device 10, the protective film can be formed on the surface and the side surface selectively. FIG. 10, FIG. 11, and FIG. 12 show cross-sectional views of the display device.

In FIG. 10 and FIG. 11, as illustrated in FIG. 2A, a structure where a protective film is not formed outside the substrates 100 and 300 by using masking can be employed. For example, in FIG. 10, the formation of the protective film on a rear surface of the substrate 100 and a top surface side of the substrate 100 in the vicinity of the FPC 42 can be inhibited. In FIG. 11, the formation of the protective film on both surface sides of a rear surface of the substrate 100 and a top surface of the substrate 300 can be inhibited. In these cases, the protective film may be deposited around the edge portions of the substrates 100 and 300 as in a region 13. Alternatively, as illustrated in FIG. 12, the region 14 where a protective film is not formed on the rear surface side of the substrate 100 can be provided by the method shown in FIGS. 4A to 4D.

<<Combination of Display Device and Touch Sensor>>

Figure 13:
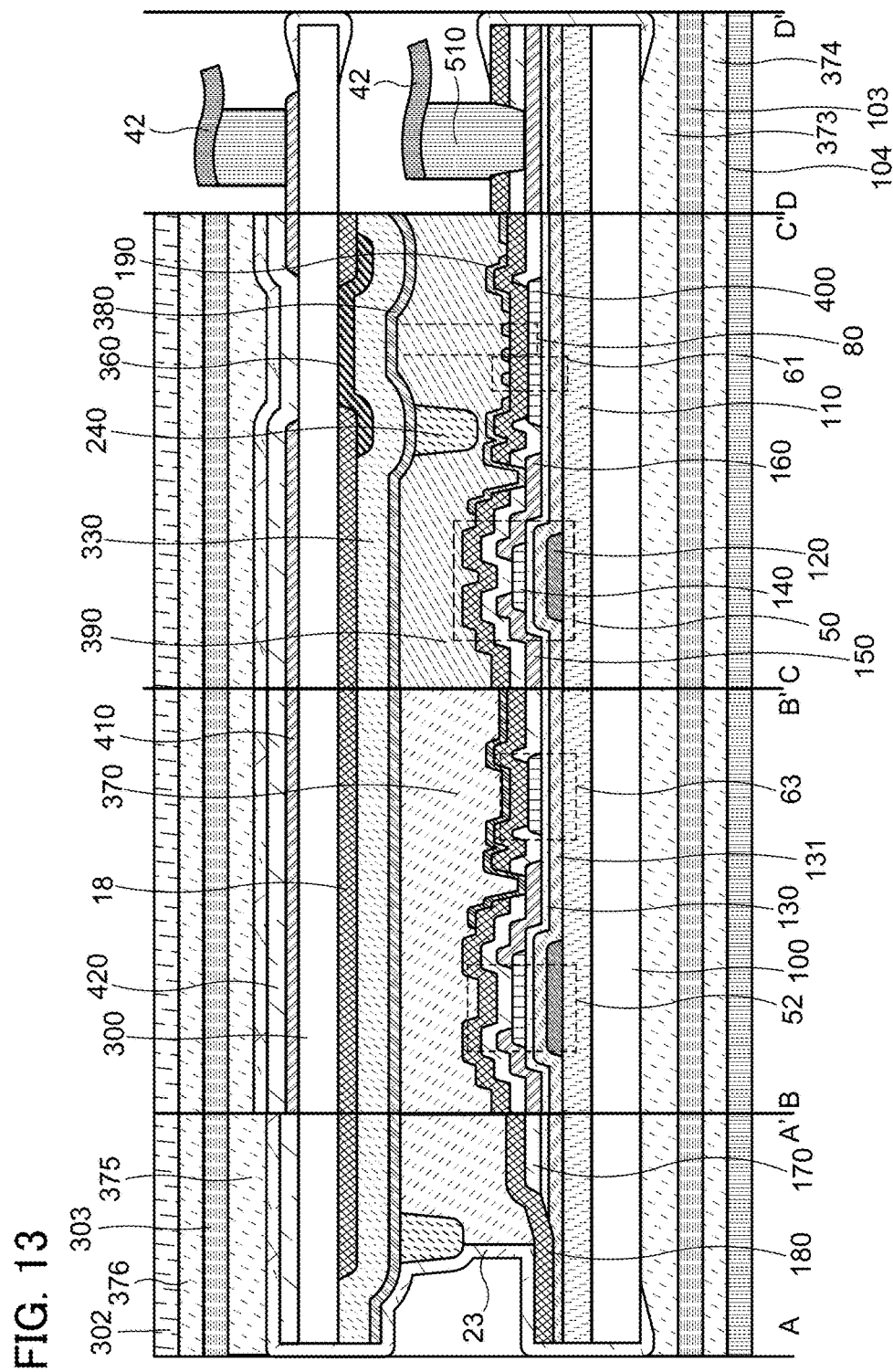
FIG. 13 is a cross-sectional view illustrating a display device of one embodiment of the present invention.
Figure 14:
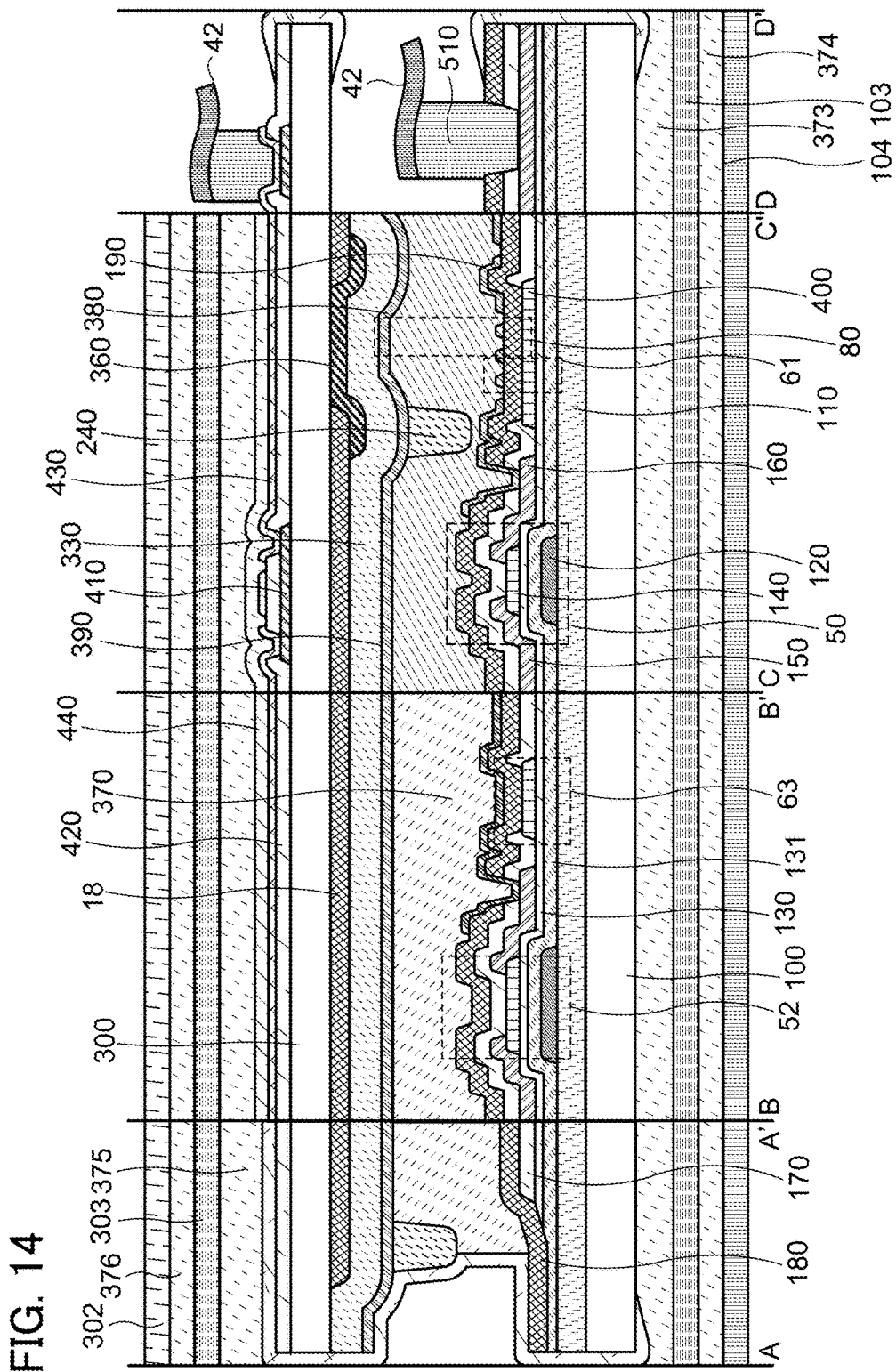
FIG. 14 is a cross-sectional view illustrating a display device of one embodiment of the present invention.
Figure 15:
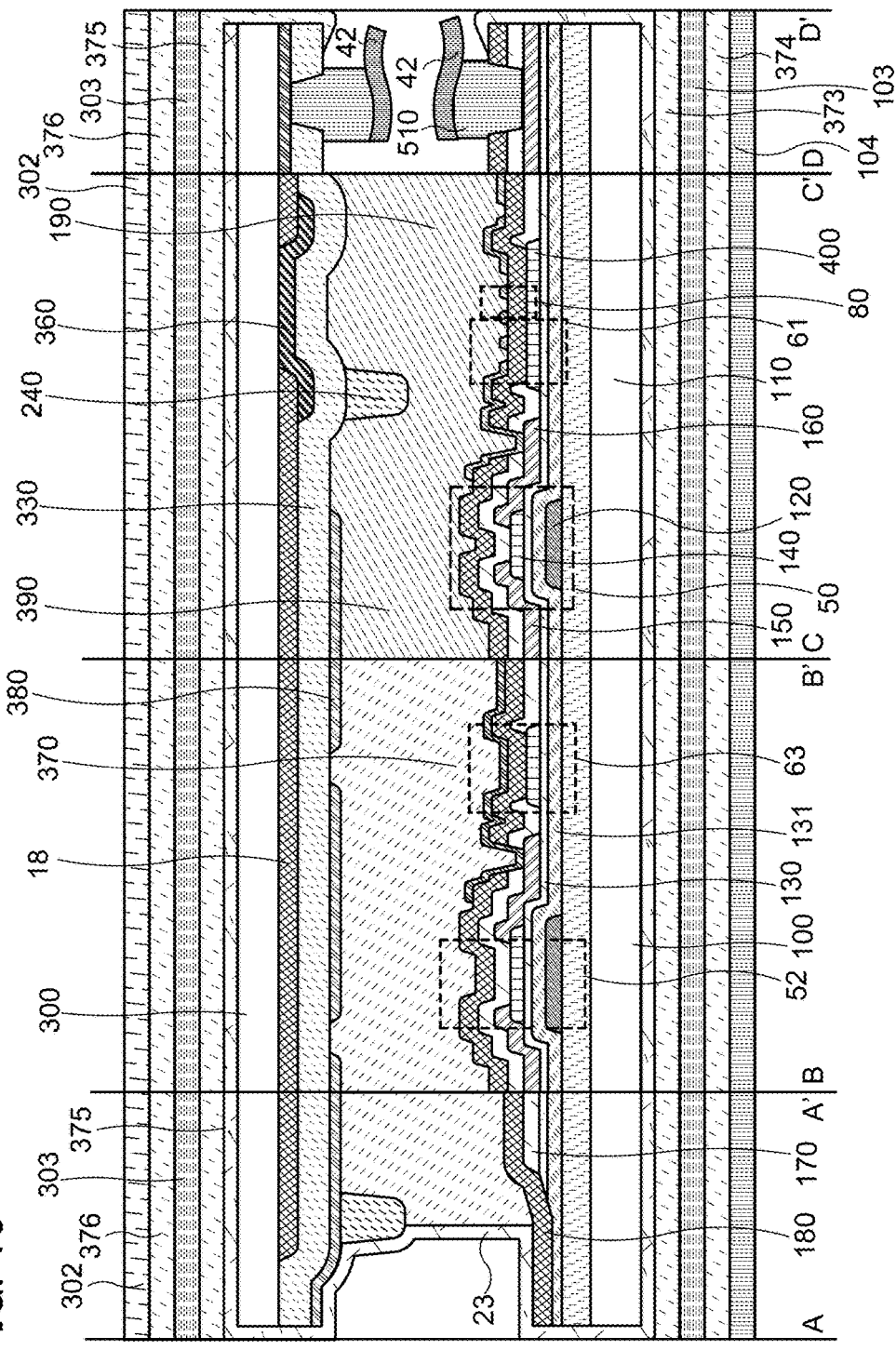
FIG. 15 is a cross-sectional view illustrating a display device of one embodiment of the present invention.

The display device is combined with a touch sensor, whereby a touch panel can be formed. FIG. 13, FIG. 14, and FIG. 15 are each a cross-sectional view of a touch panel. Electrodes (wirings) for the touch sensor can be formed using a conductive layer 410, a conductive layer 430, an insulating layer 420, and an insulating layer 440. Alternatively, for the wiring for the touch sensor, the conductive layers 190 and 380 used in the display panel can be used, and a touch sensor can be formed by combining the conductive layers 190 and 380. The electrode for the touch sensor may be formed on the side of the substrate 300 viewed by a viewer (the surface side) or may be formed inside (on the display element side).

<<Structure Example of Sensor Electrode and the Like>>

More specific structure examples of an input device 90, which functions as a touch sensor, are described below with reference to drawings.

Figure 16A:
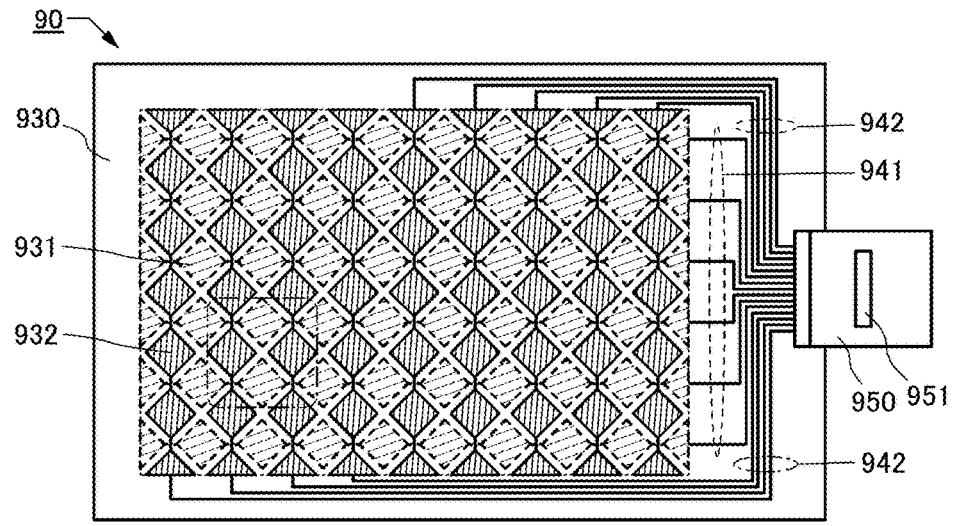
FIGS. 16A to 16D are top views illustrating an input device of one embodiment of the present invention.

FIG. 16A is a schematic top view of the input device 90. The input device 90 includes a plurality of electrodes 931, a plurality of electrodes 932, a plurality of wirings 941, and a plurality of wirings 942 over a substrate 930. The substrate 930 is provided with an FPC 950 which is electrically connected to each of the plurality of wirings 941 and the plurality of wirings 942. FIG. 16A illustrates an example in which the FPC 950 is provided with an IC 951.

Figure 16B:
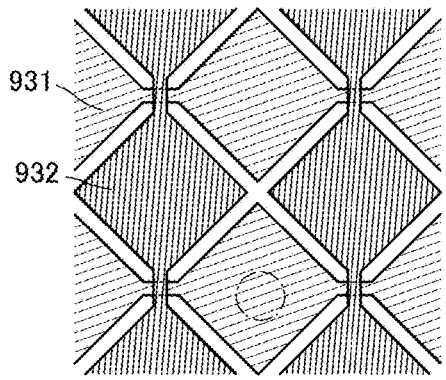

FIG. 16B shows an enlarged view of a region surrounded by a dashed dotted line in FIG. 16A. The electrodes 931 are each in the form of a series of rhombic electrode patterns aligned in a lateral direction of this figure. The rhombic electrode patterns aligned in a line are electrically connected to each other. The electrodes 932 are also each in the form of a series of rhombic electrode patterns aligned in a longitudinal direction of this figure and the rhombic electrode patterns aligned in a line are electrically connected. Part of the electrode 931 and part of the electrode 932 overlap and intersect with each other. At this intersection portion, an insulator is sandwiched in order to avoid an electrical short-circuit between the electrode 931 and the electrode 932.

Figure 16C:
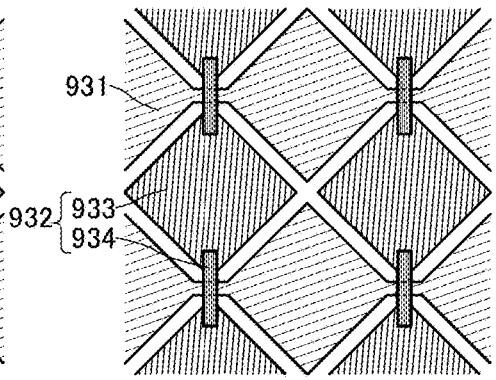

As shown in FIG. 16C, the electrodes 932 may form a plurality of island-shape rhombic electrodes 933 and bridge electrodes 934. The electrodes 933 are aligned in a longitudinal direction of this figure, and two adjacent electrodes 933 are electrically connected to each other by the bridge electrode 934. Such a structure makes it possible that the electrodes 933 and the electrodes 931 can be formed at the same time by processing the same conductive film. This can prevent variations in the thickness of these films, and can prevent the resistance value and the light transmittance of each electrode from varying from place to place. Note that although the electrodes 932 include the bridge electrodes 934 here, the electrodes 931 may have such a structure.

Figure 16D:
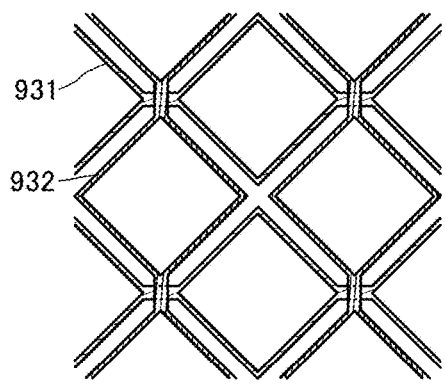
Figure 17A:
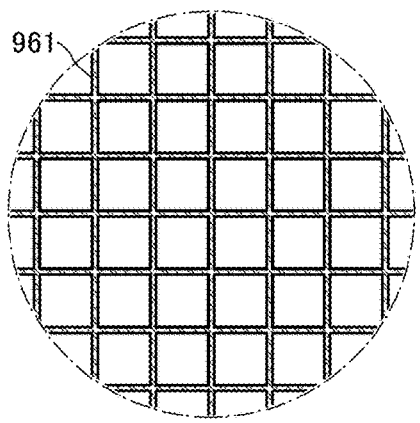
FIGS. 17A to 17D are top views illustrating an input device of one embodiment of the present invention.
Figure 17B:
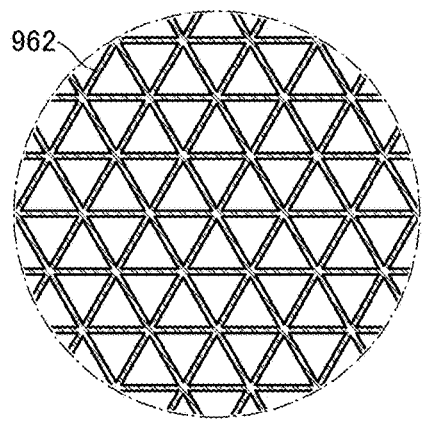
Figure 17C:
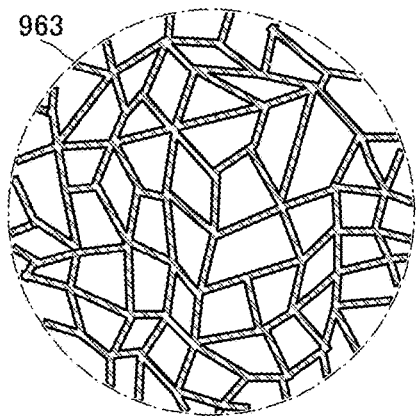
Figure 17D:
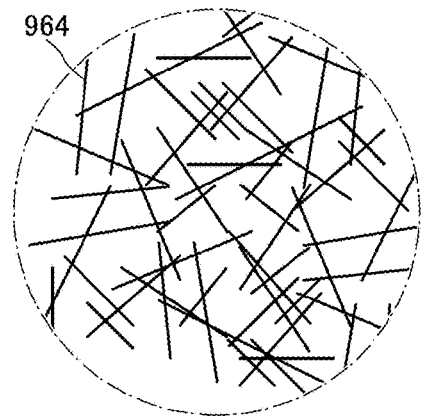

As shown in FIG. 16D, a design in which rhombic electrode patterns of the electrodes 931 and 932 shown in FIG. 16B are hollowed out and only edge portions are left may be used. At that time, when the electrodes 931 and the electrodes 932 are too small in width for the users to view, the electrodes 931 and the electrodes 932 can be formed using a light-blocking material such as a metal or an alloy, as described later. In addition, either the electrodes 931 or the electrodes 932 shown in FIG. 16D may include the above bridge electrodes 934.

One of the electrodes 931 is electrically connected to one of the wirings 941. One of the electrodes 932 is electrically connected to one of the wirings 942. Here, one of the electrodes 931 and 932 corresponds to the row wiring, and the other corresponds to the column wiring.

As examples, enlarged schematic views of part of the electrodes 931 or the electrodes 932 are shown in FIGS. 17A to 17D. The electrodes can have various shapes.

Figure 18A:
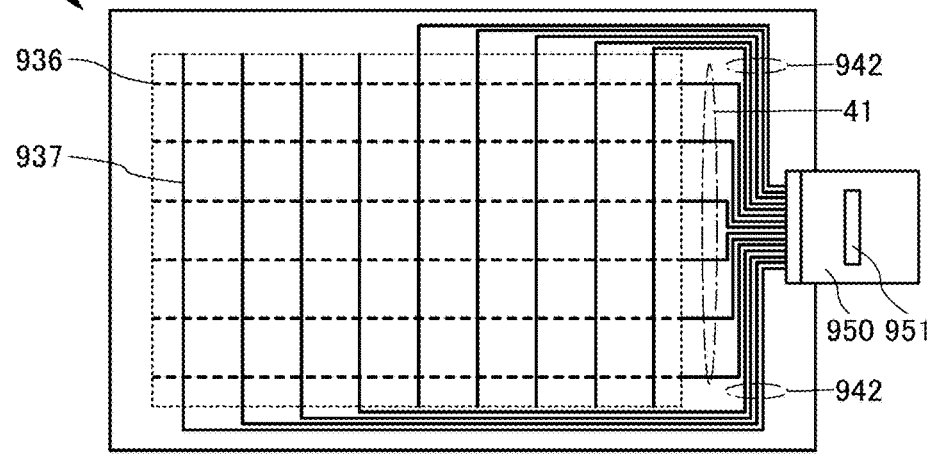
FIGS. 18A to 18C are top views illustrating an input device of one embodiment of the present invention.
Figure 18B:
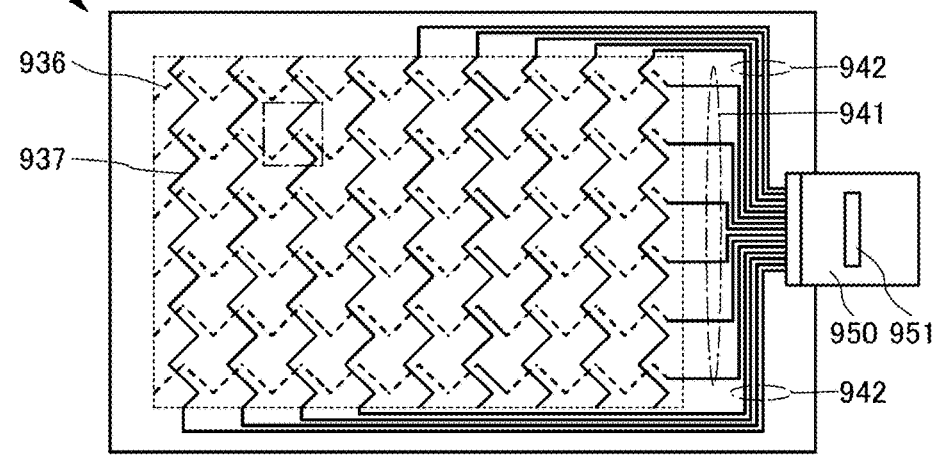
Figure 18C:
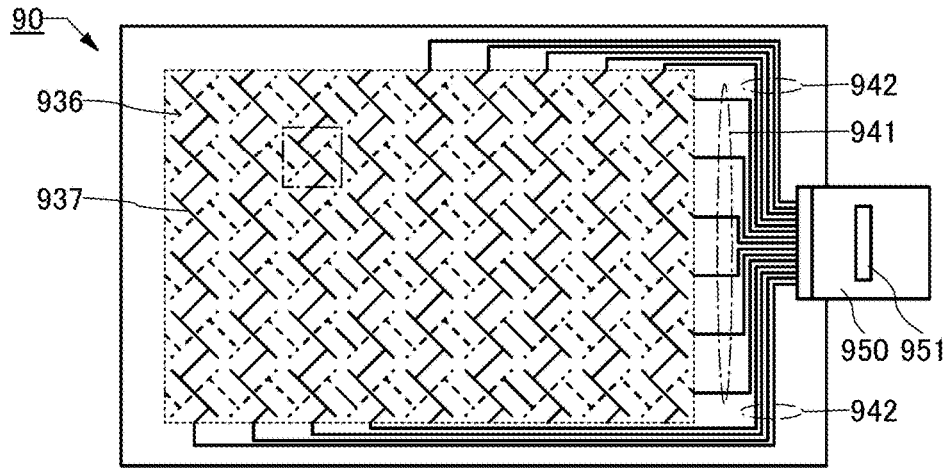

FIGS. 18A to 18C illustrate examples of the case where electrodes 936 and electrodes 937, which have a top surface shape of thin lines, are used instead of the electrodes 931 and the electrodes 932. FIG. 18A shows an example in which linear electrodes 936 and 937 are arranged so as to form a lattice shape. In FIGS. 18B and 18C, the electrodes 936 and 937 having a zigzag shape are arranged.

Figure 19A:
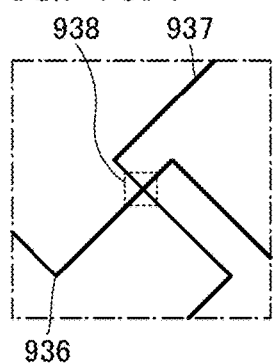
FIGS. 19A to 19F are top views illustrating an input device of one embodiment of the present invention.
Figure 19B:
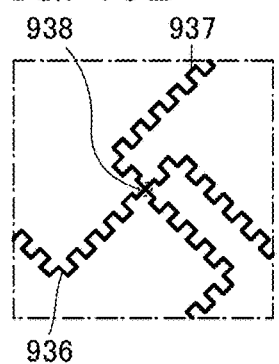
Figure 19C:
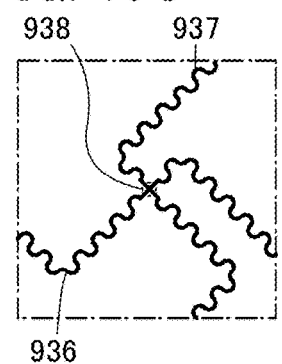
Figure 19D:
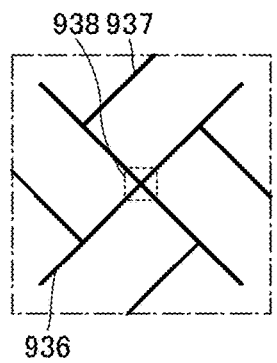
Figure 19E:
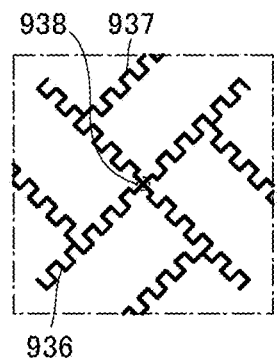
Figure 19F:
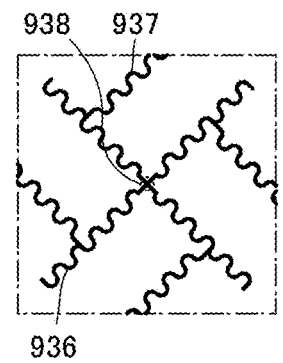

FIGS. 19A to 19C show enlarged views of a region surrounded by a dashed dotted line in FIG. 18B, and FIGS. 19D to 19F show enlarged views of a region surrounded by a dashed dotted line in FIG. 18C. In these drawings, the electrodes 936, the electrodes 937, and intersection portions 938 at which the electrodes 936 and the electrodes 937 intersect are illustrated. The straight-line portions of the electrodes 936 and the electrodes 937 shown in FIGS. 19A and 19D may have a serpentine shape that meanders with angled corners as shown in FIGS. 19B and 19E or may have a serpentine shape that continuously meanders as shown in FIGS. 19C and 19F.

<<Structure Example of in-Cell Touch Panel>>

A structure example of a touch panel incorporating the touch sensor into a display portion including a plurality of pixels will be described below. Here, an example where a liquid crystal element is used as a display element provided in the pixel is shown.

Figure 20A:
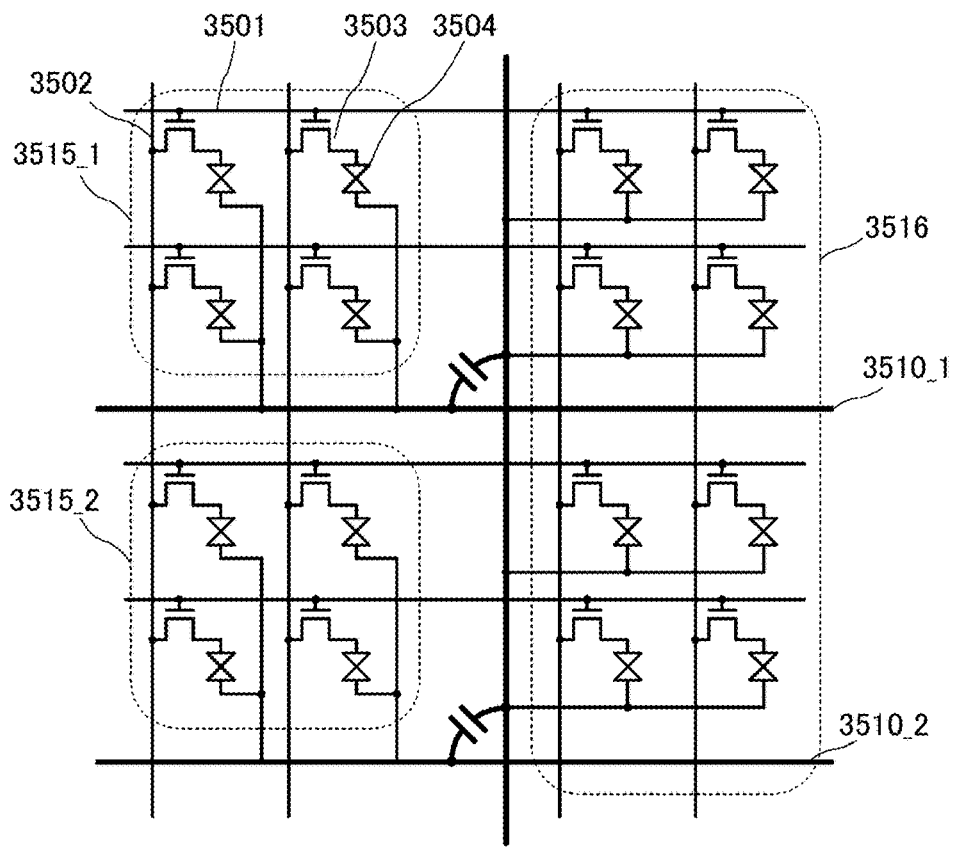
FIGS. 20A and 20B are circuit diagrams illustrating an input device of one embodiment of the present invention.

FIG. 20A is an equivalent circuit diagram of part of a pixel circuit provided in the display portion of the touch panel exemplified in this structure example.

Each pixel includes at least a transistor 3503 and a liquid crystal element 3504. In addition, a gate of the transistor 3503 is electrically connected to a wiring 3501 and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., a wiring 3511). They are provided to intersect with each other, and capacitance is formed therebetween.

Among the pixels provided in the pixel circuit, electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction. Note that only part of the pixel circuit is illustrated in FIGS. 20A and 20B, and actually, these two kinds of blocks are repeatedly arranged in the X direction and the Y direction.

The wiring 3510_1 (or the wiring 3510_2) extending in the X direction is electrically connected to the island-shaped block 3515_1 (or the block 3515_2). Although not illustrated, the wiring 3510_1 extending in the X direction is electrically connected to a plurality of island-shaped blocks 3515_1 which are provided discontinuously along the X direction with the linear blocks therebetween. Furthermore, the wiring 3511 extending in the Y direction is electrically connected to the linear block 3516.

Figure 20B:
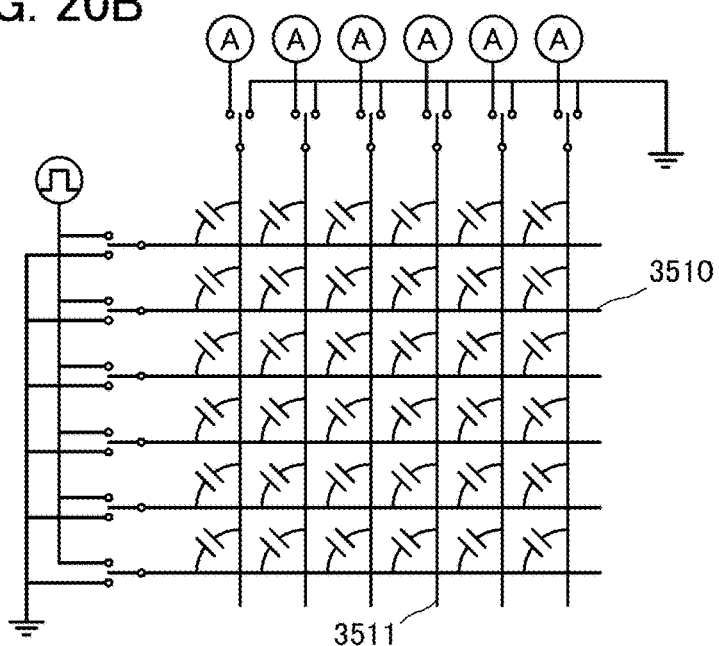

FIG. 20B is an equivalent circuit diagram illustrating the connection between a plurality of wirings 3510 extending in the X direction and the plurality of wirings 3511 extending in the Y direction. Input voltage or a common potential can be input to each of the wirings 3510 extending in the X direction. Furthermore, a ground potential can be input to each of the wirings 3511 extending in the Y direction, or each of the wirings 3511 can be electrically connected to a detection circuit.

Operation of the above-described touch panel will be described below with reference to FIGS. 21A and 21B.

Here, one frame period is divided into a writing period and a sensing period. The writing period is a period in which image data is written to a pixel, and the wirings 3510 (also referred to as gate lines) are sequentially selected. On the other hand, the sensing period is a period in which sensing is performed by a touch sensor, and the wirings 3510 extending in the X direction are sequentially selected and input voltage is input.

Figure 21A:
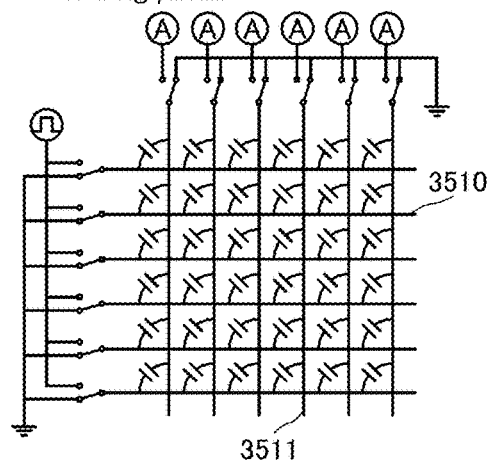
FIGS. 21A and 21B are circuit diagrams illustrating an input device of one embodiment of the present invention.

FIG. 21A is an equivalent circuit diagram in the writing period. In the wiring period, a common potential is input to both the wiring 3510 extending in the X direction and the wiring 3511 extending in the Y direction.

Figure 21B:
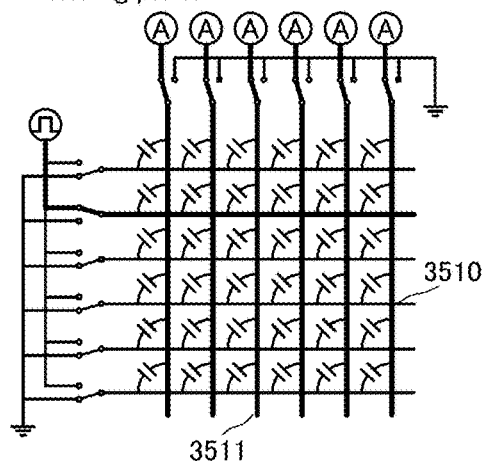

FIG. 21B is an equivalent circuit diagram at some point in time in the sensing period. In the sensing period, each of the wirings 3511 extending in the Y direction is electrically connected to the detection circuit. Input voltage is input to the wirings 3510 extending in the X direction which are selected, and a common potential is input to the wirings 3510 extending in the X direction which are not selected.

Note that the driving method described here can be applied to not only an in-cell touch panel but also the above-described touch panels, and can be used in combination with the method described in the driving method example.

It is preferable that a period in which an image is written and a period in which sensing is performed by a touch sensor be separately provided as described above. Thus, a decrease in sensitivity of the touch sensor caused by noise generated when data is written to a pixel can be suppressed.

<<Conductive Layer 410, 430>>

The conductive layer 410 is formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Further, one or more metal elements selected from manganese and zirconium may be used. The conductive layer 410 may have a single-layer structure or a layered structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used. Alternatively, as a material of the conductive films such as the conductive layer 410, that is, wirings and electrodes forming the touch panel, a transparent conductive film containing indium oxide, tin oxide, zinc oxide, or the like (e.g., ITO) can be given. Moreover, for example, a low-resistance material is preferably used as the material of the wiring and the electrode in the touch panel. For example, silver, copper, aluminum, a carbon nanotube, graphene, or a metal halide (such as a silver halide) may be used. Alternatively, a metal nanowire including a plurality of conductors with an extremely small width (e.g., a diameter of several nanometers) may be used. Further alternatively, a net-like metal mesh with a conductor may be used. Examples of such materials include an Ag nanowire, a Cu nanowire, an Al nanowire, an Ag mesh, a Cu mesh, and an Al mesh. For example, in the case of using an Ag nanowire for the wiring and the electrode in the touch panel, a visible light transmittance of 89% or more and a sheet resistance of 40 Ω/sq. or more and 100 Ω/sq. or less can be achieved. A metal nanowire, a metal mesh, a carbon nanotube, graphene, and the like, which are examples of a material that can be used for the above-described wiring and electrode in the touch panel, have a high visible light transmittance; therefore, they may be used for an electrode of a display element (e.g., a pixel electrode or a common electrode). The conductive layer 430 can be formed using a film similar to that used to form the conductive layer 410.

<<Insulating Layer 420 and Insulating Layer 440>>

An inorganic material or an organic material can be used for the insulating layer 420. For example, an oxide insulating film of silicon oxide, silicon oxynitride, aluminum oxide, aluminum oxynitride, gallium oxide, gallium oxynitride, yttrium oxide, yttrium oxynitride, hafnium oxide, hafnium oxynitride, or the like; a nitride insulating film of silicon nitride, aluminum nitride, or the like; or a heat-resistant organic material such as a polyimide resin, an acrylic resin, a polyimide amide resin, a benzocyclobutene resin, a polyamide resin, or an epoxy resin can be used. The insulating layer 440 can be formed using a film similar to that used for the insulating layer 420.

<<Organic EL Panel>>

Furthermore, the display device 10 where a light-emitting element 70 is used as a display element can be fabricated.

Figure 22:
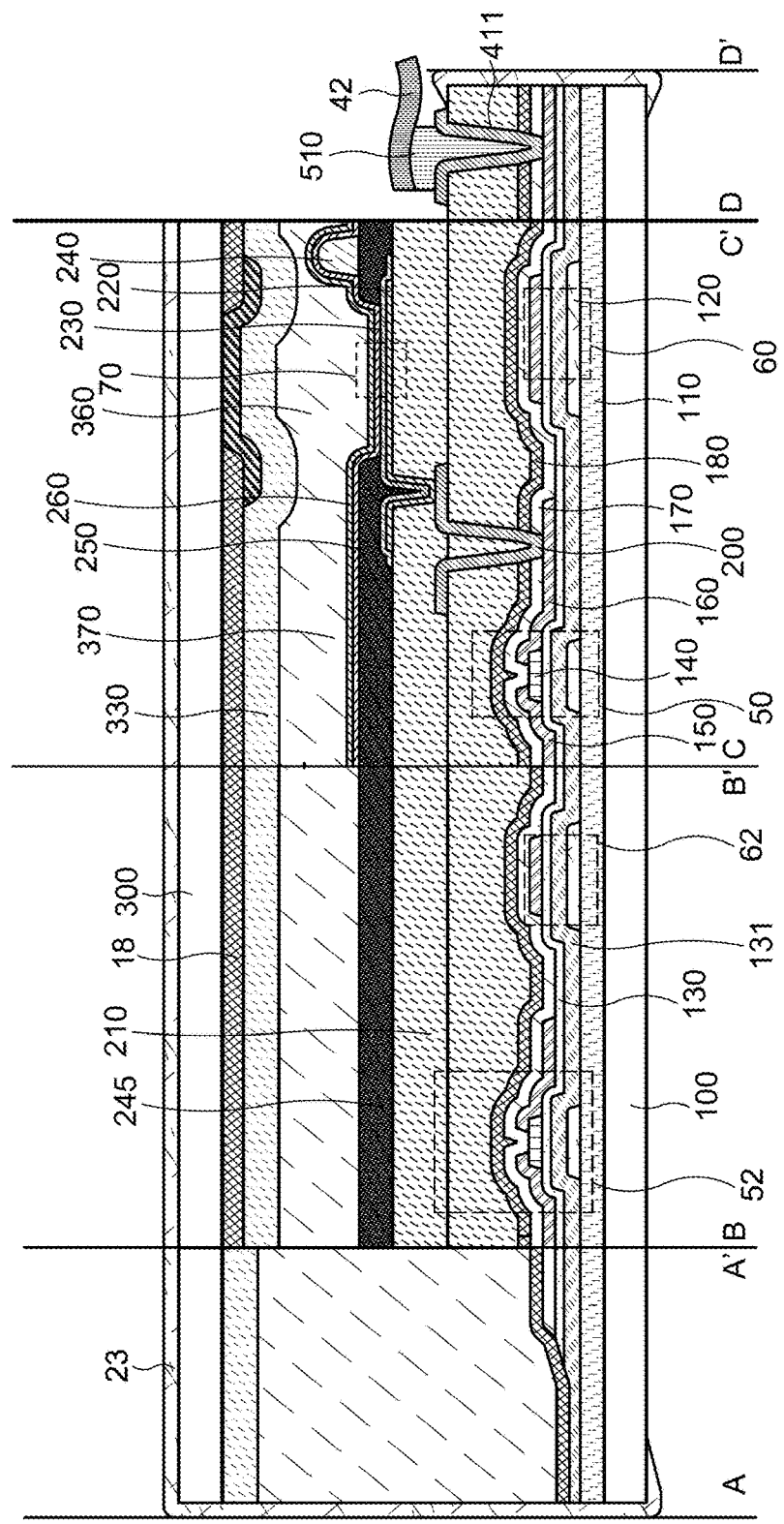
FIG. 22 is a cross-sectional view illustrating a display device of one embodiment of the present invention.
Figure 23:
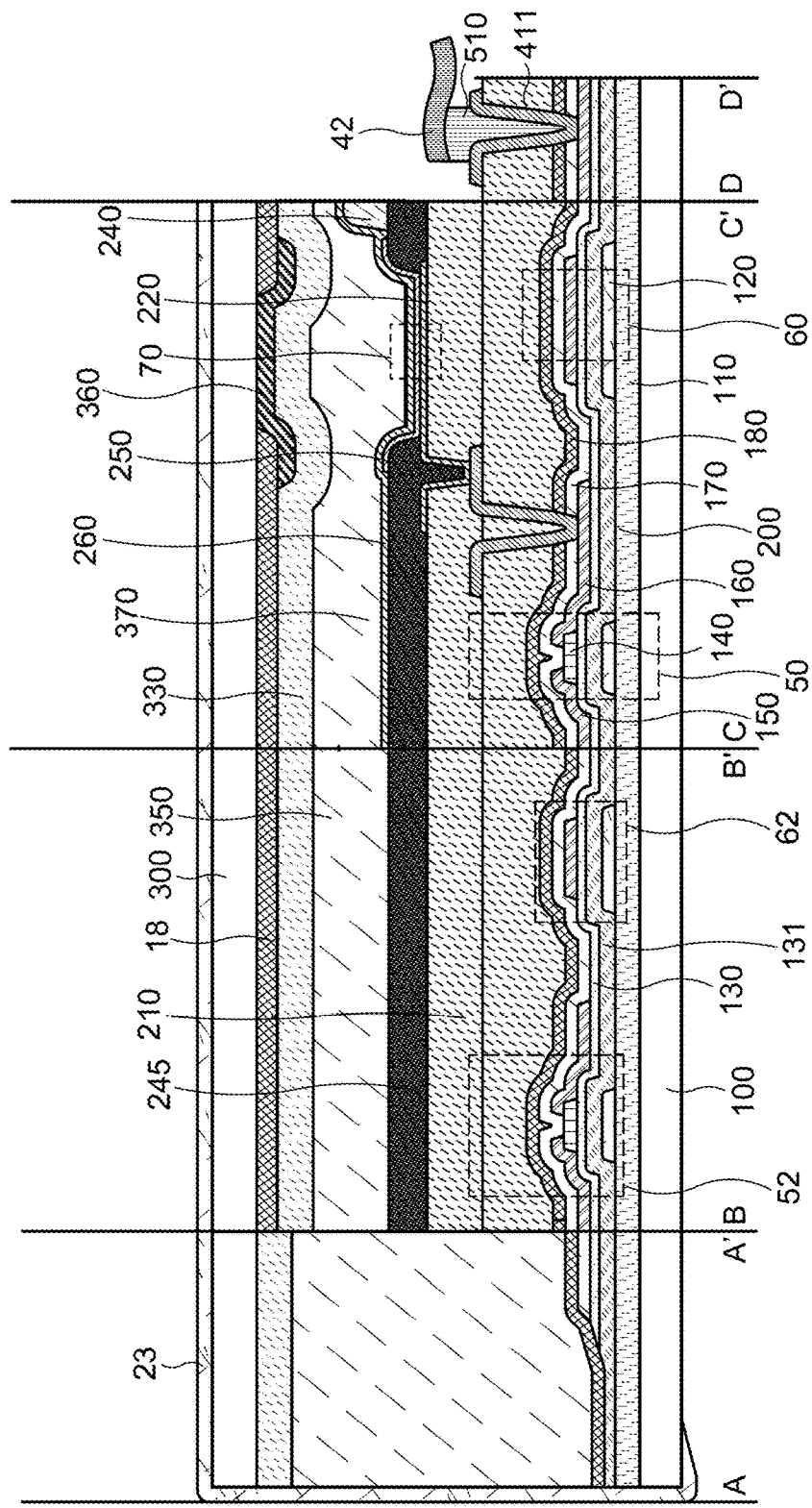
FIG. 23 is a cross-sectional view illustrating a display device of one embodiment of the present invention.
Figure 24:
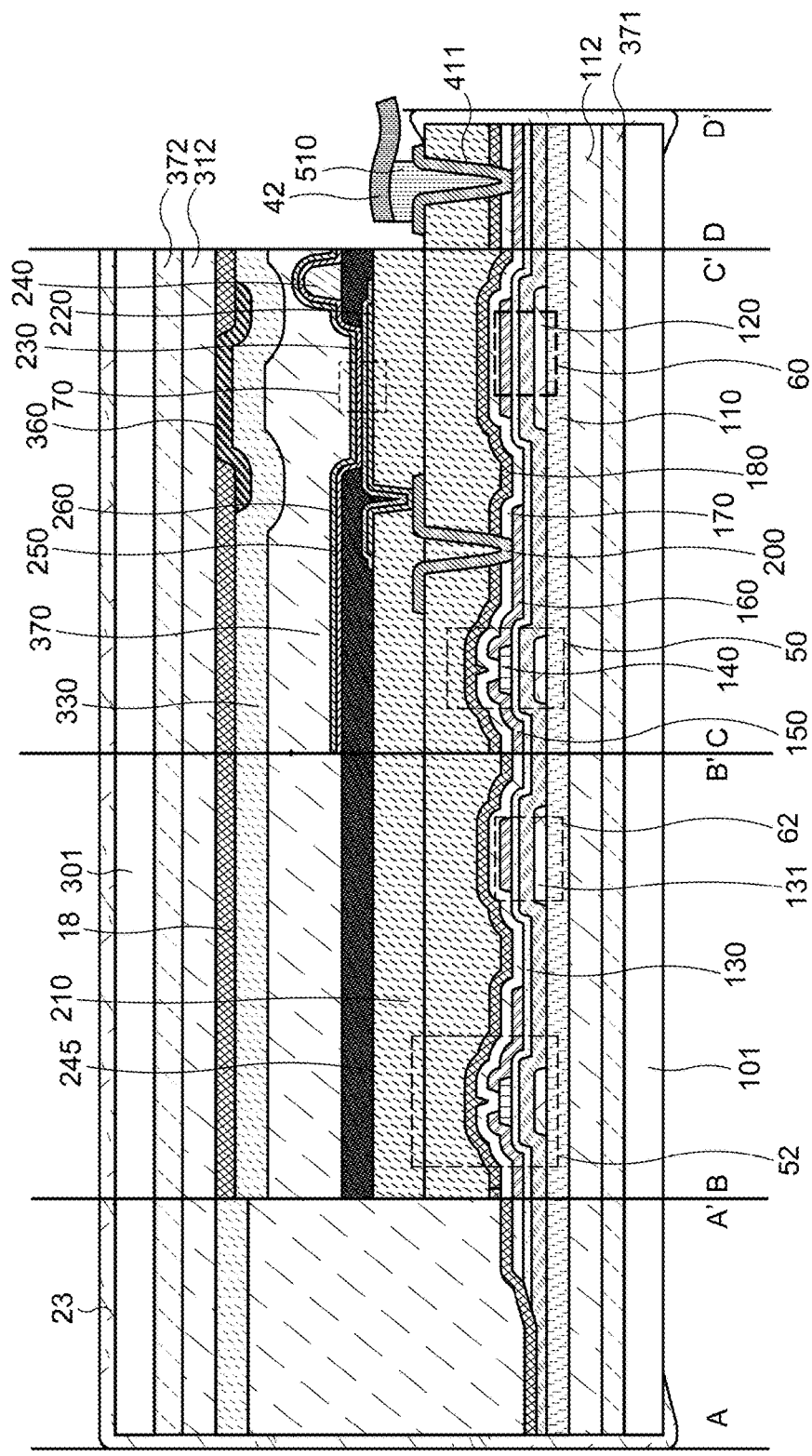
FIG. 24 is a cross-sectional view illustrating a display device of one embodiment of the present invention.

FIG. 22, FIG. 23, and FIG. 24 are each a cross-sectional view of a display device using a light-emitting element. A portion that is also included in a liquid crystal panel, such as a transistor, can be formed in a manner similar to that of the liquid crystal panel.

<<Light-Emitting Element 70>>

As the light-emitting element 70, a self-luminous element can be used, and an element whose luminance is controlled by current or voltage is included in the category of the light-emitting element. For example, a light-emitting diode (LED), an organic EL element, an inorganic EL element, or the like can be used. For example, an organic element which includes a lower electrode, an upper electrode, and a layer (also referred to as an EL layer 250) containing a light-emitting organic compound between the lower electrode and the upper electrode can be used as the light-emitting element 70.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

When a voltage higher than the threshold voltage of the light-emitting element is applied between a lower electrode including a conductive layer 220 and an upper electrode including a conductive layer 260, holes are injected to the EL layer 250 from the anode side and electrons are injected to the EL layer 250 from the cathode side. The injected electrons and holes are recombined in the EL layer 250 and a light-emitting substance contained in the EL layer 250 emits light.

The EL layer 250 includes at least a light-emitting layer. In addition to the light-emitting layer, the EL layer 250 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer 250, and an inorganic compound may be used. Each of the layers included in the EL layer 250 can be formed by any of the following methods: an evaporation method (including a vacuum evaporation method), a transfer method, a printing method, an inkjet method, a coating method, and the like.

The light-emitting element may contain two or more kinds of light-emitting substances. Thus, for example, a light-emitting element that emits white light can be achieved. For example, light-emitting substances are selected so that two or more light-emitting substances emit complementary colors to obtain white light emission. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 70 preferably has two or more peaks in the wavelength range in a visible region (e.g., greater than or equal to 350 nm and less than or equal to 750 nm or greater than or equal to 400 nm and less than or equal to 800 nm).

The EL layer 250 may include a plurality of light-emitting layers. In the EL layer 250, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer contains a host material, an assist material, and the phosphorescent material (a guest material), the separation layer may contain the host material and the assist material. In other words, the separation layer includes a region not containing the phosphorescent material and the phosphorescent layer includes a region containing the phosphorescent material in the above structure. Accordingly, the separation layer and the phosphorescent layer can be evaporated separately depending on whether a phosphorescent material is used or not. With such a structure, the separation layer and the phosphorescent layer can be formed in the same chamber. Thus, the manufacturing cost can be reduced.

<<Microcavity>>

The light-emitting element 70 in FIG. 22 is an example of a light-emitting element having a microcavity structure. For example, the microcavity structure may be formed using the lower electrode and the upper electrode of the light-emitting element 70 so that light with a specific wavelength can be extracted from the light-emitting element efficiently.

Specifically, a reflective film which reflects visible light is used as the lower electrode, and a semi-transmissive and semi-reflective film which transmits part of visible light and reflects part of visible light is used as the upper electrode. The upper electrode and the lower electrode are arranged so that light with a specific wavelength can be extracted efficiently.

The lower electrode functions as, for example, a lower electrode or an anode of the light-emitting element. The lower electrode has a function of adjusting the optical path length so that desired light emitted from light-emitting layers resonates and its wavelength can be amplified. A layer 230 that adjusts the optical path length is not necessarily provided in the lower electrode. At least one layer included in the light-emitting element can be used to adjust the optical path length. The layer 230 that adjusts the optical path length can be formed using, for example, indium oxide, indium tin oxide (ITO), indium zinc oxide, zinc oxide (ZnO), or zinc oxide to which gallium is added.

In the case of using the microcavity structure, a semi-transmissive and semi-reflective electrode can be used as the upper electrode of the light-emitting element. The semi-transmissive semi-reflective electrode is formed using a reflective conductive material and a light-transmitting conductive material. As the conductive materials, a conductive material having a visible light reflectivity of higher than or equal to 20% and lower than or equal to 80%, preferably higher than or equal to 40% and lower than or equal to 70%, and a resistivity of lower than or equal to $1 \times 10^{-2}$ $\Omega \cdot$cm can be used. The semi-transmissive semi-reflective electrode can be formed using one or more kinds of conductive metals, conductive alloys, conductive compounds, and the like. In particular, a material with a small work function (3.8 eV or less) is preferable. For example, aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Ag—Mg or Al—Li), a rare earth metal such as europium or ytterbium, and an alloy containing any of these rare earth metals.

The electrodes can each be formed by an evaporation method or a sputtering method. Alternatively, a discharging method such as an ink-jet method, a printing method such as a screen printing method, or a plating method may be used.

Note that an organic EL can employ a structure other than a microcavity structure. For example, a separate coloring method by which different colors are emitted from light-emitting elements, or a white EL method in which a material emitting white light is used can be employed.

<<Conductive Layer 200>>

The conductive layer 200 is formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Further, one or more metal elements selected from manganese and zirconium may be used. The conductive layer 200 may have a single-layer structure or a layered structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used.

<<Conductive Layer 220>>

For the conductive layer 220 that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium can be used for the conductive film. An alloy of silver and copper is preferable because of its high heat resistance. A metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of property of transmitting visible light and a film containing any of the above metal materials may be stacked. For example, a stacked film of silver and ITO or a stacked film of an alloy of silver and magnesium and ITO can be used.

<<Conductive Layer 260>>

The conductive layer 260 that transmits visible light can be formed using, for example, indium oxide, indium tin oxide (ITO), indium zinc oxide, zinc oxide (ZnO), or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. A stack of any of the above materials can be used as the conductive layer. For example, a stacked film of ITO and an alloy of silver and magnesium is preferably used, in which case conductivity can be increased. Further alternatively, graphene or the like may be used.

<<Organic EL Panel Using Separate Coloring Method>>

An organic EL element can be formed using a separate coloring method as illustrated in FIG. 23. FIG. 23 is different from FIG. 22 in that a separate coloring method is used for the EL layer 250 over the conductive layer 220.

<<Flexible Display Device>>

The display device may be formed over a flexible substrate 101 or a flexible substrate 301 as illustrated in FIG. 24. The flexible substrate and the display device can be bonded to each other with the adhesive layer 370. In this manner, a flexible touch panel that can be folded or a touch panel having a curved surface can be fabricated. Moreover, the thickness of the substrate can be small, leading to a reduction in weight of the touch panel.

<<Manufacturing Method Example of Flexible Display Device>>

Here, a method for manufacturing a flexible display device will be described.

For convenience, a structure including a pixel and a circuit, a structure including an optical member such as a color filter, or a structure including a touch sensor is referred to as an element layer. An element layer includes a display element, for example, and may include a wiring electrically connected to the display element or an element such as a transistor used in a pixel or a circuit in addition to the display element.

Here, a support body (e.g., the substrate 101 or the substrate 301) with an insulating surface where an element layer is formed is referred to as a base material.

As a method for forming an element layer over a flexible base material provided with an insulating surface, there are a method in which an element layer is formed directly over the base material, and a method in which an element layer is formed over a supporting base material that is different from the base material and has stiffness and then the element layer is separated from the supporting base material and transferred to the base material.

In the case where a material of the base material can withstand heating temperature in a process for forming the element layer, it is preferable that the element layer be formed directly over the base material, in which case a manufacturing process can be simplified. At this time, the element layer is preferably formed in a state where the base material is fixed to the supporting base material, in which case transfer thereof in an apparatus and between apparatuses can be easy.

In the case of employing the method in which the element layer is formed over the supporting base material and then transferred to the base material, first, a separation layer and an insulating layer are stacked over the supporting base material, and then the element layer is formed over the insulating layer. Next, the element layer is separated from the supporting base material and then transferred to the base material. At this time, a material is selected that would causes separation at an interface between the supporting base material and the separation layer, at an interface between the separation layer and the insulating layer, or in the separation layer.

For example, it is preferable that a stacked layer of a layer including a high-melting-point metal material, such as tungsten, and a layer including an oxide of the metal material be used as the separation layer, and a stacked layer of a plurality of layers, such as a silicon nitride layer and a silicon oxynitride layer be used over the separation layer. The use of the high-melting-point metal material is preferable because the degree of freedom of the process for forming the element layer can be increased.

The separation may be performed by application of mechanical power, by etching of the separation layer, by dripping of a liquid into part of the separation interface to penetrate the entire separation interface, or the like. Alternatively, separation may be performed by heating the separation interface by utilizing a difference in thermal expansion coefficient.

The separation layer is unnecessary in the case where separation can occur at an interface between the supporting base material and the insulating layer. For example, glass is used as the supporting base material and an organic resin such as polyimide is used as the insulating layer, a separation trigger is formed by locally heating part of the organic resin by laser light or the like, and separation is performed at an interface between the glass and the insulating layer. Alternatively, a metal layer may be provided between the supporting base material and the insulating layer formed of an organic resin, and separation may be performed at the interface between the metal layer and the insulating layer by heating the metal layer by feeding a current to the metal layer. In that case, the insulating layer formed of an organic resin can be used as a base material.

Examples of such a base material having flexibility include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, it is preferable to use a material with a low thermal expansion coefficient, and for example, a polyamide imide resin, a polyimide resin, PET, or the like with a thermal expansion coefficient lower than or equal to $30 \times 10^{-6}$/K can be suitably used. A substrate in which a fibrous body is impregnated with a resin (also referred to as prepreg) or a substrate whose thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the base material. Alternatively, a composite material where glass and a resin material are attached to each other may be used.

In the structure shown in FIG. 24, for example, a first separation layer and an insulating layer 112 are formed in this order over a first supporting base material, and then components in a layer over the first separation layer and the insulating layer 112 are formed. Separately, a second separation layer and an insulating layer 312 are formed in this order over a second supporting base material, and then upper components are formed. Next, the first supporting base material is bonded to the second supporting base material with the adhesive layer 370. After that, separation at an interface between the second separation layer and the insulating layer 312 is conducted so that the second supporting base material and the second separation layer are removed, and then the substrate 301 is bonded to the insulating layer 312 using an adhesive layer 372. Furthermore, separation at an interface between the first separation layer and the insulating layer 112 is conducted so that the first supporting base material and the first separation layer are removed, and then the substrate 101 is bonded to the insulating layer 112 using an adhesive layer 371. Note that either side may be subjected to separation and attachment first.

The above is the description of a manufacturing method of a flexible display device.

<<Positional Relationship Between Transistor and Wirings of Touch Sensor>>

Figure 25:
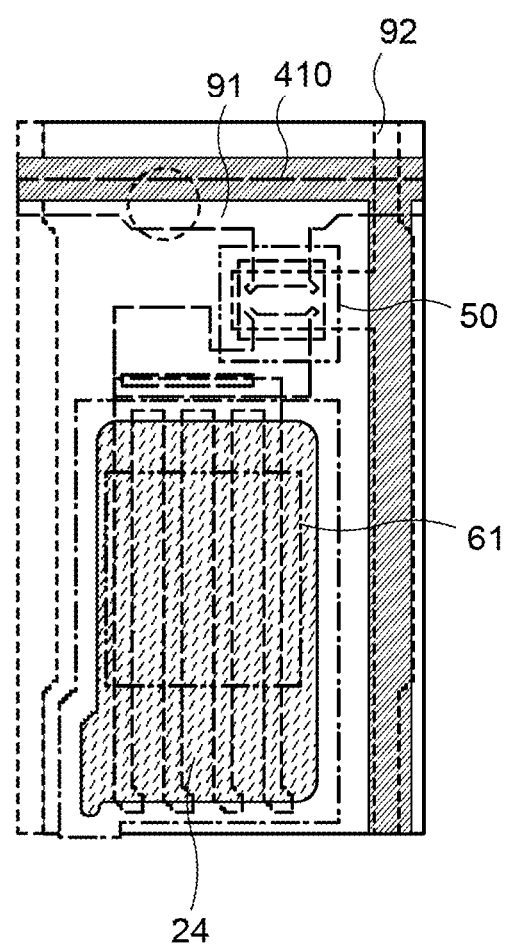
FIG. 25 is a top view illustrating a display device of one embodiment of the present invention.

FIG. 25 is a top view illustrating the positional relationship between the pixel, a transistor, and wirings of the touch sensor. The conductive layer 410, which is an electrode for the touch sensor, can be provided so as to overlap with a source line 91 or a gate line 92, or can be provided not to overlap with and parallel to the source line 91 or the gate line 92, for example. The conductive layer 410, which is a wiring of the touch sensor, may overlap with a transistor 50 and a capacitor 61 unlike in the example. Although the conductive layer 410 is provided not to overlap with the pixel 24, the conductive layer 410 can be provided to overlap with the pixel 24. The conductive layers 430 and 380 which can function as an electrode of the touch sensor can be arranged in a similar manner.

Note that the structures, methods, and the like described in this embodiment can be used as appropriate in combination with any of the structures, methods, and the like described in the other embodiments.

Embodiment 5

Described in this embodiment is a modification example of the structure of the transistor described in Embodiment 4.

<<Stacked Oxide Semiconductor>>

Figure 26A:
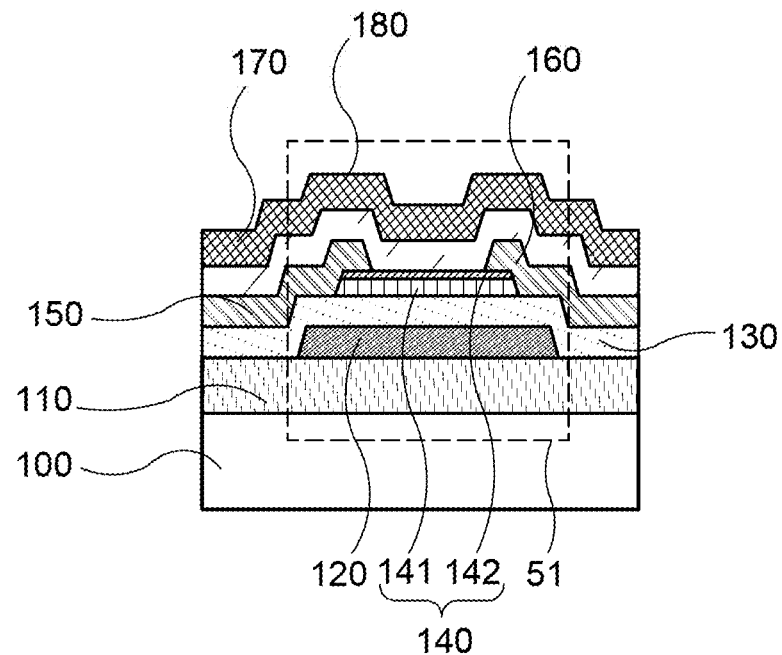
FIGS. 26A and 26B are cross-sectional views each illustrating a transistor of one embodiment of the present invention.
Figure 26B:
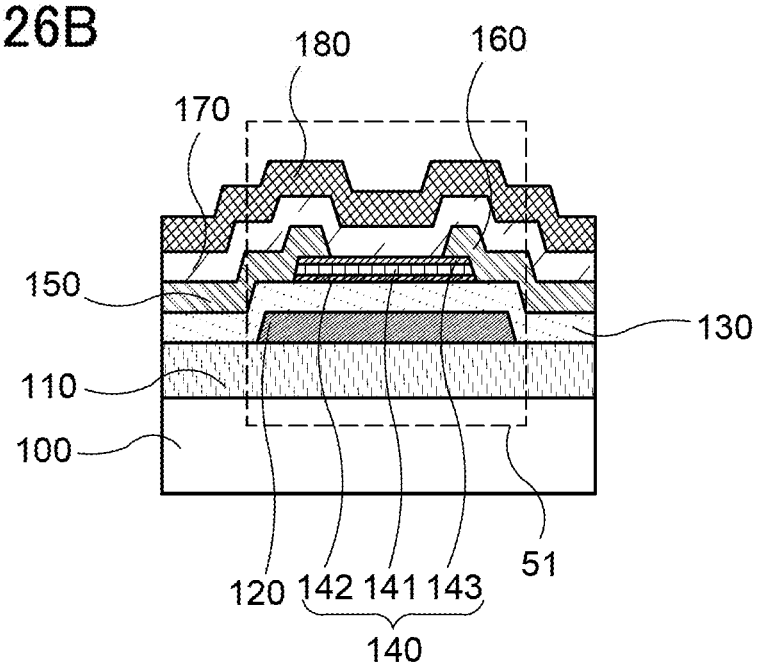

Note that in the semiconductor layer 140, a plurality of oxide semiconductor films that differ in the atomic ratio of metal elements may be stacked. For example, as in a transistor 51 in FIG. 26A, an oxide semiconductor layer 141 and an oxide semiconductor layer 142 may be stacked in this order over the insulating layer 130. Alternatively, as illustrated in FIG. 26B, the oxide semiconductor layer 142, the oxide semiconductor layer 141, and an oxide semiconductor layer 143 may be stacked in this order over the insulating layer 130. The oxide semiconductor layers 142 and 143 differ from the oxide semiconductor layer 141 in the atomic ratio of metal elements.

<<Channel-Protective Transistor and Top-Gate Transistor>>

Figure 27A:
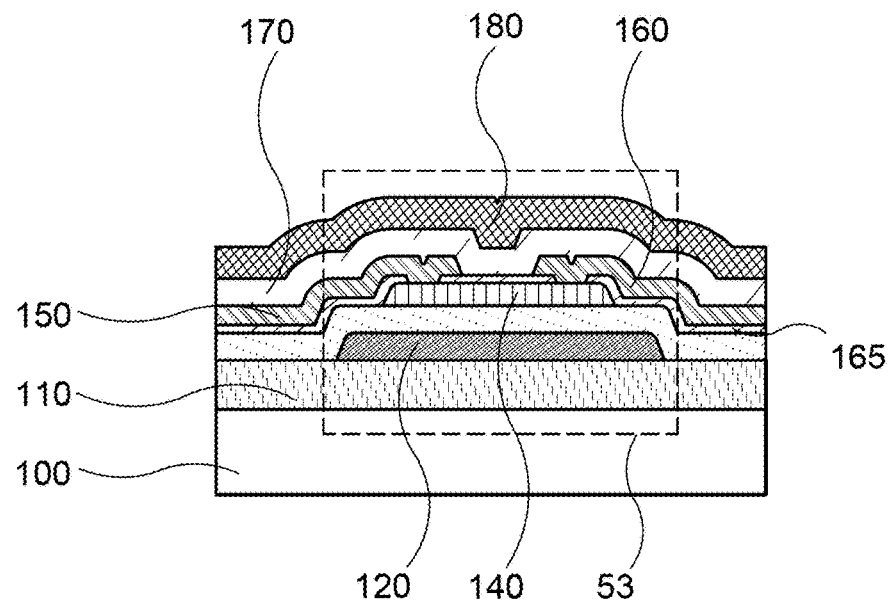
FIGS. 27A and 27B are cross-sectional views each illustrating a transistor of one embodiment of the present invention.
Figure 27B:
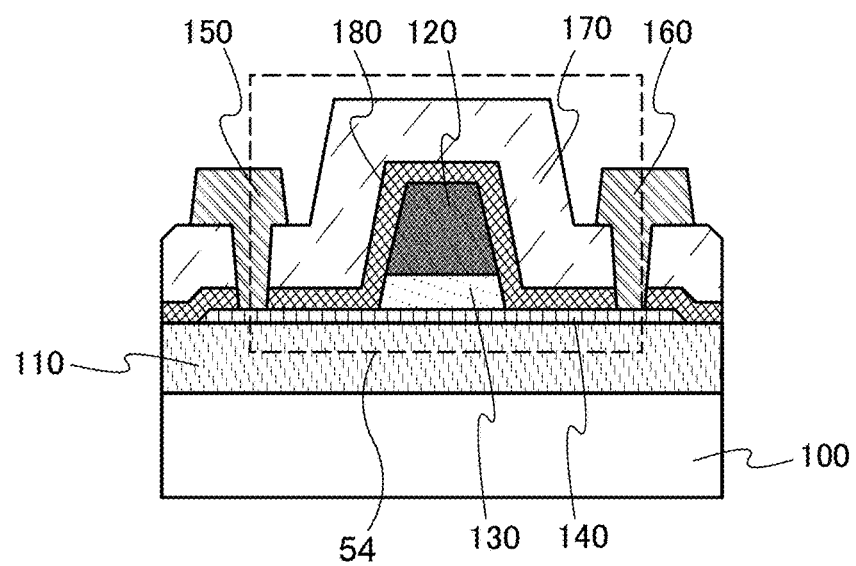

The transistor 50 and the like illustrated in FIG. 8B are, but are not limited to, bottom-gate transistors. FIG. 27A illustrates a transistor 53 and FIG. 27B illustrates a transistor 54 as modification examples of the transistor 50. Although the transistor 50 illustrated in FIG. 8B is a channel-etched transistor, it may be the channel-protective transistor 53 including an insulating layer 165 as illustrated in the cross-sectional view of FIG. 27A or may be the top-gate transistor 54 as illustrated in the cross-sectional view of FIG. 27B.

<<Dual-Gate Transistor>>

A transistor 55, which is a modification example of the transistor 50, will be described with reference to FIGS. 28A to 28C. The transistor illustrated in FIGS. 28A to 28C has a dual-gate structure.

Figure 28A:
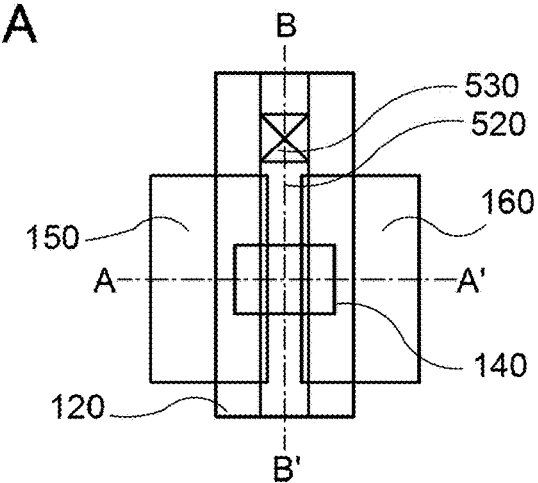
FIGS. 28A to 28C are a top view and cross-sectional views illustrating a transistor of one embodiment of the present invention.
Figure 28B:
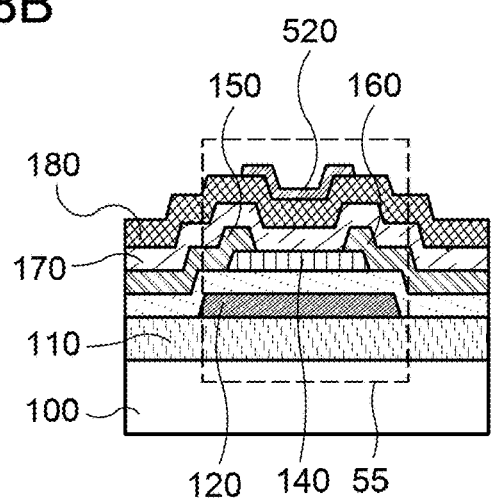
Figure 28C:
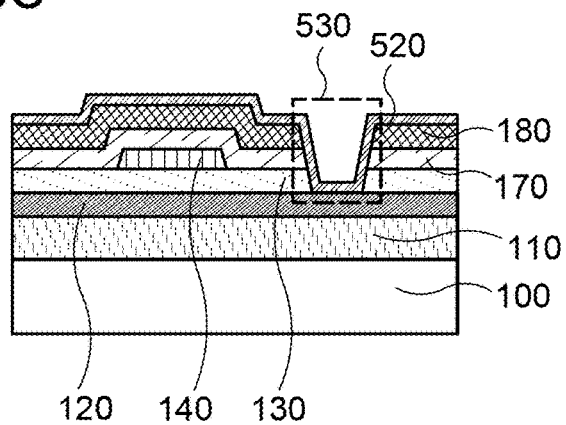

FIGS. 28A to 28C are a top view and cross-sectional views of the transistor 55. FIG. 28A is a top view of the transistor 55, FIG. 28B is a cross-sectional view taken along dashed-dotted line A-A' in FIG. 28A, and FIG. 28C is a cross-sectional view taken along dashed-dotted line B-B' in FIG. 28A. Note that in FIG. 28A, the substrate 100, the insulating layer 110, the insulating layer 130, the insulating layer 170, the insulating layer 180, and the like are not illustrated for the sake of clarity.

The transistor 55 illustrated in FIGS. 28A to 28C includes the conductive layer 120 functioning as a gate electrode over the insulating layer 110, the insulating layer 130 functioning as a gate insulating film over the conductive layer 120, the semiconductor layer 140 overlapping with the conductive layer 120 with the insulating layer 130 provided therebetween, the conductive layers 150 and 160 in contact with the semiconductor layer 140, the insulating layer 170 over the semiconductor layer 140 and the conductive layers 150 and 160, the insulating layer 180 over the insulating layer 170, and a conductive layer 520 functioning as a back gate electrode over the insulating layer 180. The conductive layer 120 is connected to the conductive layer 520 in an opening 530 in the insulating layers 130, 170, and 180.

<<Conductive Layer 520>>

The conductive layer 520 is formed using a conductive film that transmits visible light or a conductive film that reflects visible light. For example, a material including one of indium (In), zinc (Zn), and tin (Sn) can be used for the conductive film that transmits visible light. Typical examples of the conductive film that transmits visible light include conductive oxides such as indium tin oxide, indium oxide containing tungsten oxide, indium zinc oxide containing tungsten oxide, indium oxide containing titanium oxide, indium tin oxide containing titanium oxide, indium zinc oxide, and indium tin oxide containing silicon oxide. For the conductive film that reflects visible light, a material containing aluminum or silver can be used, for example.

Note that when a side surface of the semiconductor layer 140 faces the conductive layer 520 in the channel width direction as shown in FIG. 28C, carriers flow not only at the interface between the insulating layer 170 and the semiconductor layer 140 and at the interface between the insulating layer 130 and the semiconductor layer 140 but also in the semiconductor layer 140. Therefore, the amount of transfer of carriers in the transistor 55 is increased. As a result, the on-state current and field-effect mobility of the transistor 55 are increased. The electric field of the conductive layer 520 affects the side surface or an end portion including the side surface and its vicinity of the semiconductor layer 140; thus, generation of a parasitic channel at the side surface or the end portion of the semiconductor layer 140 can be suppressed.

By providing the transistor illustrated in FIGS. 28A to 28C in a pixel portion, signal delay in wirings can be reduced and display defects such as display unevenness can be suppressed even though the number of wirings is increased in a large-sized display device or a high-resolution display device.

Note that all of transistors 52 included in the peripheral circuit (gate driver and the like) may have the same structure or may have two or more kinds of structures. All of a plurality of transistors 50 included in the pixel portion may have the same structure, or may have two or more kinds of structures.

Although an example of using a transistor including an oxide semiconductor is shown in this embodiment, one embodiment of the present invention is not limited to this example. Depending on the case or circumstances, a transistor including a semiconductor material that is not an oxide semiconductor may be used in one embodiment of the present invention.

For example, a transistor in which a Group 14 element, a compound semiconductor, an oxide semiconductor, or the like is used for the semiconductor layer 140 can be used. Specifically, a semiconductor containing silicon, a semiconductor containing gallium arsenide, an organic semiconductor, or the like can be used.

For example, single crystal silicon, polysilicon, or amorphous silicon can be used for the semiconductor layer of the transistor.

Note that the structures, methods, and the like described in this embodiment can be used as appropriate in combination with any of the structures, methods, and the like described in the other embodiments.

Embodiment 6

In this embodiment, a structure example of the display panel of one embodiment of the present invention will be described with reference to FIGS. 29A to 29C.

Structure Example

Figure 29A:
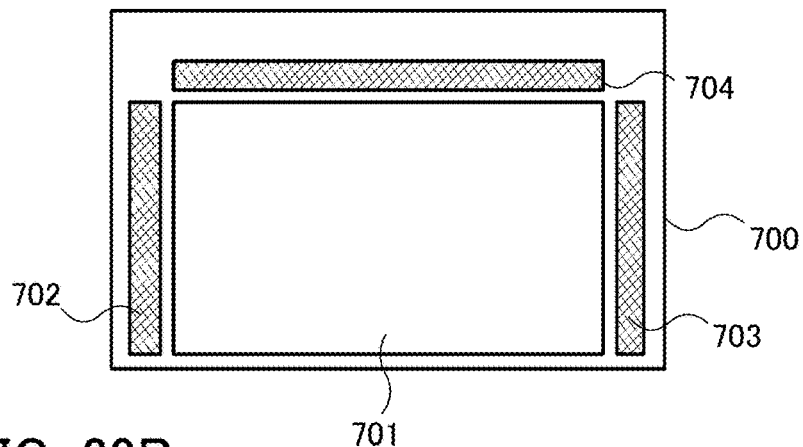
FIGS. 29A to 29C are a top view and circuit diagrams illustrating a display device of one embodiment of the present invention.

FIG. 29A is a top view of the display device of one embodiment of the present invention. FIG. 29B is a circuit diagram illustrating a pixel circuit that can be used in the case where a liquid crystal element is used in a pixel in the display device of one embodiment of the present invention. FIG. 29C is a circuit diagram illustrating a pixel circuit that can be used in the case where an organic EL element is used in a pixel in the display device of one embodiment of the present invention.

The transistor in the pixel portion can be formed in accordance with the above embodiments. The transistor can be easily formed as an n-channel transistor, and thus part of a driver circuit that can be formed using an n-channel transistor is formed over the same substrate as the transistor of the pixel portion. With the use of any of the transistors described in the above embodiments for the pixel portion or the driver circuit in this manner, a highly reliable display device can be provided.

FIG. 29A illustrates an example of a top view of an active matrix display device. A pixel portion 701, a scan line driver circuit 702, a scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the scan line driver circuit 702 and the scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 29A, the scan line driver circuit 702, the scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Display Device]

Figure 29B:
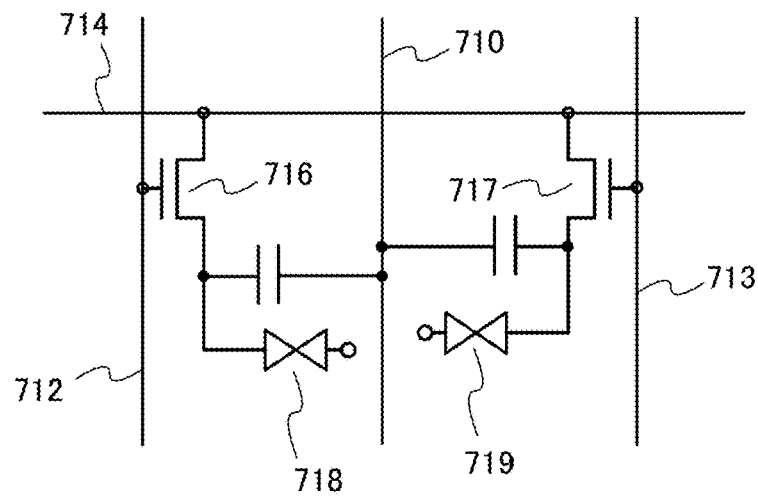

FIG. 29B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in any of the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode and the second pixel electrode are separated. Shapes of the first pixel electrode and the second pixel electrode are not especially limited. For example, the first pixel electrode may have a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Furthermore, storage capacitors may be formed using a capacitor wiring 710, gate insulating films functioning as dielectrics, and capacitor electrodes electrically connected to the first pixel electrode layer and the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 29B. For example, a switch, a resistor, a capacitor, a transistor, a sensor, a logic circuit, or the like may be added to the pixel circuit illustrated in FIG. 29B.

[Organic EL Display Device]

Figure 29C:
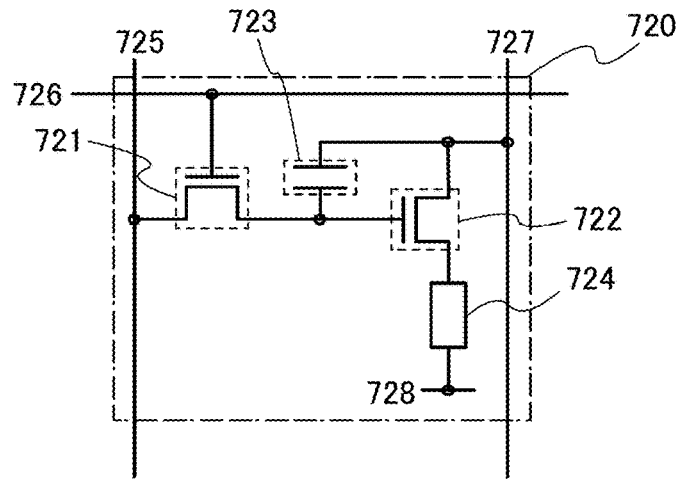

FIG. 29C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 29C illustrates an applicable example of a pixel circuit. Here, one pixel includes two n-channel transistors. Note that a metal oxide film of one embodiment of the present invention can be used for a channel formation region of the n-channel transistor. Further, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, any of the transistors described in other embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that the gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 will be described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage higher than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 29C. For example, a switch, a resistor, a capacitor, a sensor, a transistor, a logic circuit, or the like may be added to the pixel circuit illustrated in FIG. 29C.

In the case where the transistor shown in the above embodiments is used for the circuit shown in FIGS. 29A to 29C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by an electrical or magnetic effect may be included. Note that examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED can be formed. Note that an MN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

Note that the structures, methods, and the like described in this embodiment can be used as appropriate in combination with any of the structures, methods, and the like described in the other embodiments.

Embodiment 7

In this embodiment, a structure of an oxide semiconductor film is described.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>
First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 30A:
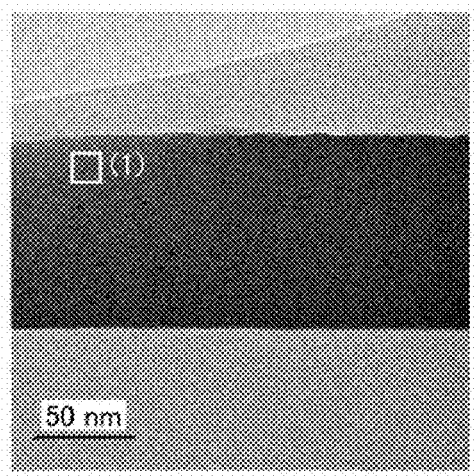
FIGS. 30A to 30C are Cs-corrected high-resolution TEM images of a cross section of a CAAC-OS and FIG. 30D is a schematic cross-sectional view of a CAAC-OS.

A CAAC-OS observed with TEM is described below. FIG. 30A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 30B:
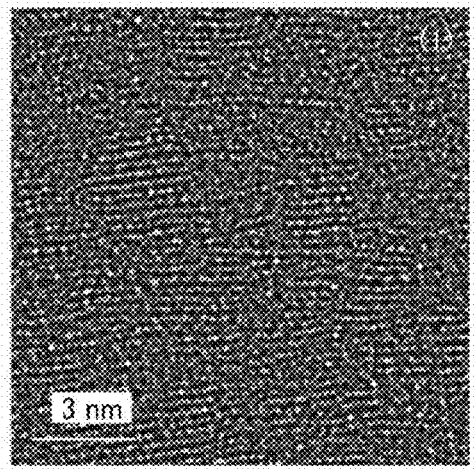

FIG. 30B is an enlarged Cs-corrected high-resolution TEM image of a region (1) in FIG. 30A. FIG. 30B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 30C:
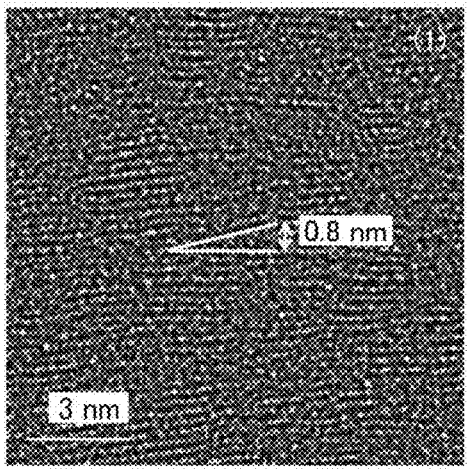

As shown in FIG. 30B, the CAAC-OS has a characteristic atomic arrangement. The characteristic atomic arrangement is denoted by an auxiliary line in FIG. 30C. FIGS. 30B and 30C prove that the size of a pellet is approximately 1 nm to 3 nm, and the size of a space caused by tilt of the pellets is approximately 0.8 nm. Therefore, the pellet can also be referred to as a nanocrystal (nc).

Figure 30D:
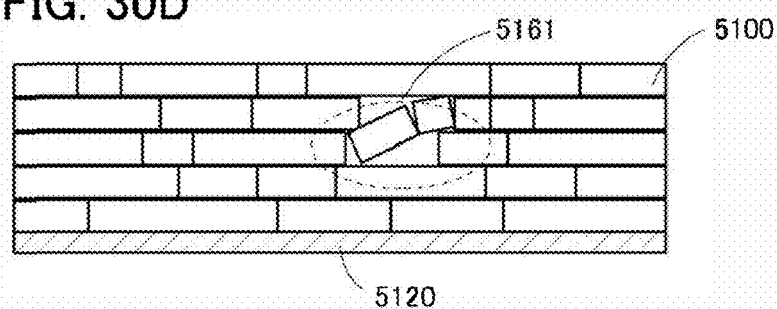

Here, according to the Cs-corrected high-resolution TEM images, the schematic arrangement of pellets 5100 of a CAAC-OS over a substrate 5120 is illustrated by such a structure in which bricks or blocks are stacked (see FIG. 30D). The part in which the pellets are tilted as observed in FIG. 30C corresponds to a region 5161 shown in FIG. 30D.

FIG. 31A shows a Cs-corrected high-resolution TEM image of a plane of the CAAC-OS observed from a direction substantially perpendicular to the sample surface. FIGS. 31B, 31C, and 31D are enlarged Cs-corrected high-resolution TEM images of regions (1), (2), and (3) in FIG. 31A, respectively. FIGS. 31B, 31C, and 31D indicate that metal atoms are arranged in a triangular, quadrangular, or hexagonal configuration in a pellet. However, there is no regularity of arrangement of metal atoms between different pellets.

Figure 32A:
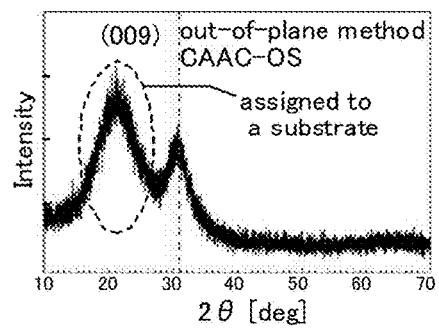
FIGS. 32A to 32C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 32A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 32B:
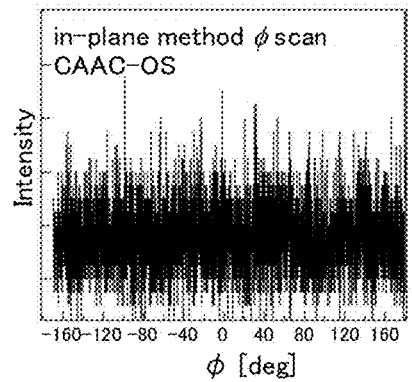
Figure 32C:
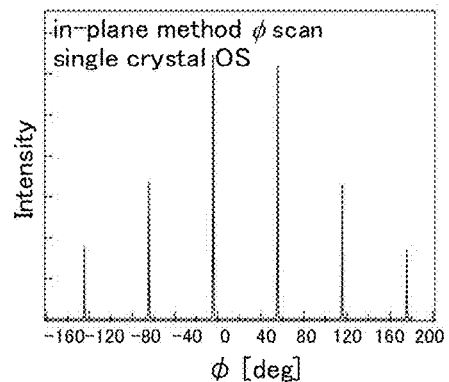

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 32B, a peak is not clearly observed. In contrast, in the case of a single crystal oxide semiconductor of InGaZnO$_4$, when φ scan is performed with 2θ fixed at around 56°, as shown in FIG. 32C, six peaks which are derived from crystal planes equivalent to the (110) plane are observed. Accordingly, the structural analysis using XRD shows that the directions of a-axes and b-axes are irregularly oriented in the CAAC-OS.

Figure 33A:
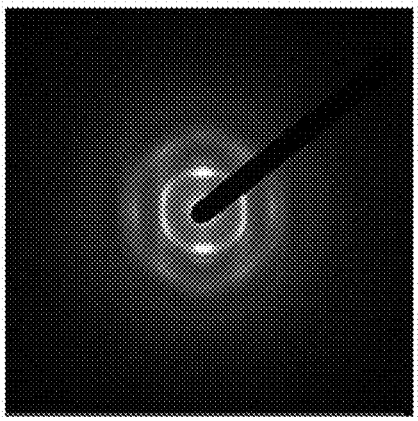
FIGS. 33A and 33B each show an electron diffraction pattern of a CAAC-OS.
Figure 33B:
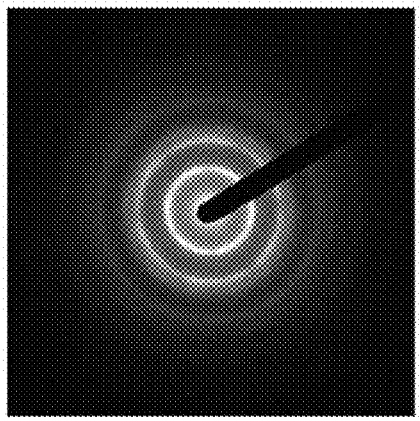

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 33A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 33B shows a diffraction pattern obtained in such a manner that an electron beam with a probe diameter of 300 nm is incident on the same sample in a direction perpendicular to the sample surface. As shown in FIG. 33B, a ring-like diffraction pattern is observed. Thus, the electron diffraction also indicates that the a-axes and b-axes of the pellets included in the CAAC-OS do not have regular alignment. The first ring in FIG. 33B is considered to be derived from the (010) plane, the (100) plane, and the like of the InGaZnO$_4$ crystal. The second ring in FIG. 33B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which does not have long-range ordering but might have ordering in a range from an atom to the nearest neighbor atoms or to the second-nearest neighbor atoms is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

FIG. 34 shows change in the average size of crystal parts (at 22 points to 45 points) in each sample. Note that the crystal part size corresponds to the length of a lattice fringe. FIG. 34 indicates that the crystal part size in the a-like OS increases with an increase in the cumulative electron dose. Specifically, as shown by (1) in FIG. 34, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 34, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 35A:
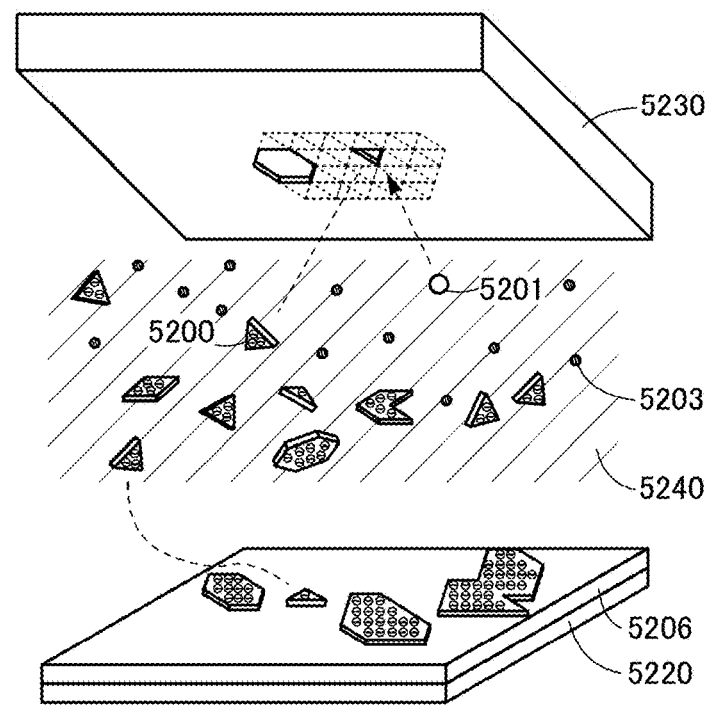
FIGS. 35A and 35B are schematic views showing deposition models of a CAAC-OS and an nc-OS.

FIG. 35A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

Figure 36A:
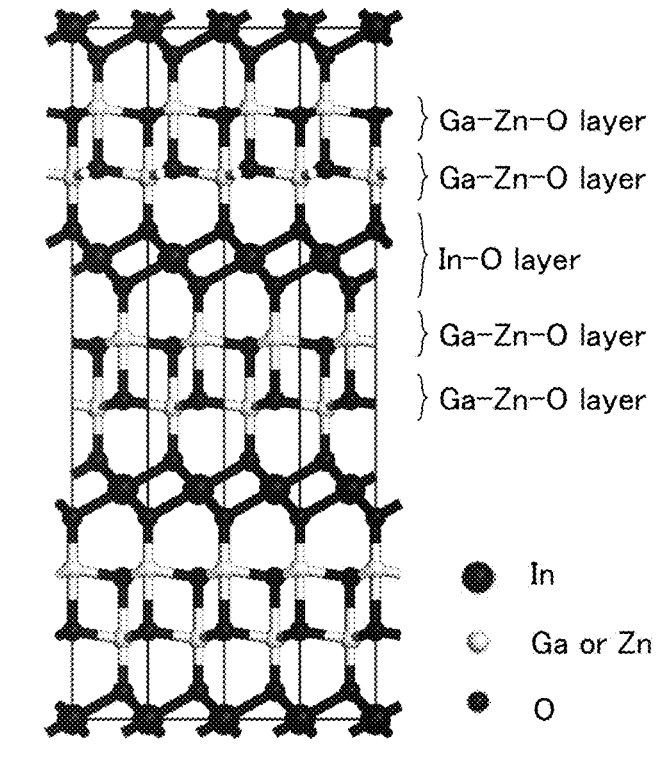
FIGS. 36A to 36C show an InGaZnO$_4$ crystal and a pellet.

Here, the target 5130 has a polycrystalline structure which includes a plurality of crystal grains and in which a cleavage plane exists in at least one crystal grain. FIG. 36A shows a structure of an InGaZnO$_4$ crystal included in the target 5130 as an example. Note that FIG. 36A shows a structure of the case where the InGaZnO$_4$ crystal is observed from a direction parallel to the b-axis. FIG. 36A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the InGaZnO$_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100*a* and a pellet 5100*b* which are flat-plate-like (pellet-like) sputtered particles are separated and sputtered from the cleavage plane. Note that structures of the pellet 5100*a* and the pellet 5100*b* may be distorted by an impact of collision of the ion 5101.

The pellet 5100*a* is a flat-plate-like (pellet-like) sputtered particle having a triangle plane, e.g., regular triangle plane. The pellet 5100*b* is a flat-plate-like (pellet-like) sputtered particle having a hexagon plane, e.g., regular hexagon plane. Note that flat-plate-like (pellet-like) sputtered particles such as the pellet 5100*a* and the pellet 5100*b* are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 36B:
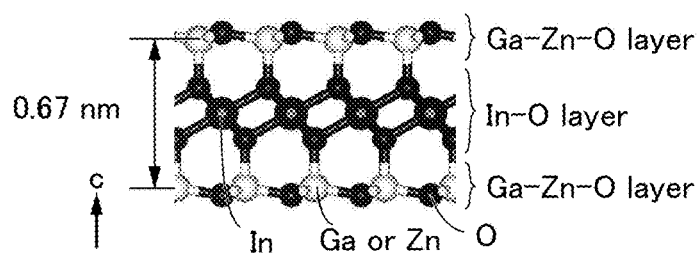
Figure 36C:
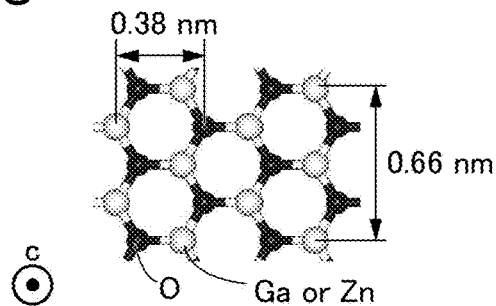

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 34. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 36B is separated. Note that FIG. 36C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 34 corresponds to the amount of growth in plasma. Here, in the case where the temperature of the substrate 5120 is at around room temperature, the pellet 5100 on the substrate 5120 hardly grows; thus, an nc-OS is formed (see FIG. 35B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 35B:
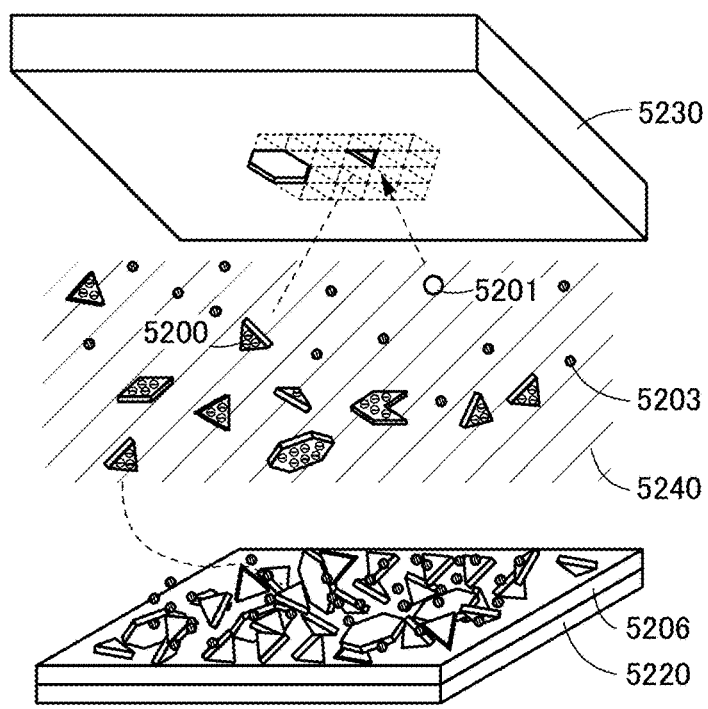

As shown in FIGS. 35A and 35B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 35A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 37A to 37D are schematic cross-sectional views.

Figure 37A:
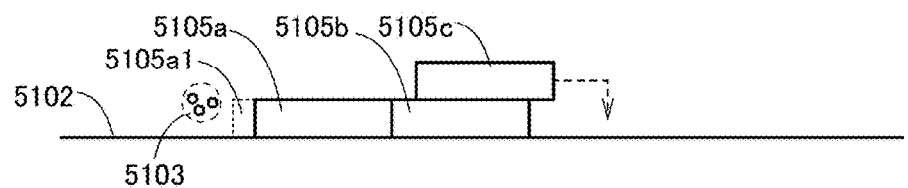
FIGS. 37A to 37D are schematic views showing a deposition model of a CAAC-OS.

As illustrated in FIG. 37A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heat from the substrate 5120 to form a region 5105a1 on another side surface of the pellet 5105a. Note that the plurality of particles 5103 may contain oxygen, zinc, indium, gallium, or the like.

Figure 37B:
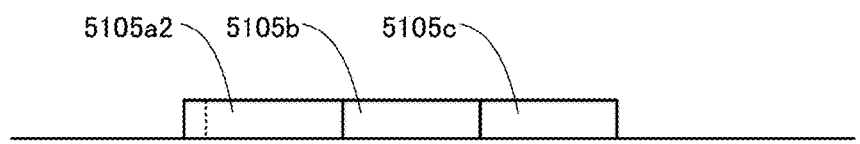

Then, as illustrated in FIG. 37B, the region 5105a1 grows to part of the pellet 5105a to form a pellet 5105a2. In addition, a side surface of the pellet 5105c is in contact with another side surface of the pellet 5105b.

Figure 37C:
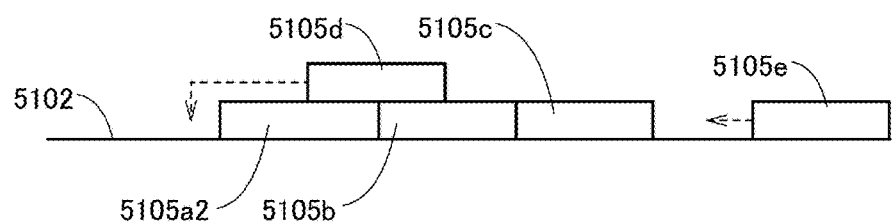

Next, as illustrated in FIG. 37C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 37D:
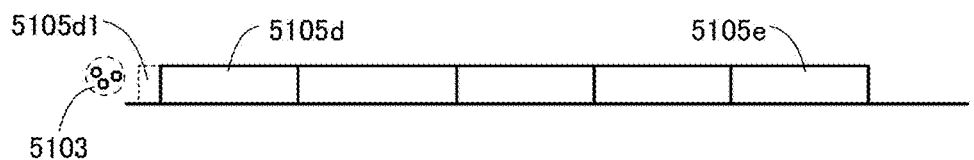

Then, as illustrated in FIG. 37D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heat from the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 34 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that, even in such a case, owing to intermolecular force, the pellets 5100 are arranged so that a gap between the pellets is as small as possible even on the unevenness surface. Therefore, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

Note that the structures, methods, and the like described in this embodiment can be used as appropriate in combination with any of the structures, methods, and the like described in the other embodiments.

Embodiment 8

Electronic Device

In this embodiment, examples of an electronic device to which the display device of one embodiment of the present invention can be applied will be described with reference to FIGS. 38A to 38F and FIGS. 39A to 39D.

Examples of an electronic device including the display device include television sets (also referred to as televisions or television receivers), monitors of computers or the like, cameras such as digital cameras or digital video cameras, digital photo frames, mobile phones (also referred to as cellular phones or mobile phone devices), portable game machines, portable information terminals, audio reproducing devices, and large game machines such as pachinko machines. Specific examples of these electronic devices are illustrated in FIGS. 38A to 38F and FIGS. 39A to 39D.

Figure 38A:
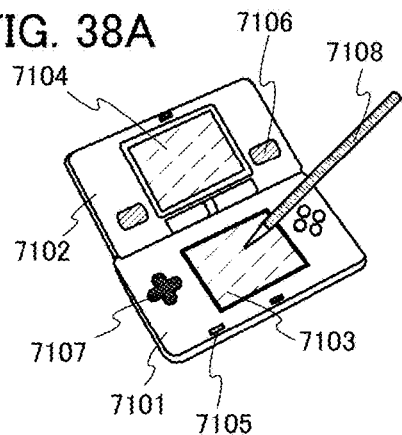
FIGS. 38A to 38F illustrate electronic devices of one embodiment of the present invention.

FIG. 38A illustrates a portable game machine including a housing 7101, a housing 7102, a display portion 7103, a display portion 7104, a microphone 7105, speakers 7106, an operation key 7107, a stylus 7108, and the like. The display device according to one embodiment of the present invention can be used for the display portion 7103 or the display portion 7104. When the display device according to one embodiment of the present invention is used as the display portion 7103 or 7104, it is possible to provide a user-friendly portable game machine with quality that hardly deteriorates. Although the portable game machine illustrated in FIG. 38A includes two display portions, the display portion 7103 and the display portion 7104, the number of display portions included in the portable game machine is not limited to two.

Figure 38B:
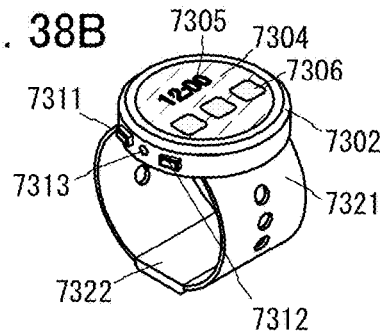

FIG. 38B illustrates a smart watch, which includes a housing 7302, a display portion 7304, operation buttons 7311 and 7312, a connection terminal 7313, a band 7321, a clasp 7322, and the like. The display device or touch panel of one embodiment of the present invention can be used for the display portion 7304.

Figure 38C:
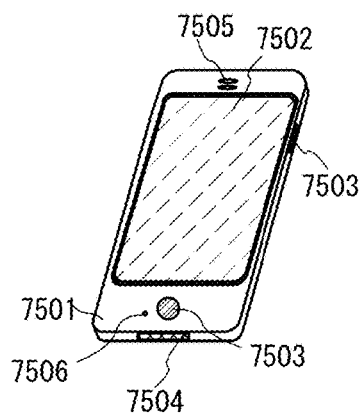

FIG. 38C illustrates a portable information terminal, which includes a display portion 7502 incorporated in a housing 7501, operation buttons 7503, an external connection port 7504, a speaker 7505, a microphone 7506, and the like. The display device of one embodiment of the present invention can be used for the display portion 7502.

Figure 38D:
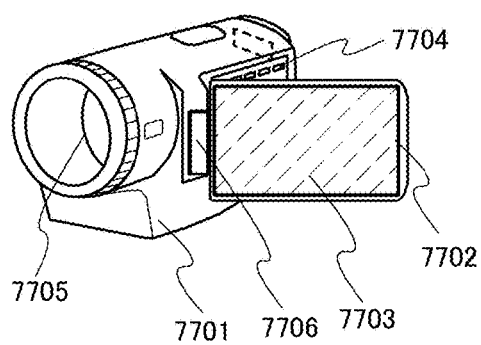

FIG. 38D illustrates a video camera, which includes a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. The first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The imaging device in one embodiment of the present invention can be provided in a focus position of the lens 7705. The display device of one embodiment of the present invention can be used for the image display portion 7703.

Figure 38E:
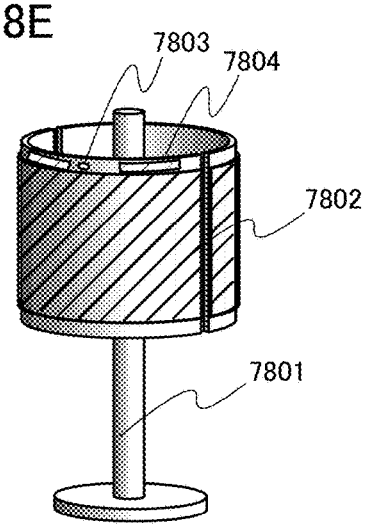

FIG. 38E illustrates a curved display including a display portion 7802 incorporated in a housing 7801, an operation button 7803, a speaker 7804, and the like. The display device of one embodiment of the present invention can be used for the display portion 7802.

Figure 38F:
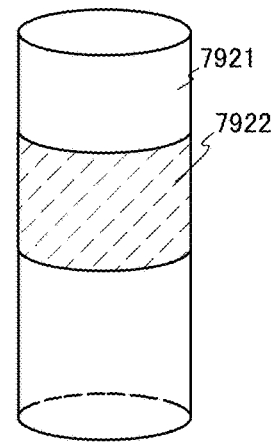

FIG. 38F illustrates a digital signage including a display portion 7922 provided on a utility pole 7921. The display device of one embodiment of the present invention can be used for the display portion 7922.

Figure 39A:
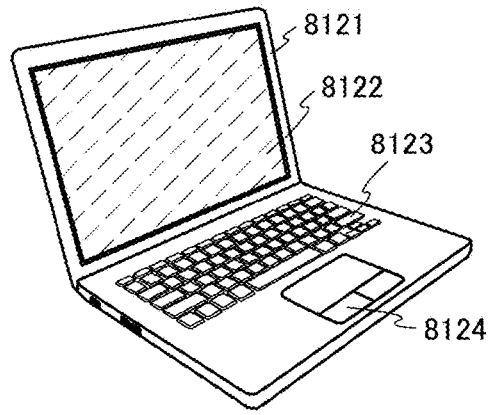
FIGS. 39A to 39D illustrate electronic devices of one embodiment of the present invention.

FIG. 39A illustrates a notebook personal computer, which includes a housing 8121, a display portion 8122, a keyboard 8123, a pointing device 8124, and the like. The display device of one embodiment of the present invention can be used for the display portion 8122.

Figure 39B:
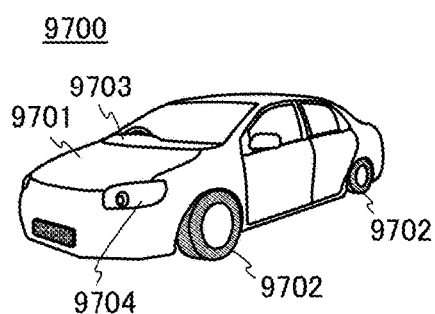
Figure 39C:
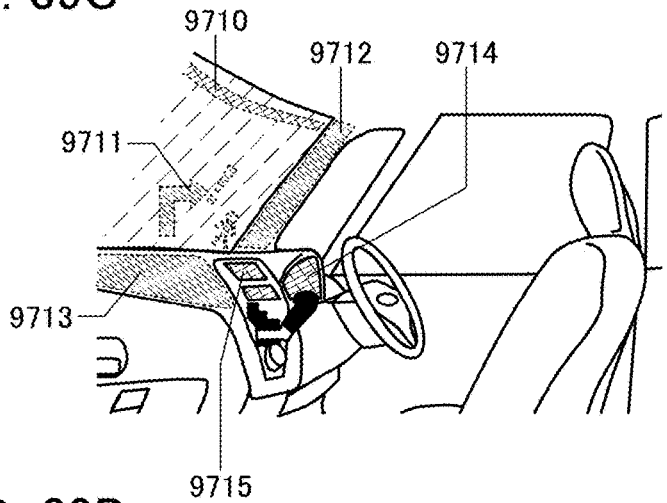

FIG. 39B is an external view of an automobile 9700. FIG. 39C illustrates a driver's seat of the automobile 9700. The automobile 9700 includes a car body 9701, wheels 9702, a dashboard 9703, lights 9704, and the like. The display device or input/output device of one embodiment of the present invention can be used in a display portion or the like of the automobile 9700. For example, the display device, input/output device, or touch panel of one embodiment of the present invention can be used in display portions 9710 to 9715 illustrated in FIG. 39C.

The display portion 9710 and the display portion 9711 are each a display device or an input/output device provided in an automobile windshield. The display device or input/output device of one embodiment of the present invention can be a see-through display device or input/output device, through which the opposite side can be seen, using a light-transmitting conductive material for its electrodes. Such a see-through display device or input/output device does not hinder driver's vision during driving the automobile 9700. Thus, the display device or input/output device of one embodiment of the present invention can be provided in the windshield of the automobile 9700. Note that in the case where a transistor or the like for driving the display device or input/output device is provided in the display device or input/output device, a transistor having a light-transmitting property, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

Figure 39D:
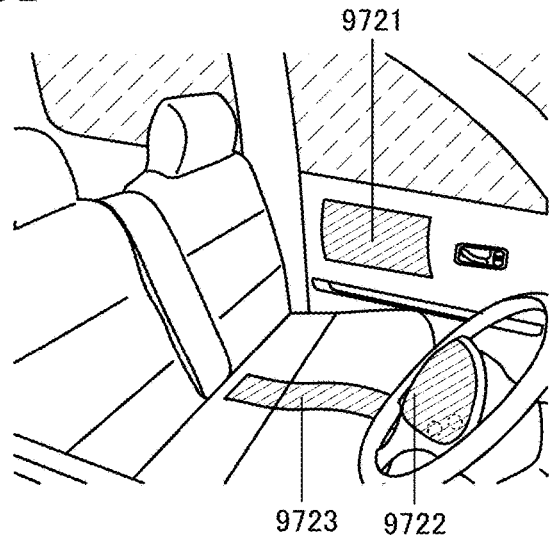

FIG. 39D illustrates the inside of a car in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

A display portion including the display device of one embodiment of the present invention can be flat, in which case the display device does not necessarily have a curved surface or flexibility.

Note that the structures, methods, and the like described in this embodiment can be used as appropriate in combination with any of the structures, methods, and the like described in the other embodiments.

REFERENCE NUMERALS

10: display device, 11: region, 12: region, 13: region, 14: region, 18: light-blocking layer, 20: display panel, 21: display region, 22: peripheral circuit, 23: protective film, 24: pixel, 30: groove portion, 36: electrode, 42: FPC, 50: transistor, 51: transistor, 52: transistor, 53: transistor, 54: transistor, 55: transistor, 61: capacitor, 63: capacitor, 70: light-emitting element, 80: liquid crystal element, 90: input device, 91: source line, 92: gate line, 100: substrate, 101: substrate, 103: polarizing plate, 104: backlight, 110: insulating layer, 112: insulating layer, 120: conductive layer, 130: insulating layer, 131: insulating layer, 140: semiconductor layer, 141: oxide semiconductor layer, 142: oxide semiconductor layer, 143: oxide semiconductor layer, 150: conductive layer, 160: conductive layer, 165: insulating layer, 170: insulating layer, 180: insulating layer, 190: conductive layer, 200: conductive layer, 220: conductive layer, 230: layer, 240: spacer, 250: EL layer, 260: conductive layer, 300: substrate, 301: substrate, 302: protective substrate, 303: polarizing plate, 312: insulating layer, 330: insulating layer, 360: coloring layer, 370: adhesive layer, 371: adhesive layer, 372: adhesive layer, 373: adhesive layer, 374: adhesive layer, 375: adhesive layer, 376: adhesive layer, 380: conductive layer, 390: liquid crystal layer, 400: conductive layer, 410: conductive layer, 411: conductive layer, 420: insulating layer, 430: conductive layer, 440: insulating layer, 510: anisotropic conductive film, 520: conductive layer, 530: opening, 601: precursor, 602: precursor, 700: substrate, 701: pixel portion, 702: scan line driver circuit, 703: scan line driver circuit, 704: signal line driver circuit, 710: capacitor wiring, 712: gate wiring, 713: gate wiring, 714: data line, 716: transistor, 717: transistor, 718: liquid crystal element, 719: liquid crystal element, 720: pixel, 721: switching transistor, 722: driver transistor, 723: capacitor, 724: light-emitting element, 725: signal line, 726: scan line, 727: power supply line, 728: common electrode, 800: substrate, 810: introduction port, 820: chamber, 830: light-emitting element, 930: substrate, 931: electrode, 932: electrode, 933: electrode, 934: bridge electrode, 936: electrode, 937: electrode, 938: intersection portion, 941: wiring, 942: wiring, 950: FPC, 951: IC, 1700: substrate, 1701: chamber, 1702: load chamber, 1703: pretreatment chamber, 1704: chamber, 1705: chamber, 1706: unload chamber, 1711a: source material supply portion, 1711b: source material supply portion, 1712a: high-speed valve, 1712b: high-speed valve, 1713a: source material introduction port, 1713b: source material introduction port, 1714: source material exhaust port, 1715: evacuation unit, 1716: substrate holder, 1720: transfer chamber, 3501: wiring, 3502: wiring, 3503: transistor, 3504: liquid crystal element, 3510: wiring, 3510_1: wiring, 3510_2: wiring, 3511: wiring, 3515_1: block, 3515_2: block, 3516: block, 5100: pellet, 5100a: pellet, 5100b: pellet, 5101: ion, 5102: zinc oxide layer, 5103: particle, 5105a: pellet, 5105a1: region, 5105a2: pellet, 5105b: pellet, 5105c: pellet, 5105d: pellet, 5105d1: region, 5105e: pellet, 5120: substrate, 5130: target, 5161: region, 7101: housing, 7102: housing, 7103: display portion, 7104: display portion, 7105: microphone, 7106: speaker, 7107: operation key, 7108: stylus, 7302: housing, 7304: display portion, 7311: operation button, 7312: operation button, 7313: connection terminal, 7321: band, 7322: clasp, 7501: housing, 7502: display portion, 7503: operation button, 7504: external connection port, 7505: speaker, 7506: microphone, 7701: housing, 7702: housing, 7703: display portion, 7704: operation key, 7705: lens, 7706: joint, 7801: housing, 7802: display portion, 7803: operation button, 7804: speaker, 7921: utility pole, 7922: display portion, 8121: housing, 8122: display portion, 8123: keyboard, 8124: pointing device, 9700: automobile, 9701: car body, 9702: wheel, 9703: dashboard, 9704: light, 9710: display portion, 9711: display portion, 9712: display portion, 9713: display portion, 9714: display portion, 9715: display portion, 9721: display portion, 9722: display portion, 9723: display portion.

This application is based on Japanese Patent Application serial no. 2014-219635 filed with Japan Patent Office on Oct. 28, 2014, the entire contents of which are hereby incorporated by reference.

The invention claimed is:

1. A method for manufacturing a display device, comprising the steps of:
    over a first surface of a first substrate, forming a transistor, a capacitor, a pixel electrode and a first insulating layer;
    over a first surface of a second substrate, forming a light-blocking layer, a coloring layer, an insulating layer, a spacer and a second insulating layer;
    bonding the first substrate and the second substrate with an adhesive layer to seal the transistor, the capacitor and a display element;
    forming a groove portion by performing a first cutting treatment on the second substrate;
    forming a protective film in the vicinity of a peripheral portion of the groove portion, the first substrate and the second substrate, the protective film in contact with the first substrate, the first insulating layer, the adhesive layer, the second insulating layer and the second substrate; and
    fabricating a plurality of display devices by performing a second cutting treatment on the first substrate.

2. The method for manufacturing a display device according to claim 1,
    wherein the protective film is in contact with a second surface of the first substrate, and
    wherein the second surface of the first substrate is an opposite surface of the first substrate from the first surface of the first substrate.

3. The method for manufacturing a display device according to claim 1, wherein the protective film is formed by an atomic layer deposition method.

4. The method for manufacturing a display device according to claim 1, wherein the protective film comprises one selected from the group consisting of aluminum oxide, hafnium oxide, zirconium oxide, titanium oxide, zinc oxide, indium oxide, tin oxide, indium tin oxide, tantalum oxide, silicon oxide, manganese oxide, nickel oxide, erbium oxide, cobalt oxide, tellurium oxide, barium titanate, titanium nitride, tantalum nitride, aluminum nitride, tungsten nitride, cobalt nitride, manganese nitride, hafnium nitride, ruthenium, platinum, nickel, cobalt, manganese and copper.

5. The method for manufacturing a display device according to claim 2,
    wherein the protective film is in contact with a second surface of the second substrate, and wherein the second surface of the second substrate is an opposite surface of the second substrate from the first surface of the second substrate.

6. A method for manufacturing a display device, comprising the steps of:
  over a first surface of a first substrate, forming a first insulating layer;
  over the first insulating layer, forming a transistor;
  over a first surface of a second substrate, forming a second insulating layer; and
  bonding the first substrate and the second substrate with an adhesive layer to seal the transistor;
  forming a groove portion by performing a first cutting treatment on the second substrate;
  forming a protective film, so that the protective film is in contact with the second substrate, the first insulating layer in the vicinity of a peripheral portion of the groove portion, and the first substrate; and
  fabricating a plurality of display devices by performing a second cutting treatment on the first substrate.

7. The method for manufacturing a display device according to claim 6,
  wherein the protective film is in contact with a second surface of the first substrate, and
  wherein the second surface of the first substrate is an opposite surface of the first substrate from the first surface of the first substrate.

8. The method for manufacturing a display device according to claim 6, wherein the protective film is formed by an atomic layer deposition method.

9. The method for manufacturing a display device according to claim 6, wherein the protective film comprises one selected from the group consisting of aluminum oxide, hafnium oxide, zirconium oxide, titanium oxide, zinc oxide, indium oxide, tin oxide, indium tin oxide, tantalum oxide, silicon oxide, manganese oxide, nickel oxide, erbium oxide, cobalt oxide, tellurium oxide, barium titanate, titanium nitride, tantalum nitride, aluminum nitride, tungsten nitride, cobalt nitride, manganese nitride, hafnium nitride, ruthenium, platinum, nickel, cobalt, manganese and copper.

10. The method for manufacturing a display device according to claim 7,
  wherein the protective film is in contact with a second surface of the second substrate, and
  wherein the second surface of the second substrate is an opposite surface of the second substrate from the first surface of the second substrate.

* * * * *